US012813338B2

(12) United States Patent
Liu et al.

(10) Patent No.: US 12,813,338 B2
(45) Date of Patent: Nov. 24, 2026

(54) SEMICONDUCTOR DIE PACKAGE AND METHODS OF FORMATION

(71) Applicant: Taiwan Semiconductor Manufacturing Company, Ltd., Hsinchu (TW)

(72) Inventors: Chien Hung Liu, Hsinchu County (TW); Yu-Sheng Chen, Taoyuan City (TW); Yi Ching Ong, Hsinchu (TW); Hsien Jung Chen, Tainan City (TW); Kuen-Yi Chen, Hsinchu City (TW); Kuo-Ching Huang, Hsinchu City (TW); Harry-HakLay Chuang, Zhubei City (TW); Wei-Cheng Wu, Zhubei City (TW); Yu-Jen Wang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 739 days.

(21) Appl. No.: 18/302,466

(22) Filed: Apr. 18, 2023

(65) Prior Publication Data

US 2024/0136346 A1 Apr. 25, 2024
US 2024/0234401 A9 Jul. 11, 2024

Related U.S. Application Data

(60) Provisional application No. 63/380,278, filed on Oct. 20, 2022.

(51) Int. Cl.

*H10W 90/00* (2026.01)
*H10D 1/68* (2025.01)

(Continued)

(52) U.S. Cl.

CPC .............. *H10W 90/00* (2026.01); *H10D 1/68* (2025.01); *H10W 20/20* (2026.01); *H10W 20/497* (2026.01); *H10W 90/792* (2026.01)

(58) Field of Classification Search

CPC ... H10W 90/00; H10W 20/20; H10W 20/497; H10W 90/792; H10D 1/68

See application file for complete search history.

(56) References Cited

U.S. PATENT DOCUMENTS 9,673,173 B1 6/2017 Li et al.
10,026,704 B2 7/2018 Wu et al.

(Continued)

FOREIGN PATENT DOCUMENTS

KR 20220114391 A 8/2022
TW 201740521 A 11/2017

(Continued)

OTHER PUBLICATIONS

US 11,710,714 B2, 07/2023, Costa et al. (withdrawn)

*Primary Examiner* — Benjamin Tzu-Hung Liu
(74) *Attorney, Agent, or Firm* — Harrity & Harrity, LLP

(57) ABSTRACT

A semiconductor die package includes an inductor-capacitor (LC) semiconductor die that is directly bonded with a logic semiconductor die. The LC semiconductor die includes inductors and capacitors that are integrated into a single die. The inductors and capacitors of the LC semiconductor die may be electrically connected with transistors and other logic components on the logic semiconductor die to form a voltage regulator circuit of the semiconductor die package. The integration of passive components (e.g., the inductors and capacitors) of the voltage regulator circuit into a single semiconductor die reduces signal propagation distances in the voltage regulator circuit, which may increase the operating efficiency of the voltage regulator circuit, may reduce the formfactor for the semiconductor die package, may (Continued)

reduce parasitic capacitance and/or may reduce parasitic inductance in the voltage regulator circuit (thereby improving the performance of the voltage regulator circuit), among other examples.

20 Claims, 42 Drawing Sheets

(51) Int. Cl.
*H10W 20/20* (2026.01)
*H10W 20/40* (2026.01)

(56) References Cited

U.S. PATENT DOCUMENTS

| | | | | |
|---|---|---|---|---|
| 10,068,879 | B2 | 9/2018 | Gowda | |
| 10,128,192 | B2 | 11/2018 | Lin et al. | |
| 10,483,211 | B2 | 11/2019 | Lin et al. | |
| 11,600,600 | B2 | 3/2023 | Choi | |
| 2019/0363079 | A1* | 11/2019 | Thei | H10D 88/00 |
| 2020/0251467 | A1 | 8/2020 | Xu et al. | |
| 2021/0104359 | A1 | 4/2021 | Maruthamuthu et al. | |
| 2022/0254756 | A1* | 8/2022 | Choi | H10W 44/00 |
| 2023/0353049 | A1* | 11/2023 | Zhang | H02M 3/07 |

FOREIGN PATENT DOCUMENTS

| | | | |
|---|---|---|---|
| TW | 201814858 | A | 4/2018 |
| TW | I676217 | B | 11/2019 |
| TW | 202046411 | A | 12/2020 |
| TW | I741015 | B | 10/2021 |
| TW | 202240720 | A | 10/2022 |

* cited by examiner

200

SEMICONDUCTOR DIE PACKAGE AND METHODS OF FORMATION

CROSS-REFERENCE TO RELATED APPLICATION

This Patent Application claims priority to U.S. Provisional Patent Application No. 63/380,278, filed on Oct. 20, 2022, entitled "SEMICONDUCTOR DIE PACKAGE AND METHODS OF FORMATION," which is hereby expressly incorporated by reference herein.

BACKGROUND

Various semiconductor device packing techniques may be used to incorporate one or more semiconductor dies into a semiconductor device package. In some cases, semiconductor dies may be stacked in a semiconductor device package to achieve a smaller horizontal or lateral footprint of the semiconductor device package and/or to increase the density of the semiconductor device package. Semiconductor device packing techniques that may be performed to integrate a plurality of semiconductor dies in a semiconductor device package may include integrated fanout (InFO), package on package (PoP), chip on wafer (CoW), wafer on wafer (WoW), and/or chip on wafer on substrate (CoWoS), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
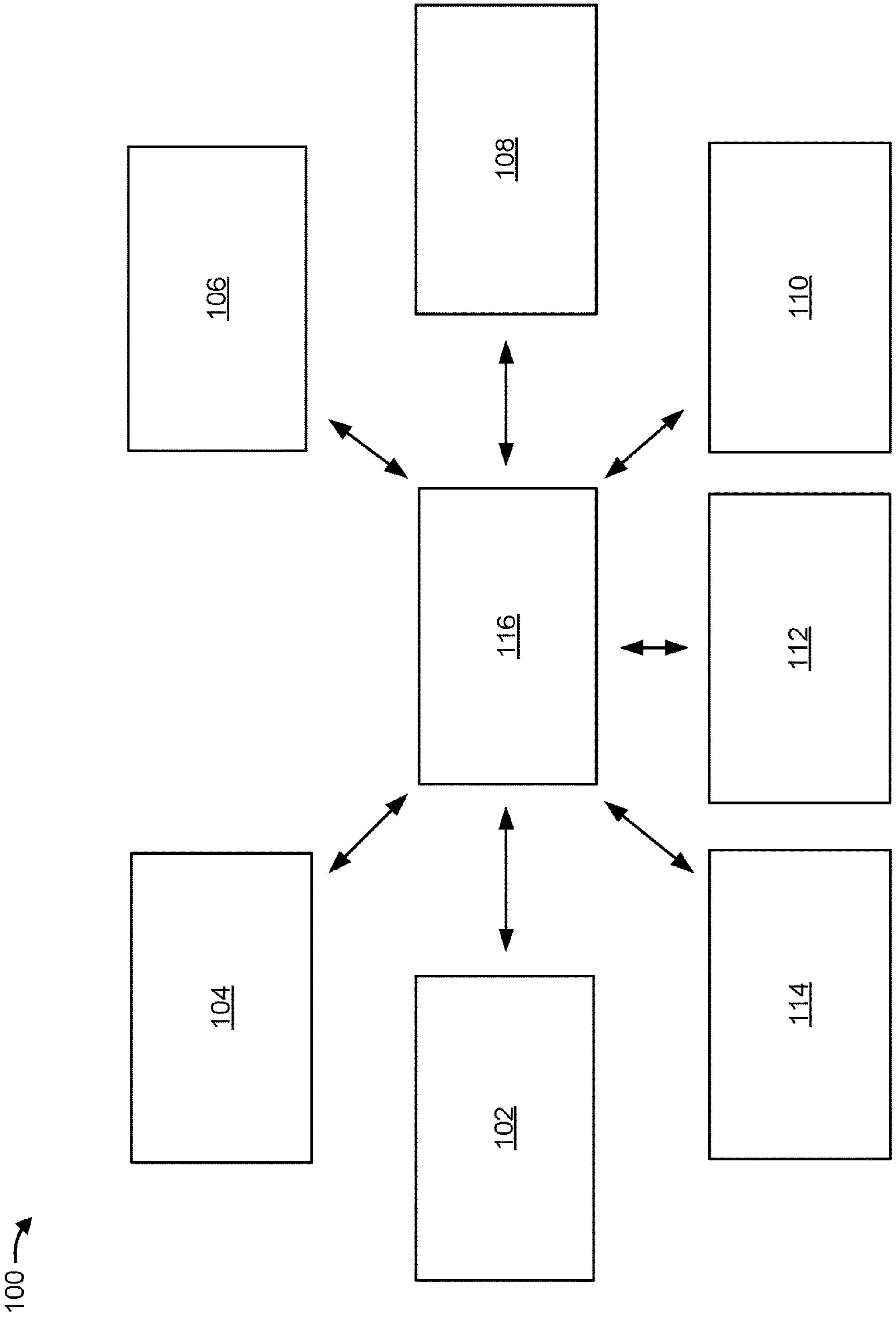
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a direct bonded semiconductor die package a wafer on wafer (WoW) semiconductor die package, a chip on wafer (CoW) semiconductor die package, a die to die direct bonded semiconductor die package), semiconductor dies are directly bonded such that the semiconductor dies are vertically arranged in the semiconductor die package. The use of direct bonding and vertical stacking of dies may reduce interconnect lengths between the semiconductor dies (which reduces power loss and signal propagation times) and may enable increased density of semiconductor die packages in a semiconductor device package that includes the semiconductor die package.

In some cases, a semiconductor die package may include power supply circuitry that is configured to provide an electrical voltage to one or more circuits and/or one or more electrical devices in the semiconductor die package. The power supply circuitry may include a voltage regulator circuit, among other types of power supply circuitry, that is configured to regulate the electrical voltage provided by the power supply circuitry. In some cases, the electrical components (e.g., transistors, inductors, capacitors) of the voltage regulator circuit may be distributed across a plurality of semiconductor dies of the semiconductor die package and/or across integrated passive devices (IPDs) that are attached to the semiconductor die package. However, the distribution of the electrical components of the voltage regulator circuit across the plurality of semiconductor dies and/or the IPDs of the semiconductor die package may result in increased signal propagation distances in the voltage regulator circuit. The increased signal propagation distances in the voltage regulator circuit may result in reduced operating efficiency of the voltage regulator circuit, may result in a larger formfactor for the semiconductor die package, and/or may result in increased parasitic capacitance and/or increased parasitic inductance in the voltage regulator circuit, among other examples.

In some implementations described herein, a semiconductor die package includes an inductor-capacitor (LC) semiconductor die that is directly bonded with a logic semiconductor die. The LC semiconductor die includes inductors and capacitors that are integrated into a single die. The inductors and capacitors of the LC semiconductor die may be electrically connected with transistors and other logic components on the logic semiconductor die to form a voltage regulator circuit of the semiconductor die package. The integration of passive components (e.g., the inductors and capacitors) of the voltage regulator circuit into a single semiconductor die (e.g., the LC semiconductor die) reduces signal propagation distances in the voltage regulator circuit, which may increase the operating efficiency of the voltage regulator circuit, may reduce the formfactor for the semiconductor die package, may reduce parasitic capacitance and/or may reduce parasitic inductance in the voltage regulator circuit (thereby improving the performance of the voltage regulator circuit), among other examples.

FIG. 1 is a diagram of an example environment 100 in which systems and/or methods described herein may be implemented. As shown in FIG. 1, the example environment 100 may include a plurality of semiconductor processing tools 102-114 and a wafer/die transport tool 116. The plurality of semiconductor processing tools 102-112 may include a deposition tool 102, an exposure tool 104, a developer tool 106, an etch tool 108, a planarization tool 110, a plating tool 112, a bonding tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The bonding tool 114 is a semiconductor processing tool that is capable of bonding two or more work pieces (e.g., two or more semiconductor substrates, two or more semiconductor devices, two or more semiconductor dies) together. For example, the bonding tool 114 may include a direct bonding tool. A direct bonding tool is a type of bonding tool that is configured to bond semiconductor dies together directly through copper-to-copper (or other direct metal) connections. As another example, the bonding tool 114 may include a eutectic bonding tool that is capable of forming a eutectic bond between two or more wafers together. In these examples, the bonding tool 114 may heat the two or more wafers to form a eutectic system between the materials of the two or more wafers.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the example environment 100 includes a plurality of wafer/die transport tools 116.

For example, the wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of the deposition tool 102 without breaking or removing a vacuum (or an at least partial vacuum) between the processing chambers and/or between processing operations in the deposition tool 102.

In some implementations, one or more of the semiconductor processing tools 102-116 and/or the wafer/die transport tool 116 may perform one or more semiconductor processing operations described herein. For example, one or more of the semiconductor processing tools 102-114 and/or the wafer/die transport tool 116 may form one or more trench capacitor structures in a first device region of a first semiconductor die; may form a first interconnect region vertically adjacent with the first device region; may form an inductor region in the first interconnect region, where the inductor region includes one or more inductor structures; may form a plurality of semiconductor logic devices in a second device region of a second semiconductor die; may form a second interconnect region that is vertically adjacent with the second device region; and/or may bond the first semiconductor die and the second semiconductor die at a bonding region between the first interconnect region and the second interconnect region.

As another example, one or more of the semiconductor processing tools 102-114 and/or the wafer/die transport tool 116 may form one or more trench capacitor structures in a first device region of an inductor-capacitor (LC) semiconductor die; may form a first interconnect region that is vertically adjacent with the first device region at a first side of the first device region; may form an inductor region that is vertically adjacent with the first device region at a second side of the first device region opposing the first side, where the inductor region includes one or more inductor structures; may form a plurality of semiconductor logic devices in a second device region of a logic semiconductor die; may form a second interconnect region that is vertically adjacent with the second device region; and/or may bond the LC semiconductor die and the logic semiconductor die at a bonding region between the first interconnect region and the second interconnect region.

As another example, one or more of the semiconductor processing tools 102-114 and/or the wafer/die transport tool 116 may form one or more trench capacitor structures in a first device region of a first semiconductor die; may form an inductor region in the first device region, where the inductor region includes one or more inductor structures; may form a first interconnect region that is vertically adjacent with the first device region; may form a plurality of semiconductor logic devices in a second device region of a second semiconductor die; may form a second interconnect region that is vertically adjacent with the second device region; and/or may bond the first semiconductor die with the second semiconductor die at a bonding region between the first interconnect region and the second interconnect region.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
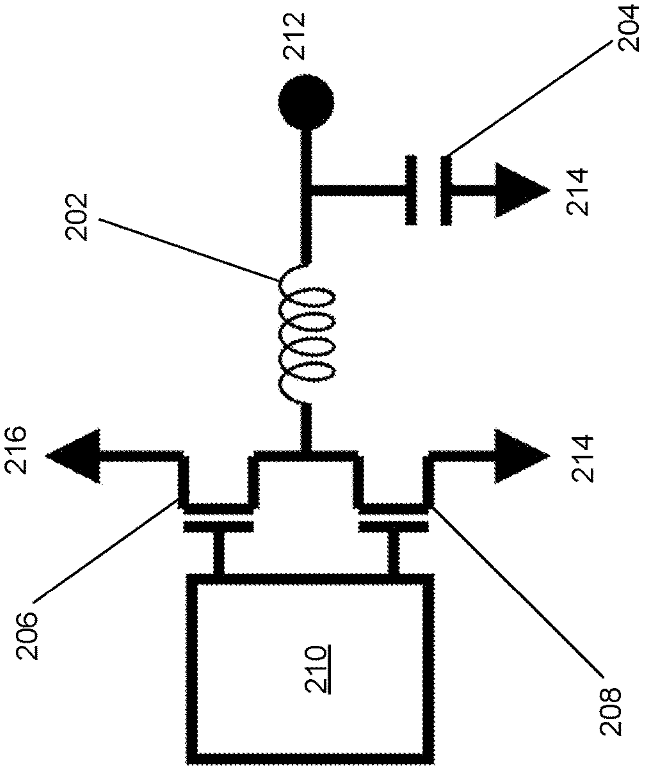
FIG. 2 is a diagram of an example voltage regulator circuit described herein.

FIG. 2 is a diagram of an example voltage regulator circuit 200 described herein. The voltage regulator circuit 200 may be included in a semiconductor die package described herein to provide voltage regulation for one or more circuits and/or semiconductor devices included in the semiconductor die package.

The voltage regulator circuit 200 may include an example of a synchronous buck converter, which is a type of switched mode power converter. The voltage regulator circuit 200 may be included as part of a power supply circuit, a battery charging circuit, and/or another type of circuit in which direct current to direct current (DC:DC) conversion (e.g., a step-down conversion or a step up conversion) may be provided by the voltage regulator circuit 200.

As shown in FIG. 2, the voltage regulator circuit 200 may include an inductor 202 (e.g., an output inductor of the voltage regulator circuit 200), a capacitor 204 (e.g., output capacitor of the voltage regulator circuit 200), a plurality of transistors such as a high-side transistor 206 and a low-side transistor 208, and a pulse width modulation (PWM) circuit 210, among other examples.

The inductor 202 and the capacitor 204 may be electrically connected in series as an inductor-capacitor (LC) filter of the voltage regulator circuit 200. The LC filter may provide current charging and current discharging across a load at an output terminal 212 (e.g., $V_{out}$) in a regulated manner. The load may be electrically connected in series with the capacitor 204 at the output terminal 212 and an electrical ground terminal 214.

The high-side transistor 206 and the low-side transistor 208 may each include a bipolar junction transistor (BJT), a field effect transistor (FET), a metal oxide semiconductor FET (MOSFET), and/or another type of transistor. The high-side transistor 206 and the low-side transistor 208 may be electrically connected in series. A first source/drain terminal of the high-side transistor 206 may be electrically connected to an input terminal 216, which is electrically connected to a voltage supply. A second source/drain terminal of the high-side transistor 206 may be electrically connected to a first source/drain terminal of the low-side transistor 208 and to a terminal of the inductor 202. A first source/drain terminal of the low-side transistor 208 may be electrically connected to the second source/drain terminal of the high-side transistor 206 and to the terminal of the inductor 202. A second source/drain terminal of the low-side transistor 208 may be electrically connected to an electrical ground terminal 214.

The gate terminals of the high-side transistor 206 and the low-side transistor 208 may each be electrically connected with the PWM circuit 210. The PWM circuit 210 may include electrical circuitry that is configured to synchronize the switching operation of the high-side transistor 206 and the low-side transistor 208 to enable the voltage regulator circuit 200 to provide a regulated output voltage to the load.

In operation, which the high-side transistor 206 is switched on by the PWM circuit 210, an electrical current is supplied to the load at the output terminal 212 through the high-side transistor 206. The low-side transistor 208 is switched off, which enables charging of the LC filter of the voltage regulator circuit 200. When the PWM circuit 210 switches the high-side transistor 206 off and the low-side transistor 208 on, the LC filter is discharged through the output terminal 212.

As indicated above, FIG. 2 is provided as an example. Other examples may differ from what is described with regard to FIG. 2.

Figure 3A:
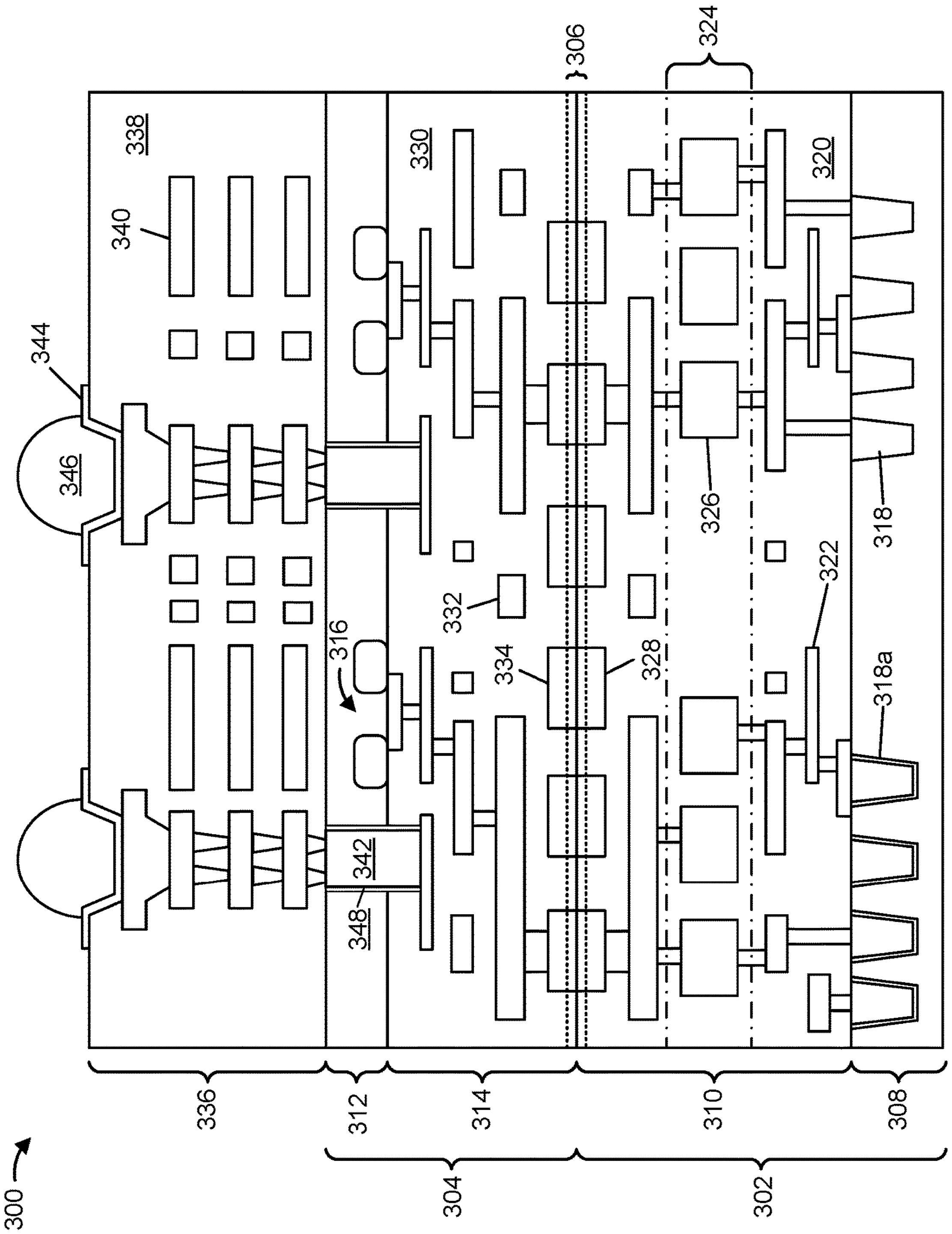
FIGS. 3A and 3B are diagrams of example implementations of an example semiconductor die package described herein.
Figure 3B:
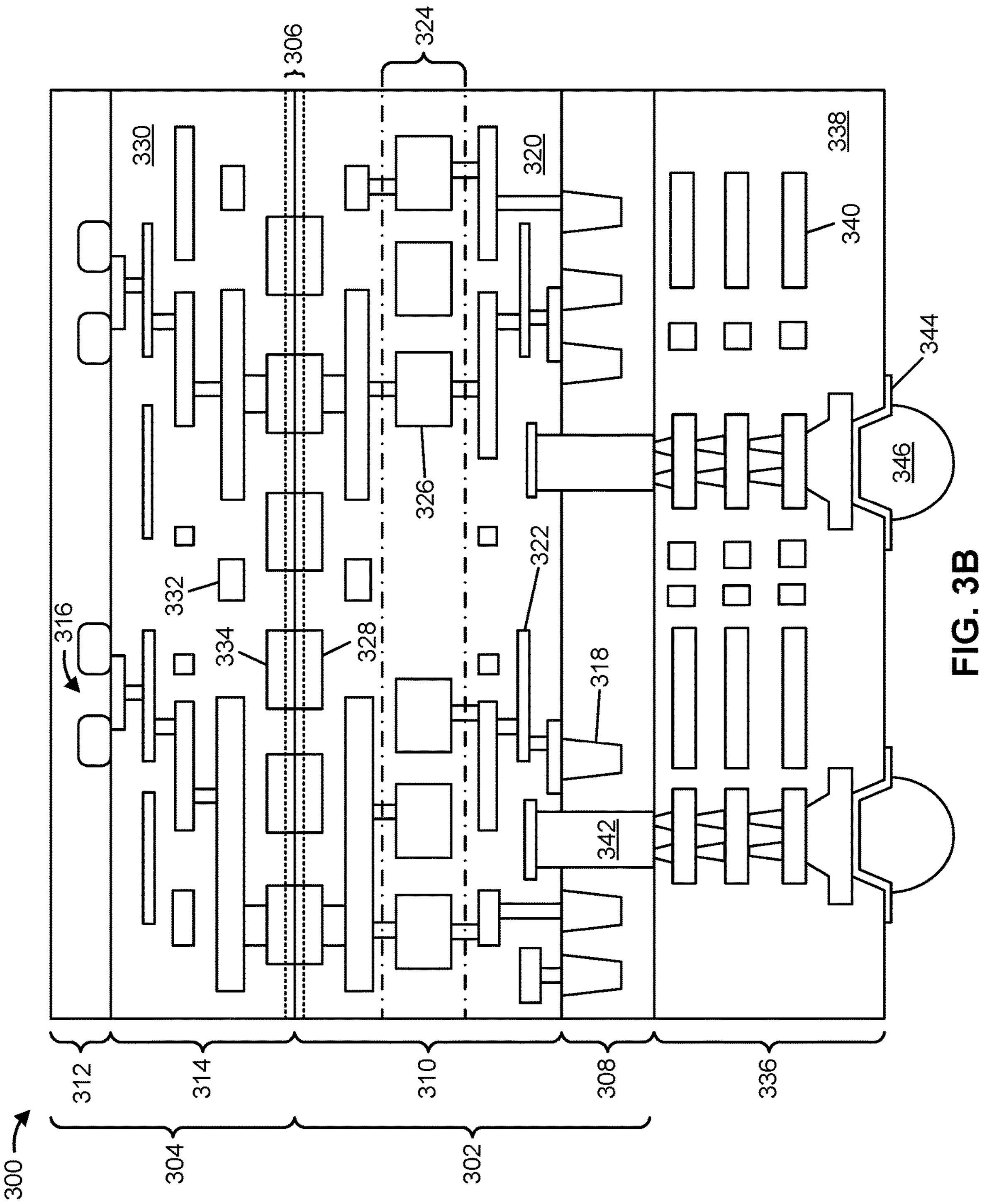

FIGS. 3A and 3B are diagrams of example implementations of an example semiconductor die package 300 described herein. The semiconductor die package 300 includes an example of a wafer on wafer (WoW) semiconductor die package, a chip on wafer (CoW) semiconductor die package, a die to die direct bonded semiconductor die package, or another type of semiconductor die package in which semiconductor dies are directly bonded and vertically arranged or stacked.

As shown in FIG. 3A, the semiconductor die package 300 includes a first semiconductor die 302 and a second semiconductor die 304. In some implementations, the semiconductor die package 300 includes additional semiconductor dies. The first semiconductor die 302 may include an inductor-capacitor (LC) semiconductor die, which is a type of semiconductor die that includes a combination of inductor structures and capacitor structures that correspond to an inductor 202 and a capacitor 204 of a voltage regulator circuit 200 included in the semiconductor die package 300. The second semiconductor die 304 may include a logic semiconductor die, such as a system on chip (SoC) die, a central processing unit (CPU) die, a graphics processing unit (GPU) die, a digital signal processing (DSP) die, and/or an application specific integrated circuit (ASIC) die, among other examples. Additionally and/or alternatively, the first semiconductor die 302 may include a memory die, an input/output (I/O) die, a pixel sensor die, and/or another type of semiconductor die. A memory die may include a static random access memory (SRAM) die, a dynamic random access memory (DRAM) die, a NAND die, a high bandwidth memory (HBM) die, and/or another type of memory die.

The first semiconductor die 302 and the second semiconductor die 304 may be bonded together (e.g., directly bonded) at a bonding interface 306. In some implementations, one or more layers may be included between the first semiconductor die 302 and the second semiconductor die 304 at the bonding interface 306, such as one or more passivation layers, one or more bonding films, and/or one or more layers of another type. In some implementations, a thickness of the second semiconductor die 304 is included in a range of approximately 0.5 microns to approximately 5 microns. However, other values for the range are within the scope of the present disclosure.

The first semiconductor die 302 may include a device region 308 and an interconnect region 310 adjacent to and/or above the device region 308. In some implementations, the first semiconductor die 302 may include additional regions. Similarly, the second semiconductor die 304 may include a device region 312 and an interconnect region 314 adjacent to and/or below the device region 312. In some implementations, the second semiconductor die 304 may include additional regions. The first semiconductor die 302 and the second semiconductor die 304 may be bonded at the interconnect region 310 and the interconnect region 314. The bonding interface 306 may be located at a first side of the interconnect region 314 facing the interconnect region 310 and corresponding to a first side of the second semiconductor die 304.

The device regions 308 and 312 may each include a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate.

The device region 312 may include one or more semiconductor devices 316 included in the semiconductor substrate of the device region 312. The semiconductor devices 316 may include one or more semiconductor transistor structures (e.g., planar transistor structures, fin field effect transistor (FinFET) transistor structures, nanosheet transistor structures (e.g., gate all around (GAA) transistor structures), memory cells, pixel sensors, controller circuits, logic devices, and/or another type of semiconductor devices. In some implementations, at least a subset of the semiconductor devices 316 may be included in a voltage regulator circuit 200 of the semiconductor die package 300. For example, a semiconductor device 316 may correspond to a high-side transistor 206 of the voltage regulator circuit 200, another semiconductor device 316 may correspond to a low-side transistor 208 of the voltage regulator circuit 200, and one or more other semiconductor devices 316 may correspond to a PWM circuit 210 of the voltage regulator circuit 200. The voltage regulator circuit 200 may be configured to provide voltage regulation for other semiconductor devices 316 of the second semiconductor die 304.

The first semiconductor die 302 may include one or more other components of the voltage regulator circuit 200. For example, one or more trench capacitor structures 318 may be included in the device region 308 of the first semiconductor die 302. A trench capacitor structure 318 may correspond to a capacitor 204 of the LC filter of the voltage regulator circuit 200. Liners 318*a* may be included between the trench capacitor structures 318 and the substrate of the device region 308 to prevent electron migration into the device region 308, to prevent metal diffusion into the device region 308, and/or to promote adhesion between the device region 308 and the trench capacitor structures 318.

The interconnect regions 310 and 314 may be referred to as BEOL regions. The interconnect region 310 may include one or more dielectric layers 320, which may include a silicon nitride ($SiN_x$), an oxide (e.g., a silicon oxide ($SiO_x$) and/or another oxide material), a low dielectric constant (low-k) dielectric material, and/or another type of dielectric material. In some implementations, one or more etch stop layers (ESLs) may be included in between layers of the one or more dielectric layers 320. The one or more ESLs may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$), among other examples.

The interconnect region 310 may further include metallization layers 322 in the one or more dielectric layers 320. The trench capacitor structure(s) 318 in the device region 308 may be electrically connected and/or physically connected with one or more of the metallization layers 322. The metallization layers 322 may include conductive lines, trenches, vias, pillars, interconnects, and/or another type of metallization layers.

An inductor region 324 may be included in the interconnect region 310 of the first semiconductor die 302. The inductor region 324 may include one or more inductor structures 326 included in the one or more dielectric layers 320 of the interconnect region 310. The one or more inductor structures 326 may include coil inductor structures and/or another type of inductor structures. The one or more inductor structures 326 may be electrically connected, by one or more metallization layers 322, with one or more trench capacitor structures 318 included in the device region 308. An inductor structure 326 included in the inductor region 324 of the interconnect region 310 may correspond to an inductor 202 of the LC filter of the voltage regulator circuit 200. The inductor structures 326 may include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials. In some implementations, the inductor structures 326 may include the same material or the same combination of materials as the one or more metallization layers 322. In some implementations, the inductor structures 326 may include a different material or a different combination of materials as the one or more metallization layers 322.

Contacts 328 may be included in the one or more dielectric layers 320 of the interconnect region 310. The contacts 328 may be electrically connected and/or physically connected with one or more of the metallization layers 322. The contacts 328 may include conductive terminals, conductive pads, conductive pillars, and/or another type of contacts. The metallization layers 322 and the contacts 328 may each include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

The interconnect region 314 may include one or more dielectric layers 330, which may include a silicon nitride ($SiN_x$), an oxide (e.g., a silicon oxide ($SiO_x$) and/or another oxide material), a low dielectric constant (low-k) dielectric material, and/or another type of dielectric material. In some implementations, one or more etch stop layers (ESLs) may be included in between layers of the one or more dielectric layers 330. The one or more ESLs may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$), among other examples.

The interconnect region 314 may further include metallization layers 332 in the one or more dielectric layers 330. The semiconductor devices 316 in the device region 312 may be electrically connected and/or physically connected with one or more of the metallization layers 332. The metallization layers 332 may include conductive lines, trenches, vias, pillars, interconnects, and/or another type of metallization layers. Contacts 334 may be included in the one or more dielectric layers 330 of the interconnect region 314. The contacts 334 may be electrically connected and/or physically connected with one or more of the metallization layers 332. Moreover, the contacts 334 may be electrically and/or physically connected with the contacts 328 of the first semiconductor die 302. The contacts 334 may include conductive terminals, conductive pads, conductive pillars, Under bump metallization (UBM) structures, and/or another type of contacts. The metallization layers 332 and the contacts 334 may each include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

As further shown in FIG. 3A, the semiconductor die package 300 may include a redistribution structure 336. The redistribution structure 336 may include a redistribution layer (RDL) structure and/or another type of redistribution structure. The redistribution structure 336 may be configured to fan out and/or route signals and I/O of the semiconductor dies 302 and 304.

The redistribution structure 336 may include one or more dielectric layers 338 and a plurality of metallization layers 340 disposed in the one or more dielectric layers 338. The dielectric layer(s) 338 may include a silicon nitride ($SiN_x$), an oxide (e.g., a silicon oxide ($SiO_x$) and/or another oxide material), a low dielectric constant (low-k) dielectric material, and/or another suitable dielectric material.

The metallization layers 340 of the redistribution structure 336 may include one or more materials such as a gold (Au) material, a copper (Cu) material, a silver (Ag) material, a nickel (Ni) material, a tin (Sn) material, and/or a palladium (Pd) material, among other examples. The metallization layers 340 of the redistribution structure 336 may include metal lines, vias, interconnects, and/or another type of metallization layers.

As further shown in FIG. 3A, the semiconductor die package 300 may include one or more backside through silicon via (BTSV) structures 342 through the device region 312, and into a portion of the interconnect region 314. The one or more BTSV structures 342 may include vertically elongated conductive structures (e.g., conductive pillars, conductive vias) that electrically connect one or more of the metallization layers 332 in the interconnect region 314 of the second semiconductor die 304 to one or more metallization layers 340 in the redistribution structure 336. The BTSV structures 342 may be referred to as through silicon via (TSV) structures in that the BTSV structures 342 extend fully through a silicon substrate (e.g., the semiconductor substrate of the device region 312) as opposed to extending fully through a dielectric layer or an insulator layer. The one or more BTSV structures 342 may include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

UBM layers 344 may be included on a top surface of the one or more dielectric layers 338 of the redistribution structure 336. The UBM layers 344 may be electrically connected and/or physically connected with one or more metallization layers 340 in the redistribution structure 336. The UBM layers 344 may be included in recesses in the top surface of the one or more dielectric layers 338. The UBM layers 344 may include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

As further shown in FIG. 3A, the semiconductor die package 300 may include conductive terminals 346. The conductive terminals 346 may be electrically connected and/or physically connected with the UBM layers 344. The UBM layers 344 may be included to facilitate adhesion to the one or more metallization layers 340 in the redistribution structure 336, and/or to provide increased structural rigidity for the conductive terminals 346 (e.g., by increasing the surface area to which the conductive terminals 346 are connected). The conductive terminals 346 may include ball grid array (BGA) balls, land grid array (LGA) pads, pin grid array (PGA) pins, and/or another type of conductive terminals. The conductive terminals 346 may enable the semiconductor die package 300 to be mounted to a circuit board, a socket (e.g., an LGA socket), an interposer or redistribution structure of a semiconductor device package (e.g., a chip on wafer on substrate CoWoS package, an integrated fanout (InFO) package), and/or another type of mounting structure. Liners 348 may be included between the BTSV structures 342 and the substrate of the device region 312 to prevent electron migration into the device region 312, to prevent copper diffusion into the device region 312, and/or to promote adhesion between the device region 312 and the BTSV structures 342.

FIG. 3B is a diagram of an alternative implementation of the semiconductor die package 300 to the example implementation shown in FIG. 3A. As shown in FIG. 3B, the semiconductor die package 300 includes a similar arrangement of components and structures as the example implementation of the semiconductor die package 300 shown in FIG. 3A. However, in the alternative implementation of the semiconductor die package 300 shown in FIG. 3B, the redistribution structure 336 is included over the device region 308 of the first semiconductor die 302 as opposed to being over the device region 312 of the second semiconductor die 304. The one or more BTSV structures 342 extend through the semiconductor substrate of the device region 308 and into a portion of the interconnect region 310 to one or more metallization layers 322 as opposed to extending through the device region 312. Accordingly, the one or more BTSV structures 342 extend alongside or adjacent to one or more of the trench capacitor structures 318 in the device region 308. This enables external connections to the semiconductor dies 302 and 304 to be made through the first semiconductor die 302 instead of (or in addition to) the second semiconductor die 304.

As indicated above, FIGS. 3A and 3B are provided as examples. Other examples may differ from what is described with regard to FIGS. 3A and 3B.

Figure 4A:
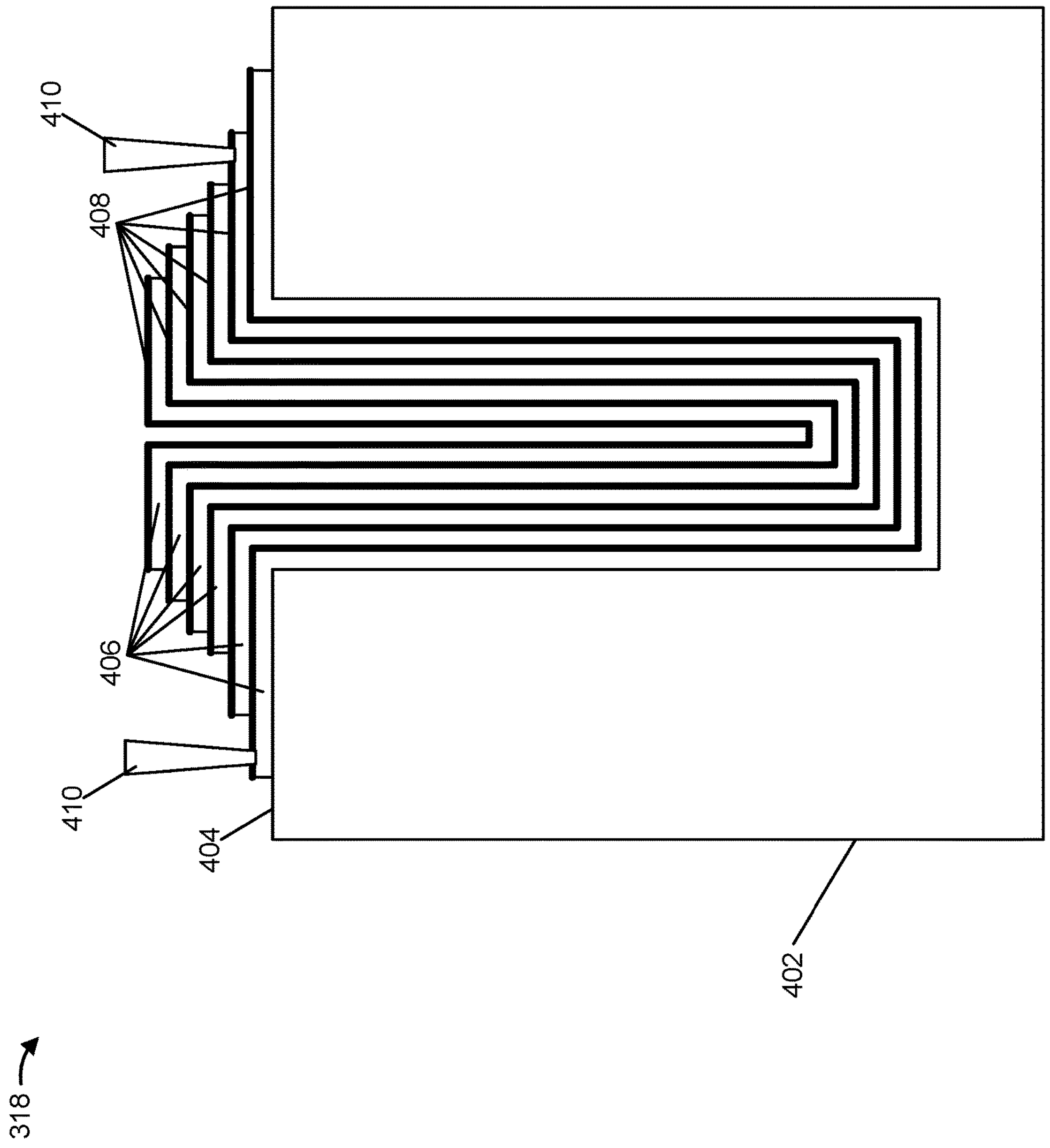
FIGS. 4A and 4B are diagrams of example components of a voltage regulator circuit described herein.
Figure 4B:
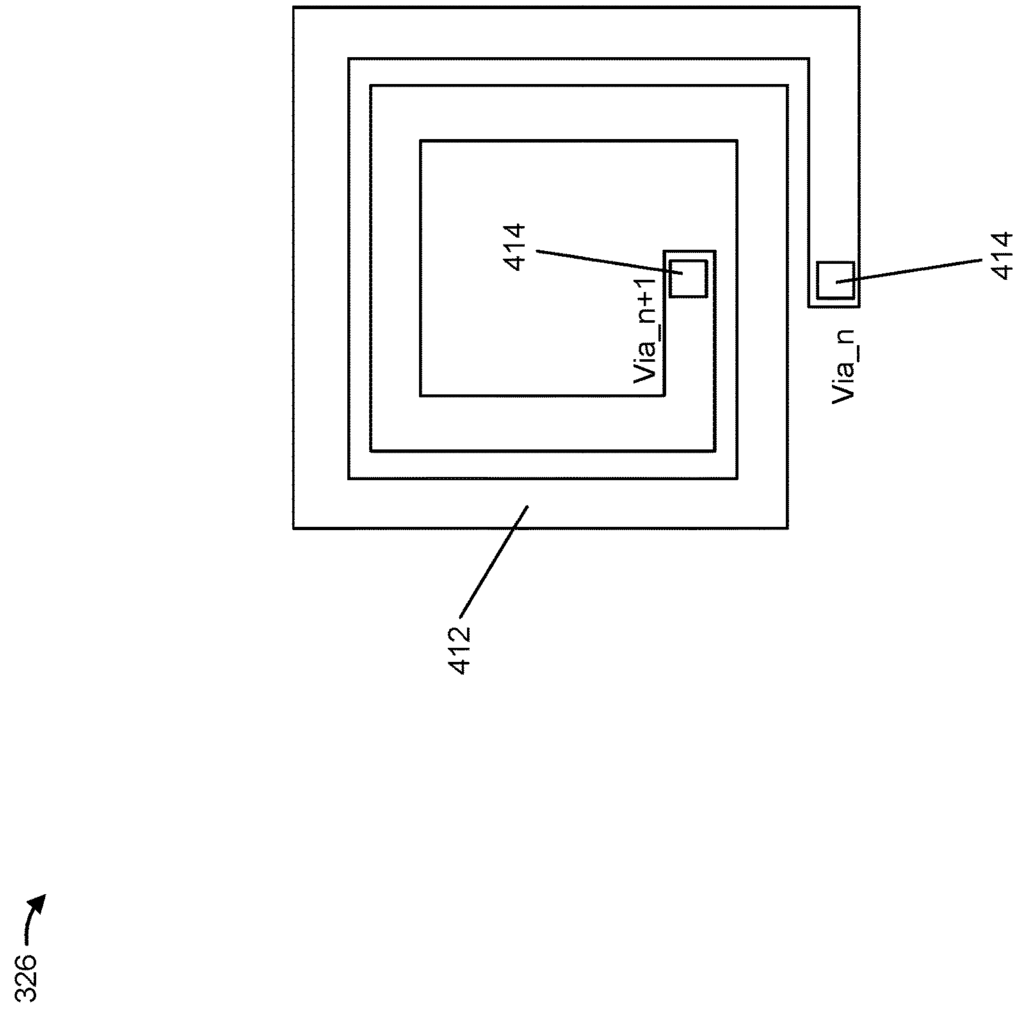

FIGS. 4A and 4B are diagrams of example components of a voltage regulator circuit 200 described herein.

FIG. 4A illustrates an example trench capacitor structure 318, which may correspond to a capacitor 204 in an LC filter of the voltage regulator circuit 200. The trench capacitor structure 318 may be formed in a device region, such as the device region 308 of the first semiconductor die 302 described herein. In particular, the trench capacitor structure 318 may extend into a semiconductor substrate 402 of the device region from a top surface 404 of the semiconductor substrate 402.

The trench capacitor structure 318 may include a plurality of conductive layers 406 and a plurality of dielectric layers 408. The conductive layers 406 and the dielectric layers 408 may be arranged in an alternating configuration in the trench capacitor structure 318. For example, a first conductive layer 406 may be included in the trench capacitor structure 318, a first dielectric layer 408 may be included over the first conductive layer 406, a second conductive layer 406 may be included over the first dielectric layer 408, and so on. A dielectric layer 408 between a pair of conductive layers 406 may correspond to a trench capacitor of the trench capacitor structure 318, where the conductive layers 406 correspond to the electrodes of the trench capacitor and the dielectric layer 408 corresponds to the dielectric medium of the trench capacitor. In this way, the decoupling trench capacitor structure 318 includes a plurality of layered trench capacitors that extend into the semiconductor substrate 402 of the device region.

In general, a deeper trench capacitor structure 318 may provide a greater amount of decoupling capacitance relative to a shallower trench capacitor structure 318. Additionally and/or alternatively, a wider trench capacitor structure 318 may include a greater quantity of conductive layers 406 and a greater quantity of dielectric layers 408 and, therefore, a greater quantity of trench capacitors relative to a narrower trench capacitor structure 318. This enables a wider trench capacitor structure 318 to also provide a greater amount of capacitance relative to a narrower decoupling trench capacitor structure 318.

The conductive layers 406 may include one or more conductive materials such as a conductive metal (e.g., copper (Cu), tungsten (W), titanium (Ti), tantalum (Ta), ruthenium (Ru), cobalt (Co)), a conductive ceramic (e.g., tantalum nitride (TaN), titanium nitride (TiN)), and/or another type of conductive material. The dielectric layers 408 may include one or more dielectric materials such as an oxide (e.g., silicon oxide ($SiO_x$)), a nitride (e.g., silicon nitride ($Si_xN_y$), and/or another suitable dielectric material.

As further shown in FIG. 4A, the conductive layers 406 and the dielectric layers 408 may partially extend out of the semiconductor substrate 402 of the device region and may extend along a portion of the surface 404 of the semiconductor substrate 402 of the device region. This enables conductive terminals 410 to be electrically connected and/or physically connected with the conductive layers 406. The conductive terminals 410 may electrically connect and/or physically connect the trench capacitor structure 318 to other structures and/or devices in the semiconductor die package 300.

FIG. 4B illustrates an example inductor structure 326, which may correspond to an inductor 202 in the LC filter of the voltage regulator circuit 200. As shown in FIG. 4B, the inductor structure 326 may include a conductor 412. The conductor 412 may include an elongated shape that is arranged in the shape of a coil. In other words, the conductor 412 may wind around itself in a spiral. The conductor 410 may include one or more electrically conductive materials, such as a conductive metal (e.g., copper (Cu), tungsten (W), titanium (Ti), tantalum (Ta), ruthenium (Ru), cobalt (Co)), a conductive ceramic (e.g., tantalum nitride (TaN), titanium nitride (TiN)), and/or another type of conductive material. The coil shape of the conductor 412 is configured to enable a magnetic field to be generated as an electrical current flows through the conductor 412.

As further shown in FIG. 4B, the inductor structure 326 may include conductive terminals 414 at opposing ends of the conductor 412. The conductive terminals 414 may each include one or more electrically conductive materials, such as a conductive metal (e.g., copper (Cu), tungsten (W), titanium (Ti), tantalum (Ta), ruthenium (Ru), cobalt (Co)), a conductive ceramic (e.g., tantalum nitride (TaN), titanium nitride (TiN)), and/or another type of conductive material. The conductive terminals 414 may enable an electrical current to be provided to the conductor 412. The conductive terminals 414 may be located at different levels in the semiconductor die package 300 (e.g., Via_n and V_n+1).

As indicated above, FIGS. 4A and 4B are provided as examples. Other examples may differ from what is described with regard to FIGS. 4A and 4B.

FIGS. 5A-5E are diagrams of an example implementation 500 of forming a semiconductor die described herein. In some implementations, the example implementation 500 includes an example process for forming the second semiconductor die 304 (or a portion thereof). In some implementations, one or more of the semiconductor processing tools 102-114 and/or the wafer/die transport tool 116 may perform one or more of the operations described in connection with the example implementation 500. In some implementations, one or more operations described in connection with the example implementation 500 may be performed by another semiconductor processing tool.

Figure 5A:
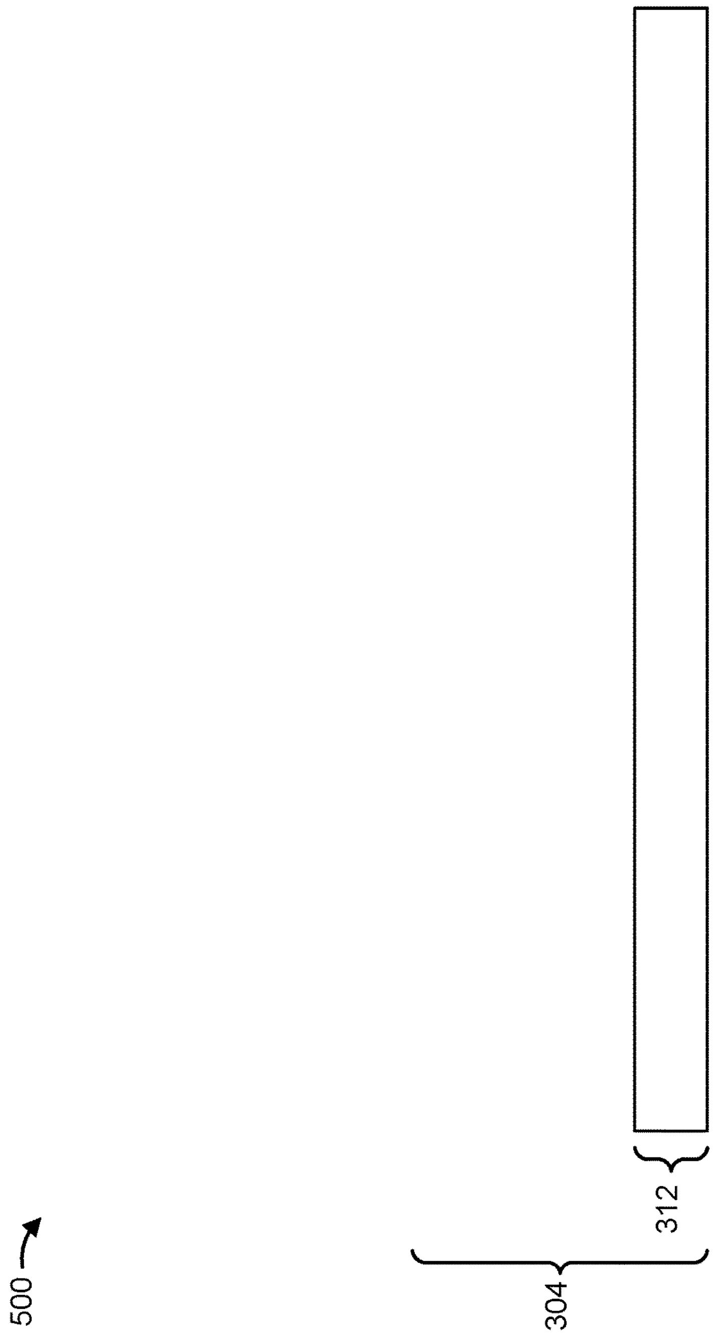
FIGS. 5A-5E are diagrams of an example implementation of forming a semiconductor die described herein.

Turning to FIG. 5A, one or more of the operations in the example implementation 500 may be performed in connection with the semiconductor substrate of the device region 312 of the second semiconductor die 304. The semiconductor substrate of the device region 312 may be provided in the form of a semiconductor wafer or another type of substrate.

Figure 5B:
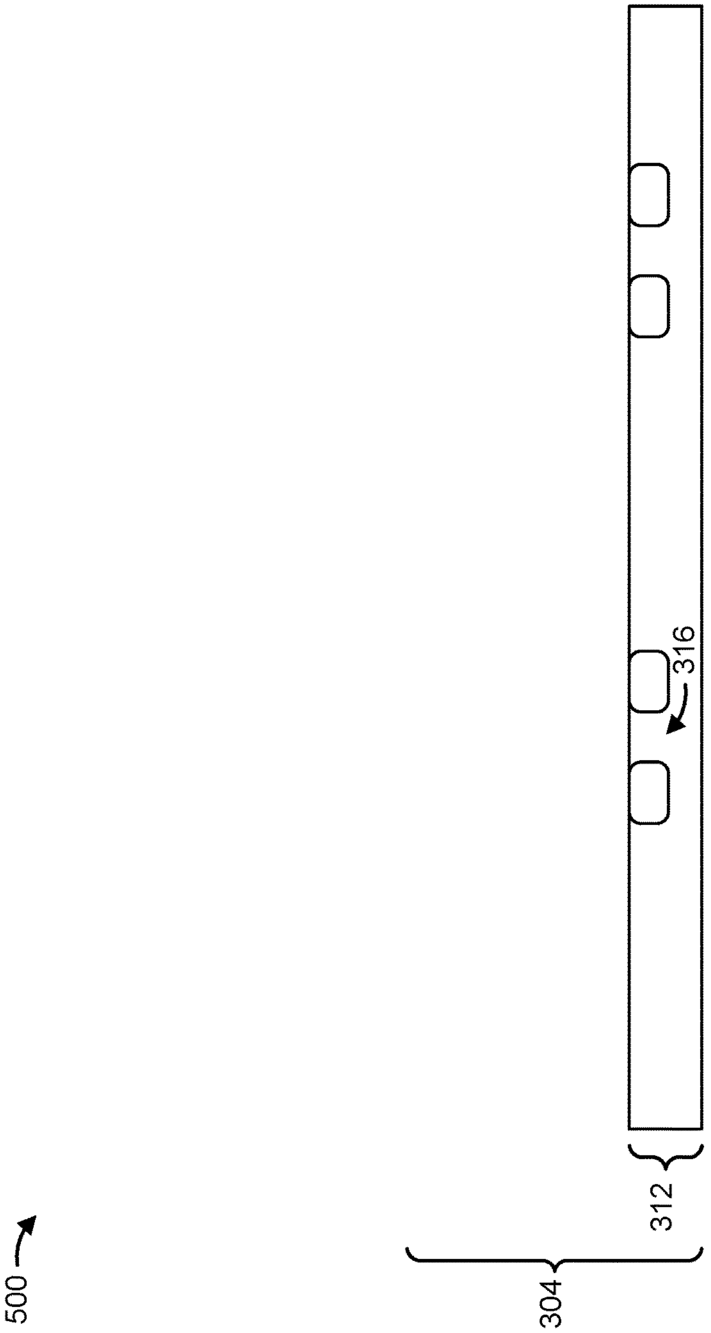

As shown in FIG. 5B, one or more semiconductor devices 316 may be formed in the device region 312. For example, one or more of the semiconductor processing tools 102-114 may perform photolithography patterning operations, etching operations, deposition operations, CMP operations, and/or another type of operations to form one or more transistors, one or more memory cells, one or more circuits (e.g., one or more ICs), and/or one or more active semiconductor devices of another type. In some implementations, one or more regions of the semiconductor substrate of the device region 312 may be doped in an ion implantation operation to form one or more p-wells, one or more n-wells, and/or one or more deep n-wells. In some implementations, the deposition tool 102 may deposit one or more source/drain regions, one or more gate structures, and/or one or more shallow trench isolation (STI) regions, among other examples.

Figure 5C:
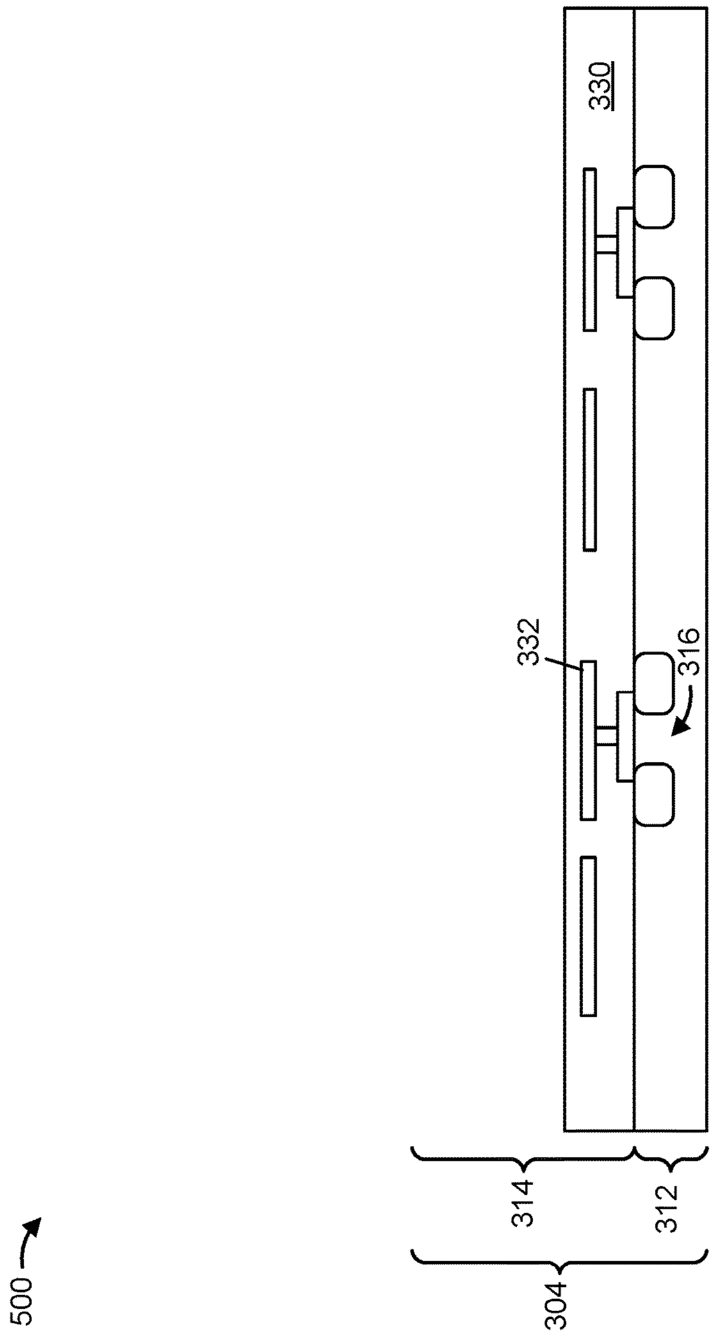
Figure 5D:
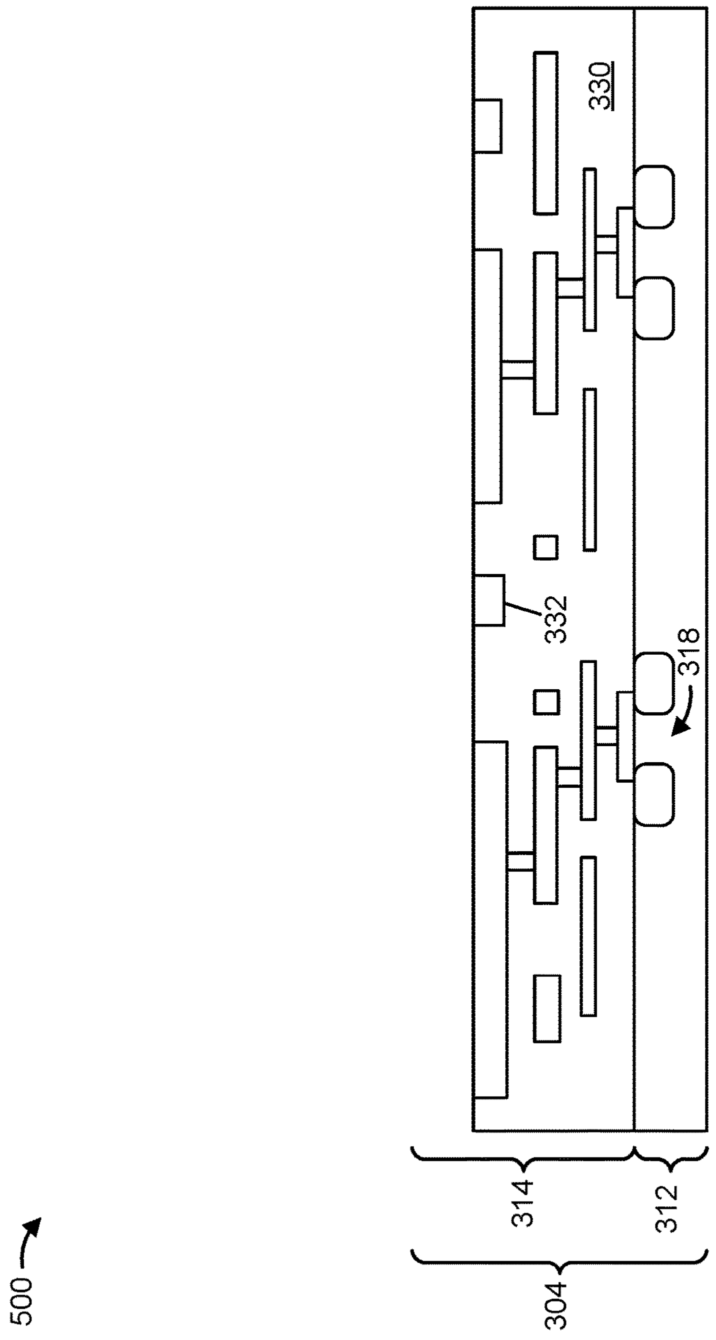
Figure 5E:
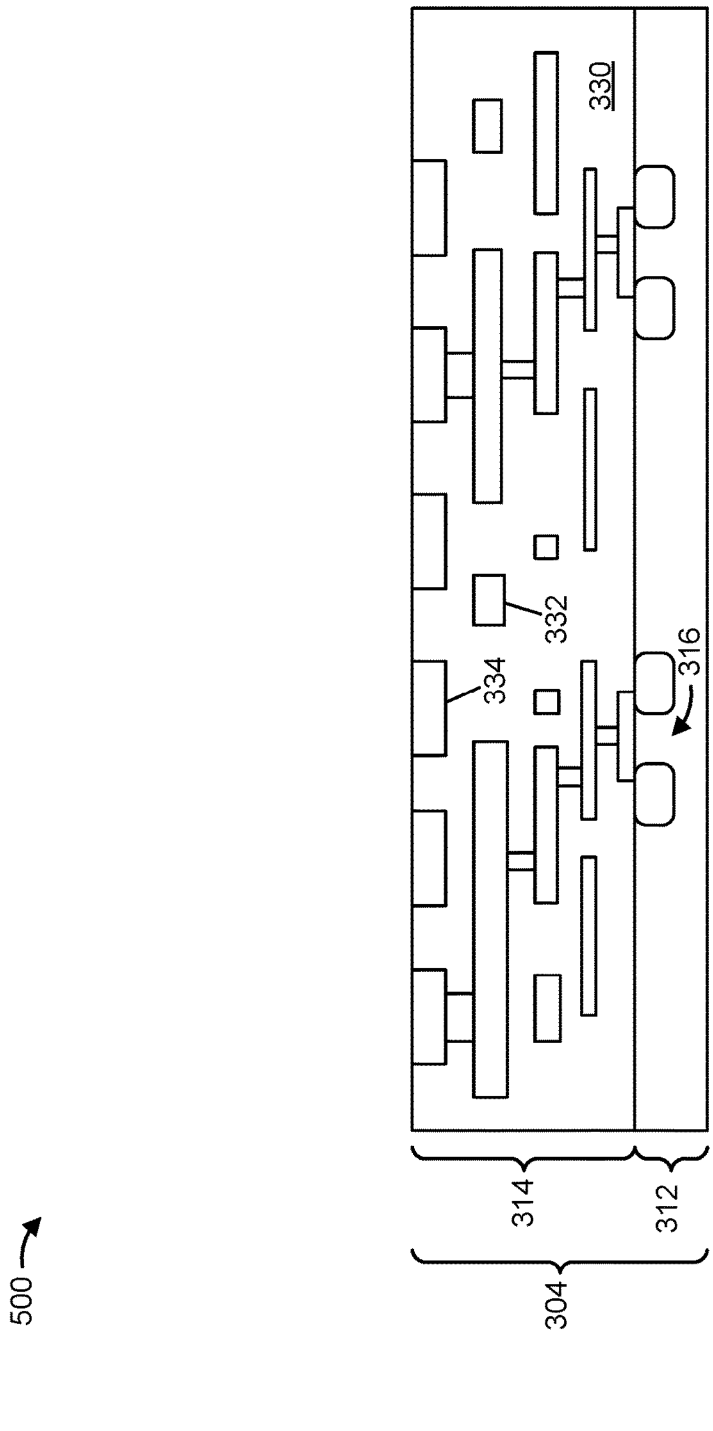

As shown in FIGS. 5C-5E, the interconnect region 314 of the second semiconductor die 304 may be formed over and/or on the semiconductor substrate of the device region 312. One or more of the semiconductor processing tools 102-114 may form the interconnect region 314 by forming one or more dielectric layers 330 and forming a plurality of metallization layers 332 in the plurality of dielectric layers 330. For example, the deposition tool 102 may deposit a first layer of the one or more dielectric layers 330 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 332 in the recesses (e.g., using a CVD technique, an ALD technique, a PVD technique, an electroplating technique, and/or another type of deposition technique). At least a portion of the first metallization layer may be electrically connected and/or physically connected with the semiconductor device(s) 316. The deposition tool 102, the etch tool 108, the plating tool 112, and/or another semiconductor processing tool may continue to perform similar processing operations to forming the interconnect region 314 until a sufficient or desired arrangement of metallization layers 332 is achieved.

As shown in FIG. 5E, one or more of the semiconductor processing tools 102-114 may form another layer of the one or more dielectric layers 330, and may form a plurality of contacts 334 in the layer such that the contacts 334 are electrically connected and/or physically connected with one or more of the metallization layers 332. For example, the deposition tool 102 may deposit the layer of the one or more dielectric layers 330 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 334 in the recesses (e.g., using a CVD technique, an ALD technique, a PVD technique, an electroplating technique, and/or another type of deposition technique).

As indicated above, FIGS. 5A-5E are provided as an example. Other examples may differ from what is described with regard to FIGS. 5A-5E.

FIGS. 6A-6E are diagrams of an example implementation 600 of forming a semiconductor die described herein. In some implementations, the example implementation 600 includes an example process for forming the example implementation of the first semiconductor die 302 (or a portion thereof) described in connection with FIGS. 3A and 3B. In some implementations, one or more of the semiconductor processing tools 102-114 and/or the wafer/die transport tool 116 may perform one or more of the operations described in connection with the example implementation 600. In some implementations, one or more operations described in connection with the example implementation 600 may be performed by another semiconductor processing tool.

Figure 6A:
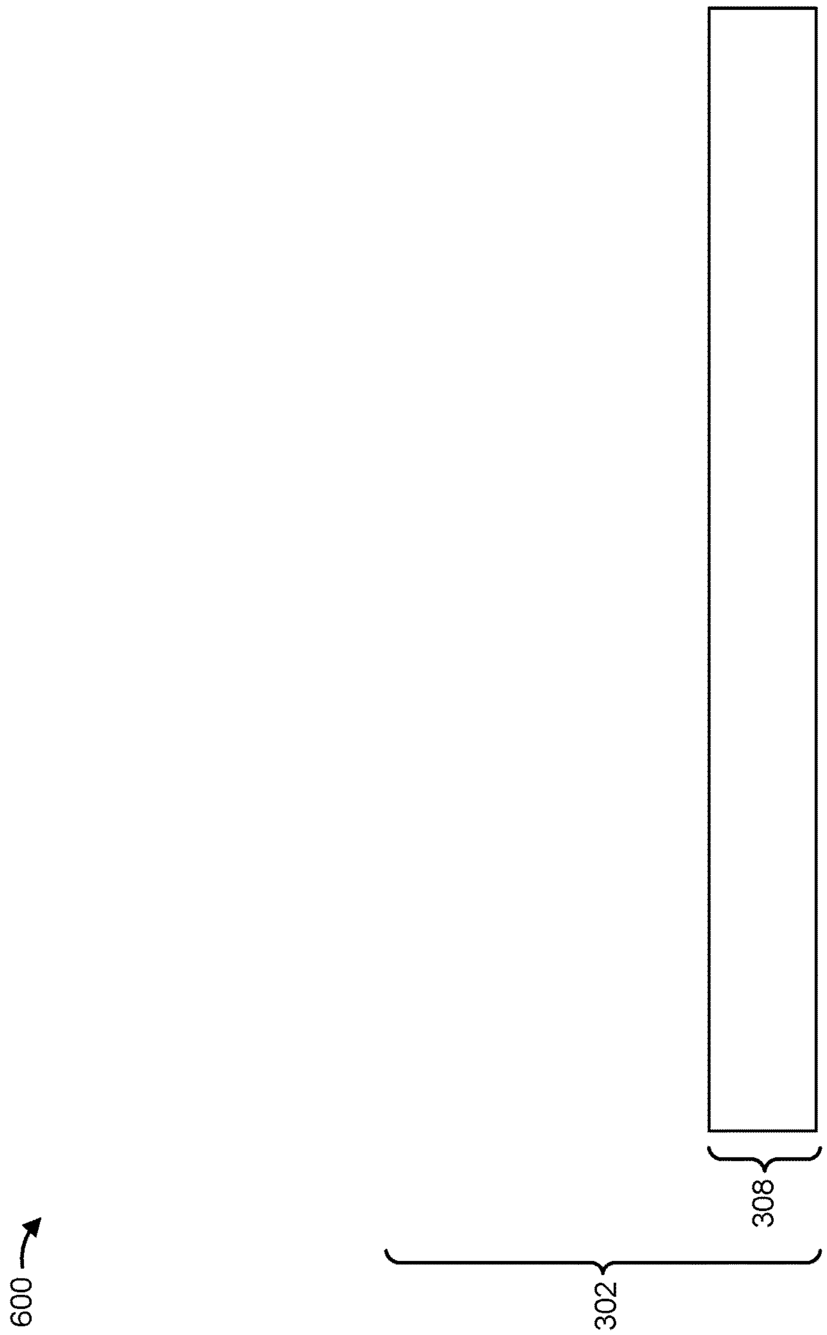
FIGS. 6A-6E are diagrams of an example implementation of forming a semiconductor die described herein.

Turning to FIG. 6A, one or more of the operations in the example implementation 600 may be performed in connection with the semiconductor substrate of the device region 308 of the first semiconductor die 302. The semiconductor substrate of the device region 308 may be provided in the form of a semiconductor wafer or another type of substrate.

Figure 6B:
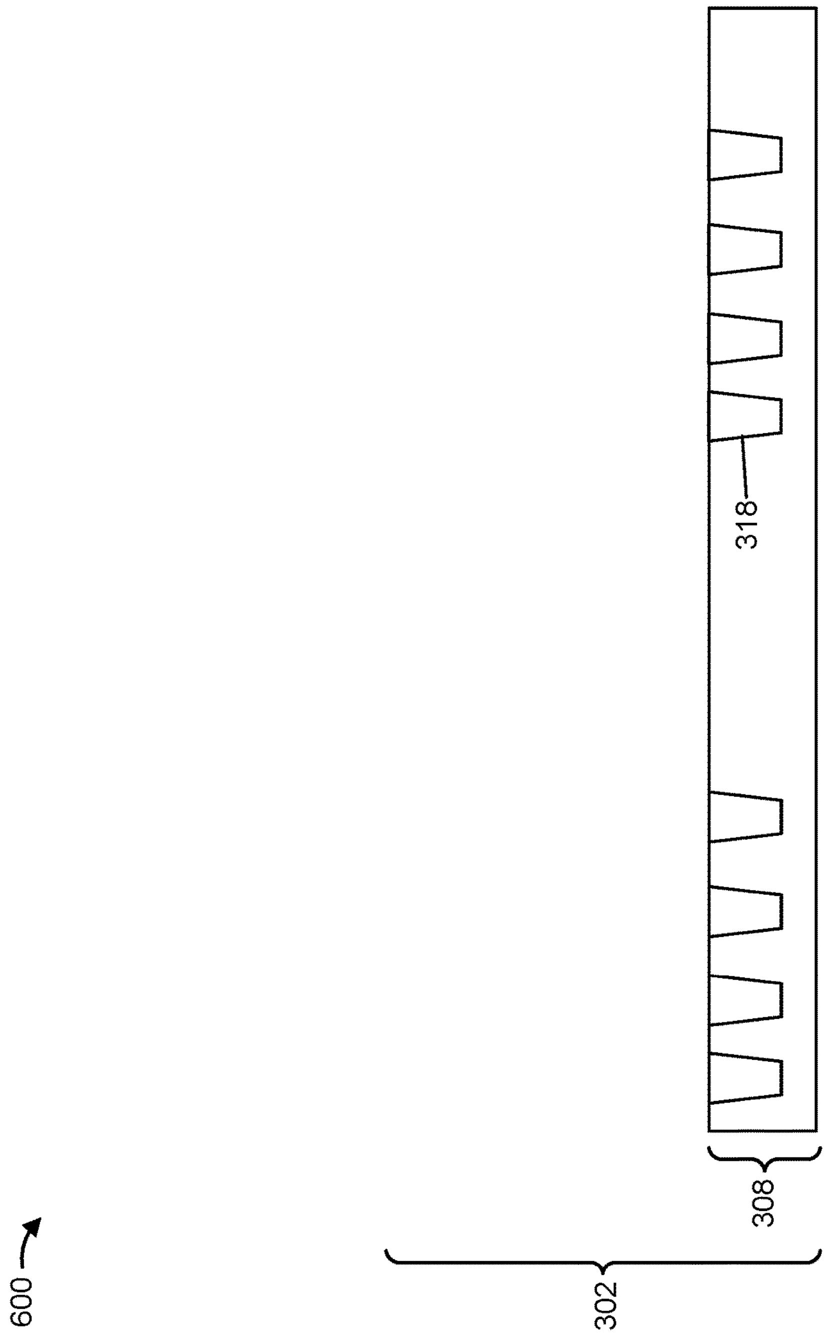

As shown in FIG. 6B, a plurality of trench capacitor structures 318 may be formed in the device region 308. To form a trench capacitor structure 318, a recess may be formed in the semiconductor substrate (e.g., the semiconductor substrate 402 from the surface 404) of the device region 308 using a pattern in a photoresist layer, a hard mask, and/or another type of masking layer. For example, the deposition tool 102 forms a photoresist layer over the semiconductor substrate of the device region 308. The exposure tool 104 exposes the photoresist layer to a radiation source to pattern the photoresist layer. The developer tool 106 develops and removes portions of the photoresist layer to expose the pattern. The etch tool 108 etches into the semiconductor substrate of the device region 308 to form the recess. The deposition tool 102 may perform a deposition operation (e.g., a CVD operation, a PVD operation, an ALD operation) to deposit a first conductive layer 406 in the recess such that the first conductive layer 406 conforms to the shape of the recess. The deposition tool 102 may perform a deposition operation (e.g., a CVD operation, a PVD operation, an ALD operation) to deposit a first dielectric layer 408 on the first conductive layer 406. The deposition tool 102 may perform a deposition operation (e.g., a CVD operation, a PVD operation, an ALD operation) to deposit a second conductive layer 406 on the first dielectric layer 408. The deposition tool 102 may perform a deposition operation (e.g., a CVD operation, a PVD operation, an ALD operation) to deposit a second dielectric layer 408 on the second conductive layer 406. The deposition tool 102 may perform subsequent deposition operations until a sufficient or desired quantity of deep trench capacitors are formed in the recess for the trench capacitor structure 318.

Figure 6C:
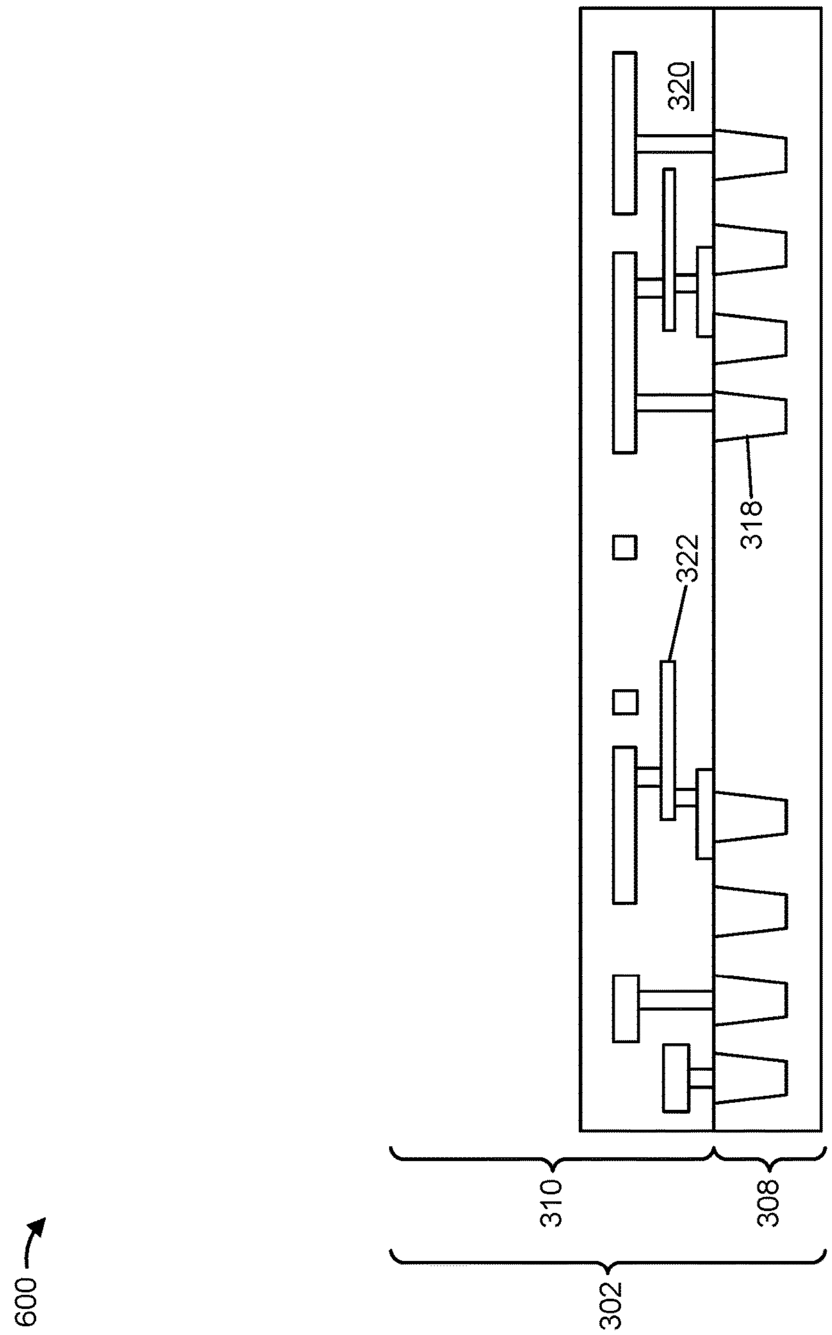
Figure 6D:
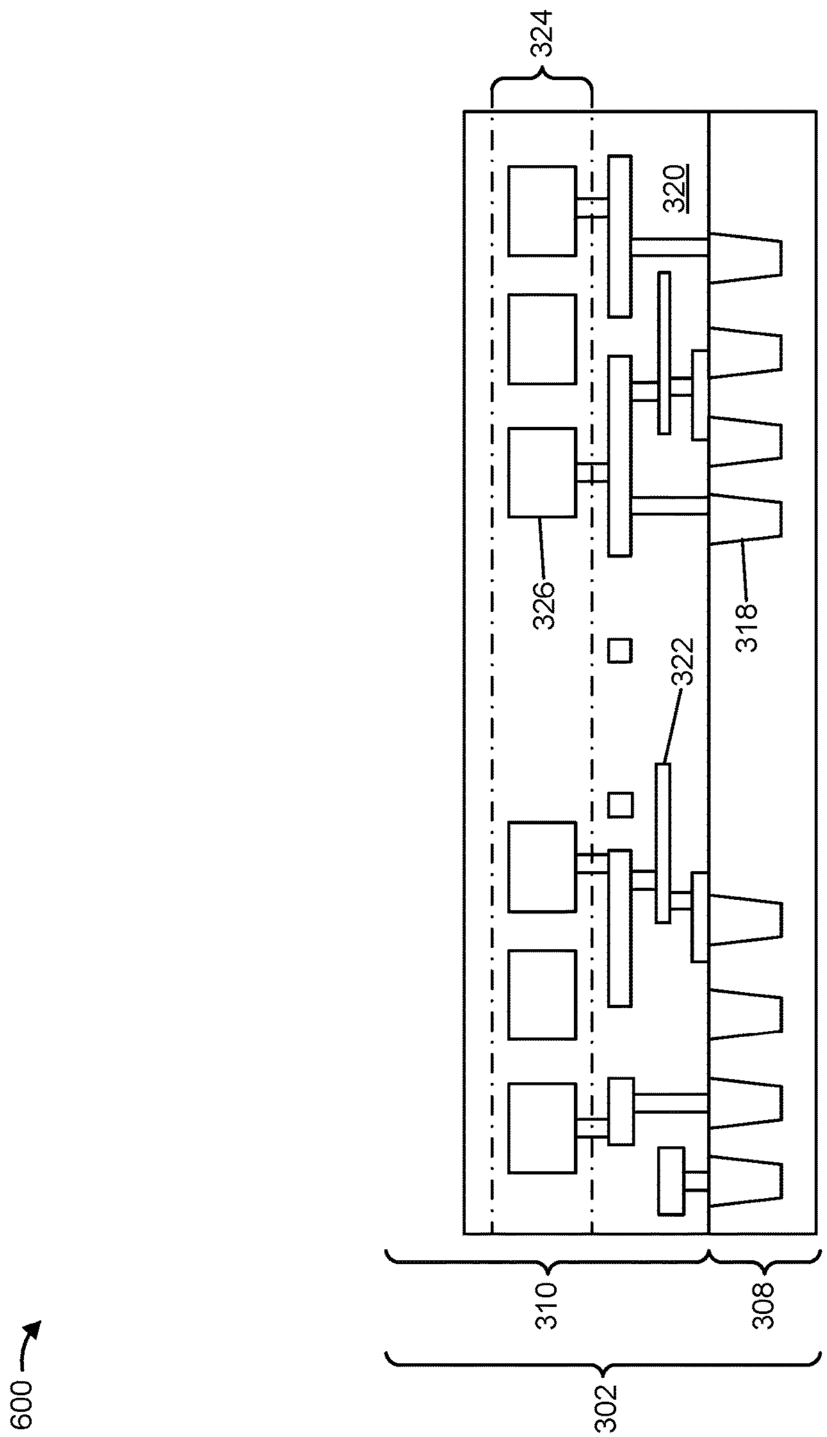
Figure 6E:
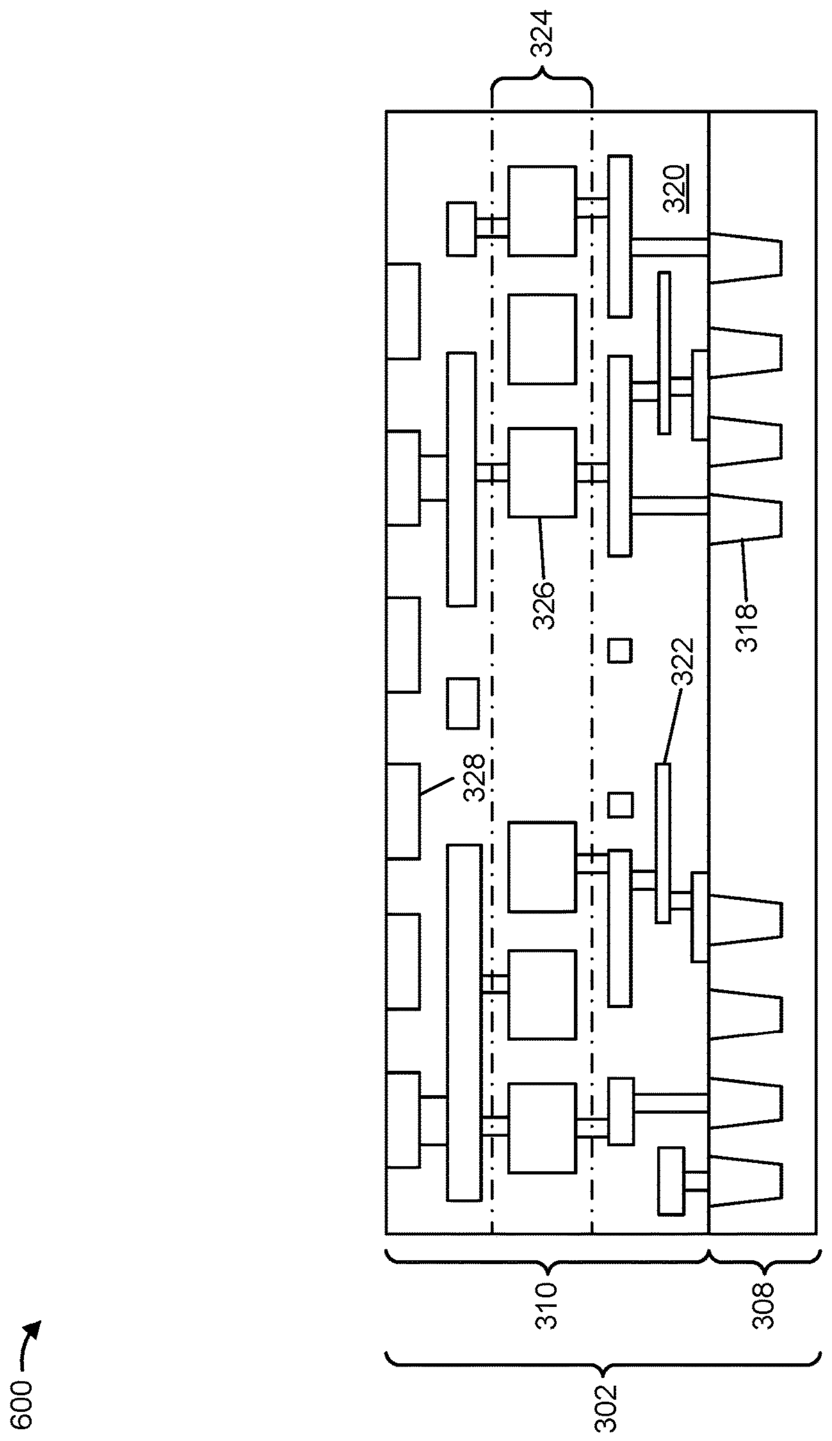

As shown in FIGS. 6C-6E, the interconnect region 310 of the first semiconductor die 302 may be formed over and/or on the semiconductor substrate of the device region 308. One or more of the semiconductor processing tools 102-114 may form the interconnect region 310 by forming one or more dielectric layers 320 and forming a plurality of metallization layers 322 in the plurality of dielectric layers 320. For example, the deposition tool 102 may deposit a first layer of the one or more dielectric layers 320 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 322 in the recesses (e.g., using a CVD technique, an ALD technique, a PVD technique, an electroplating technique, and/or another type of deposition technique). The deposition tool 102, the etch tool 108, the plating tool 112, and/or another semiconductor processing tool may continue to perform similar processing operations to forming the interconnect region 310 until a sufficient or desired arrangement of metallization layers 322 is achieved.

As shown in FIG. 6D, one or more inductor structures 326 may be formed in an inductor region 324 in the interconnect region 310 of the first semiconductor die 302. The one or more inductor structures 326 may be electrically connected and/or physically connected with one or more of the metallization layers 322. Moreover, the one or more inductor structures 326 may be electrically connected with the one or more trench capacitor structures 318 by one or more of the metallization layers 322.

To form an inductor structure 326, a recess may be formed in one or more of the dielectric layers 320 of the interconnect region 310 using a pattern in a photoresist layer, a hard mask, and/or another type of masking layer. For example, the deposition tool 102 forms a photoresist layer over the one or more of the dielectric layers 320. The exposure tool 104 exposes the photoresist layer to a radiation source to pattern the photoresist layer. The developer tool 106 develops and removes portions of the photoresist layer to expose the pattern. The etch tool 108 etches into the one or more of the dielectric layers 320 to form the recess. The deposition tool 102 may perform one or more deposition operations (e.g., a CVD operation, a PVD operation, an electroplating operation, an ALD operation) to deposit a conductor 410 and a plurality of conductive terminals 412 in the recess to form the inductor structure 326 in the recess.

As shown in FIG. 6E, one or more of the semiconductor processing tools 102-114 may form another layer of the one or more dielectric layers 320, and may form a plurality of contacts 328 in the layer such that the contacts 328 are electrically connected and/or physically connected with one or more of the metallization layers 322. For example, the deposition tool 102 may deposit the layer of the one or more dielectric layers 320 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 328 in the recesses (e.g., using a CVD technique, an ALD technique, a PVD technique, an electroplating technique, and/or another type of deposition technique).

As indicated above, FIGS. 6A-6E are provided as an example. Other examples may differ from what is described with regard to FIGS. 6A-6E.

FIGS. 7A-7G are diagrams of an example implementation 700 of forming a portion of a semiconductor die package 300 described herein. In some implementations, one or more operations described in connection with FIGS. 7A-7D may be performed by one or more of the semiconductor processing tools 102-114 and/or the wafer/die transport tool 116. In some implementations, one or more operations described in connection with FIGS. 7A-7D may be performed by another semiconductor processing tool.

Figure 7A:
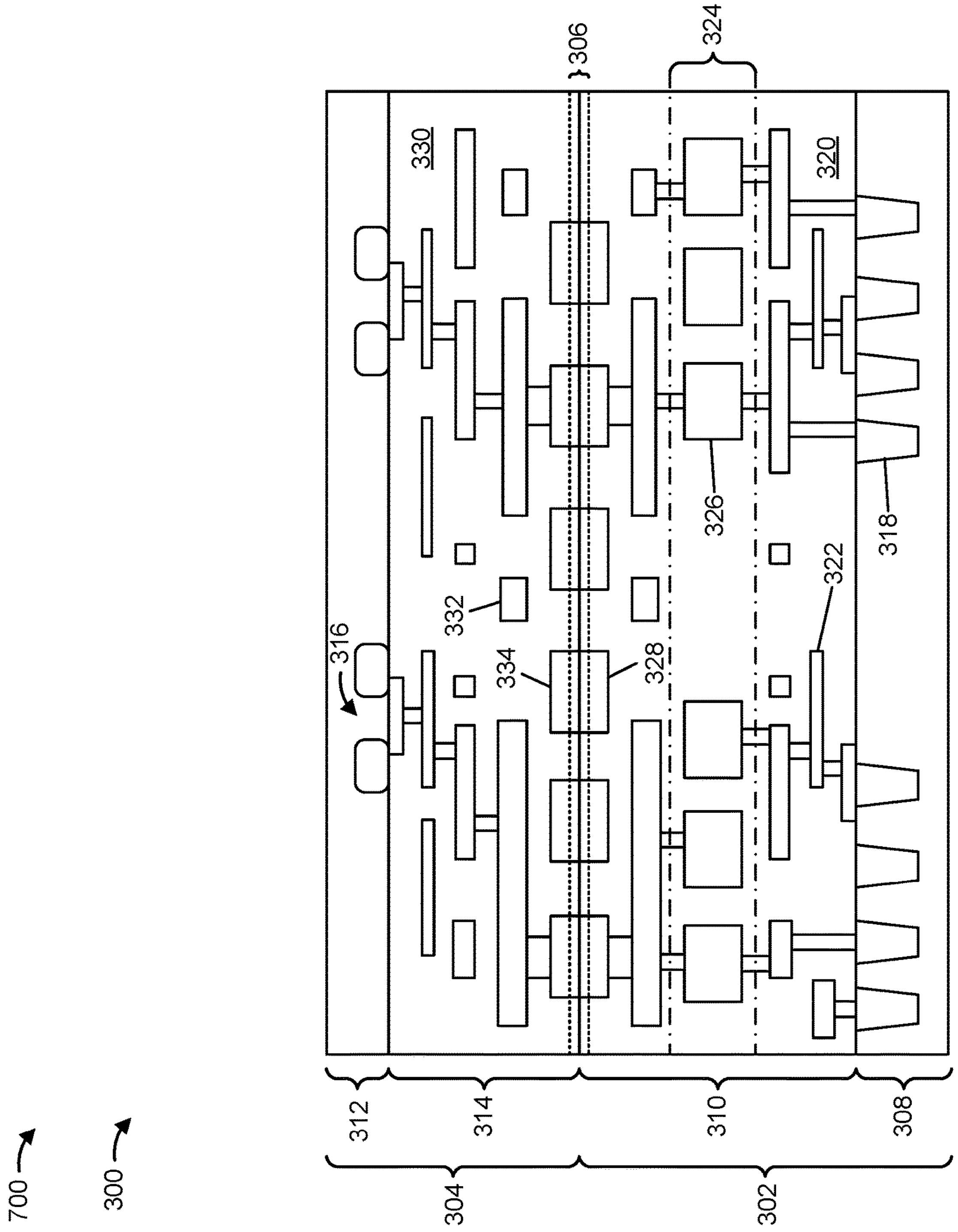
FIGS. 7A-7G are diagrams of an example implementation of forming a portion of a semiconductor die package described herein.

As shown in FIG. 7A, the first semiconductor die 302 and the second semiconductor die 304 may be bonded at the bonding interface 306 such that the first semiconductor die 302 and the second semiconductor die 304 are vertically arranged or stacked. The bonding tool 114 may perform a bonding operation to bond the first semiconductor die 302 and the second semiconductor die 304 at the bonding interface 306. The bonding operation may include a direct bonding operation in which bonding of first semiconductor die 302 and the second semiconductor die 304 is achieved through the physical connection of the contacts 328 with the contacts 334. A direct bond may include a dielectric to dielectric bond, a metal to metal bond, or a combination thereof. In some implementations, the bonding interface 306 includes a combination of a dielectric to dielectric direct bonding region and a metal to metal direct bonding region.

Figure 7B:
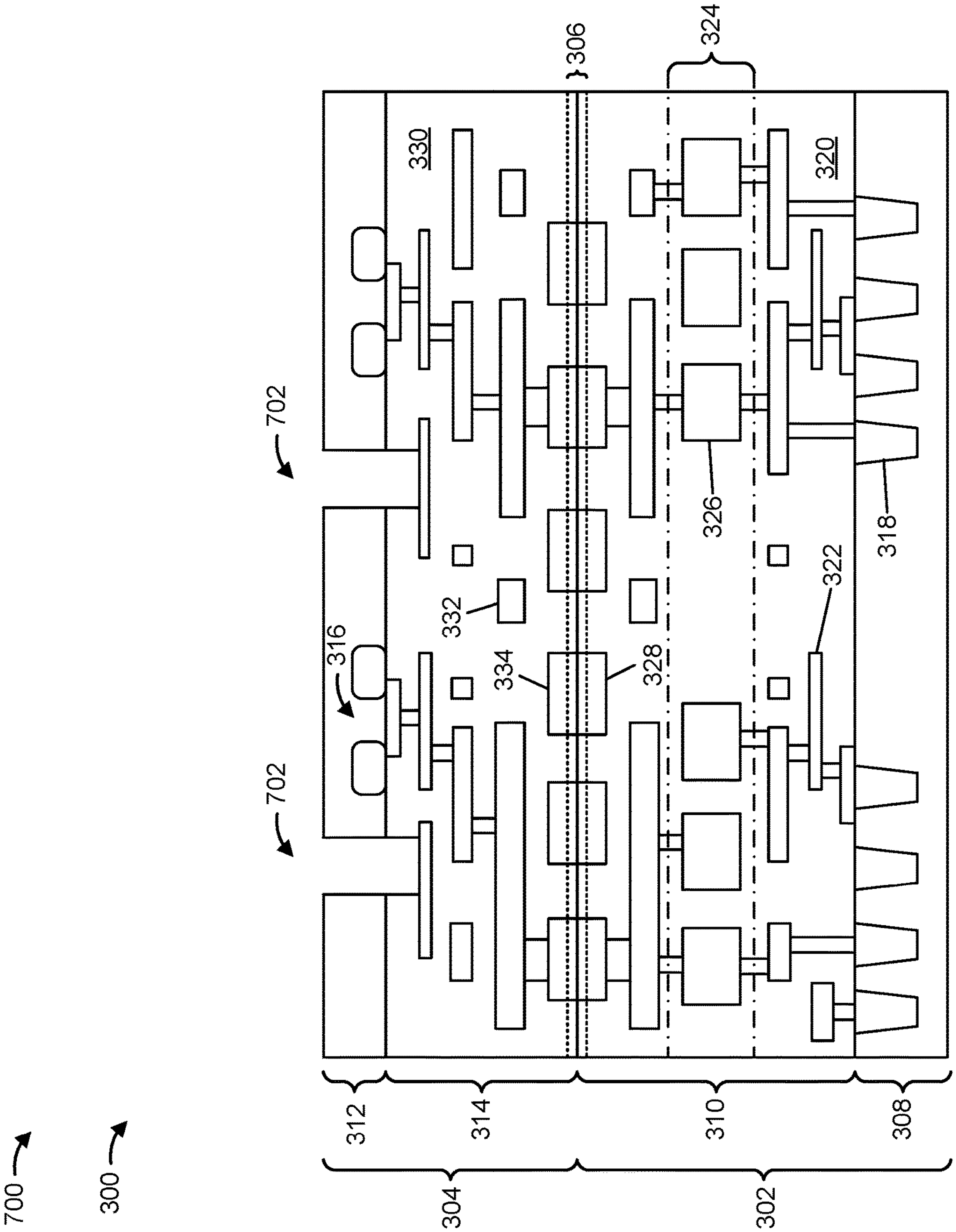

As shown in FIG. 7B, one or more recesses 702 may be formed through the semiconductor substrate of the device region 312 and into a portion of the dielectric layer 330 of the interconnect region 314. The one or more recesses 702 may be formed to expose one or more portions of a metallization layer 332 in the interconnection region 314. Thus, the one or more recesses 702 may be formed over the one or more portions of a metallization layer 332.

In some implementations, a pattern in a photoresist layer is used to form the one or more recesses 702. In these implementations, the deposition tool 102 forms the photoresist layer over the semiconductor substrate of the device region 312. The exposure tool 104 exposes the photoresist layer to a radiation source to pattern the photoresist layer. The developer tool 106 develops and removes portions of the photoresist layer to expose the pattern. The etch tool 108 etches through the semiconductor substrate of the device region 312 and into a portion of the dielectric layer 330 of the interconnect region 314 to form the one or more recesses 702. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the one or more recesses 702 based on a pattern.

Figure 7C:
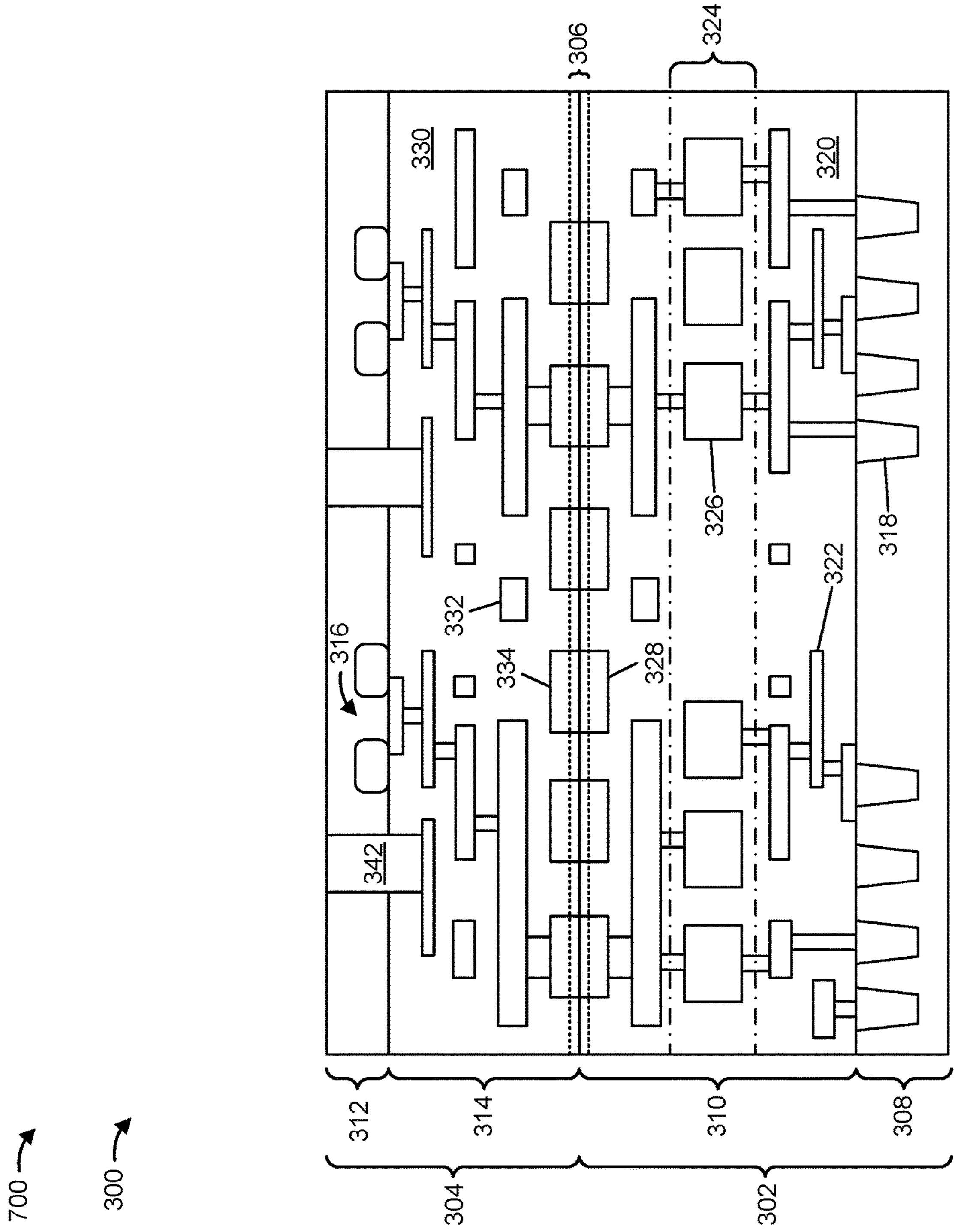

As shown in FIG. 7C, one or more BTSV structures 342 may be formed in the one or more recesses 702. In this way, the one or more BTSV structures 342 extend through the semiconductor substrate the device region 312 and into the interconnect region 314. The one or more BTSV structures 342 may be electrically connected and/or physically connected with the one or more portions of the metallization layer 332 that were exposed through the one or more recesses 702.

The deposition tool 102 and/or the plating tool 112 may deposit the one or more BTSV structures 342 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the one or more BTSV structures 342 after the one or more BTSV structures 342 are deposited.

Figure 7D:
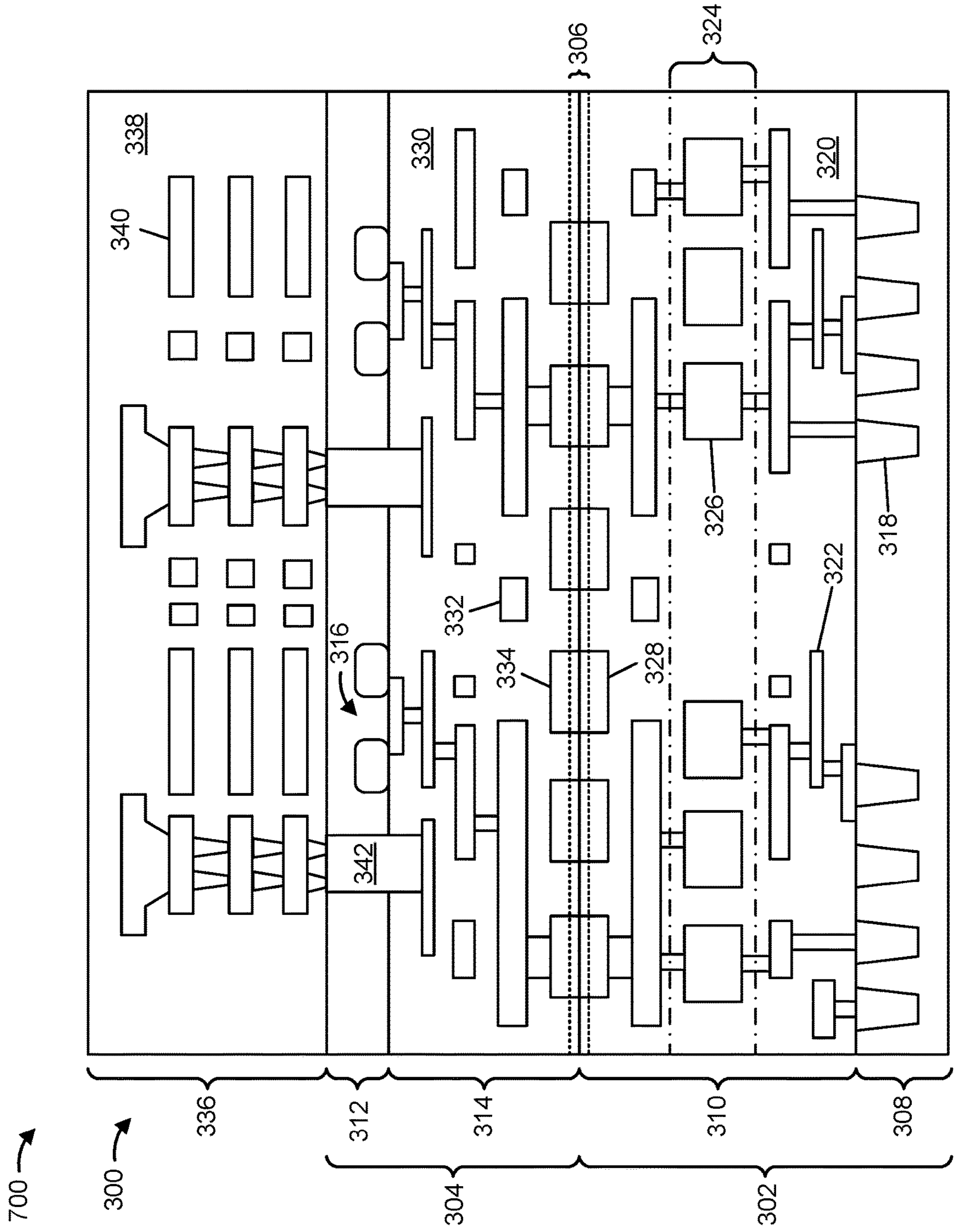

As shown in FIG. 7D, the redistribution structure 336 of the semiconductor die package 300 may be formed over the first semiconductor die 302. One or more of the semiconductor processing tools 102-114 may form the redistribution structure 336 by forming one or more dielectric layers 338 and forming a plurality of metallization layers 340 in the plurality of dielectric layers 338. For example, the deposition tool 102 may deposit a first layer of the one or more dielectric layers 338 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 340 in the recesses (e.g., using a CVD technique, an ALD technique, a PVD technique, an electroplating technique, and/or another type of deposition technique). At least a portion of the first metallization layer may be electrically connected and/or physically connected with the one or more BTSV structures 342. The deposition tool 102, the etch tool 108, the plating tool 112, and/or another semiconductor processing tool may continue to perform similar processing operations to forming the redistribution structure 336 until a sufficient or desired arrangement of metallization layers 340 is achieved.

Figure 7E:
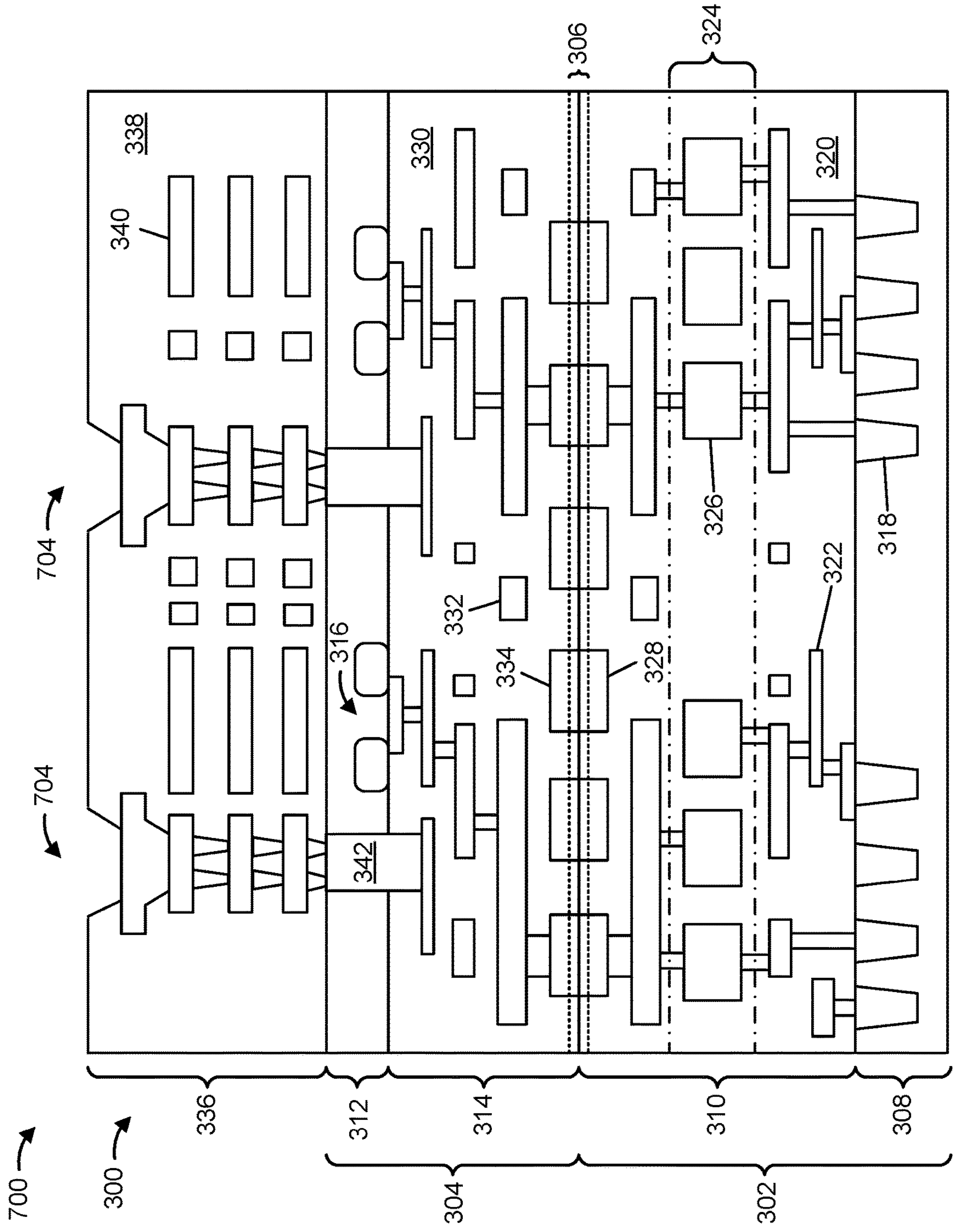

As shown in FIG. 7E, recesses 704 may be formed in the one or more dielectric layers 338. The recesses 704 may be formed to expose portions of a metallization layer 340 in the redistribution structure 336. Thus, the recesses 704 may be formed over the one or more portions of a metallization layer 340.

In some implementations, a pattern in a photoresist layer is used to form the recesses 704. In these implementations, the deposition tool 102 forms the photoresist layer on the one or more dielectric layers 338. The exposure tool 104 exposes the photoresist layer to a radiation source to pattern the photoresist layer. The developer tool 106 develops and removes portions of the photoresist layer to expose the pattern. The etch tool 108 etches into the one or more dielectric layers 338 to form the recesses 704. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 704 based on a pattern.

Figure 7F:
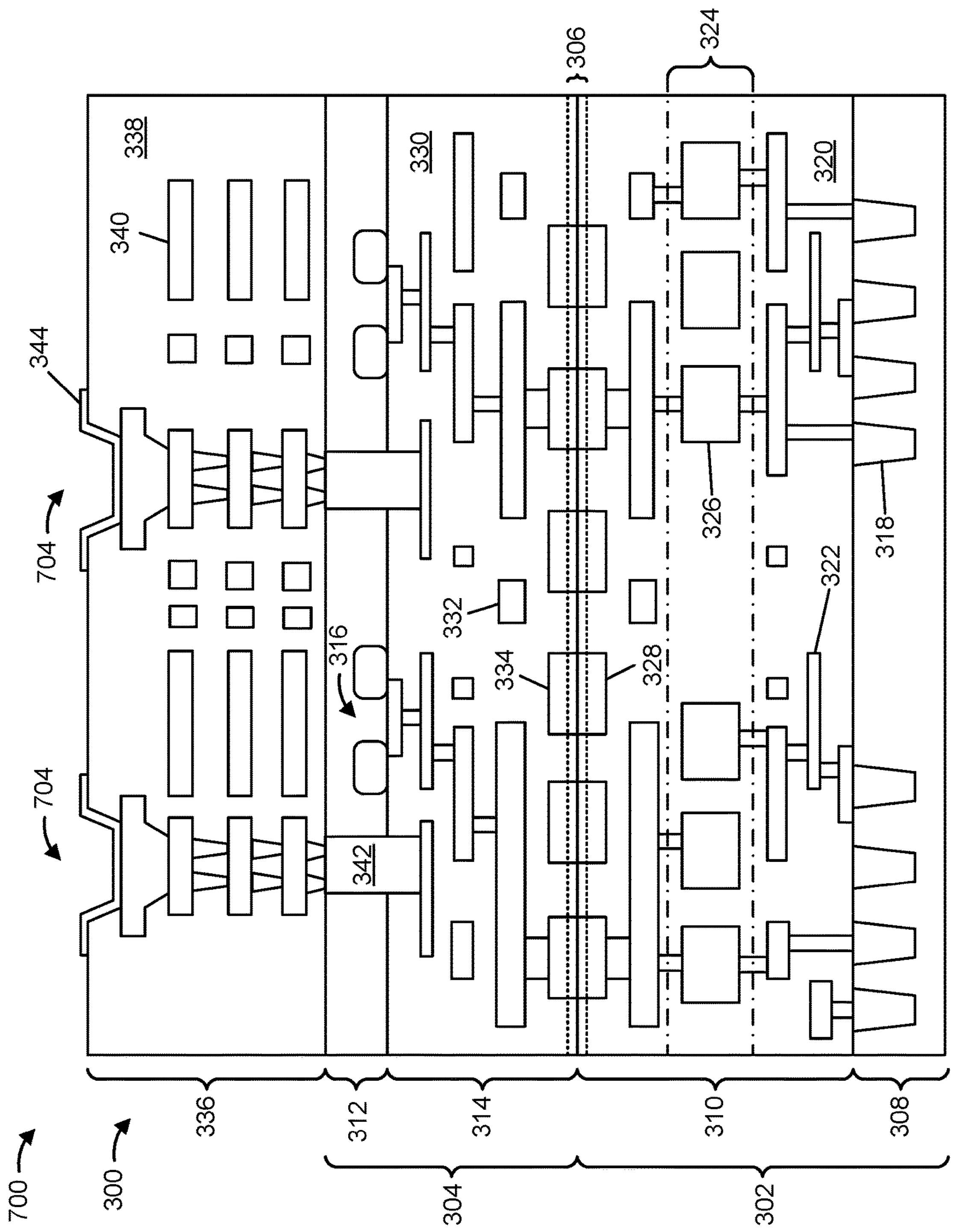

As shown in FIG. 7F, UBM layers 344 may be formed in the recesses 704. The deposition tool 102 and/or the plating tool 112 may deposit the UBM layers 344 using a CVD technique, a PVD technique, an ALD technique, an electroplating technique, another deposition technique described above in connection with FIG. 1, and/or a deposition technique other than as described above in connection with FIG. 1. In some implementations, a continuous layer of conductive material is deposited on the top surface of the redistribution structure 336, including in the recess 704. The continuous layer of conductive material is then patterned (e.g., by the deposition tool 102, the exposure tool 104, and the developer tool 106) to form a pattern on the continuous layer of the conductive material, and the etch tool 108 removes portions of the continuous layer of the conductive material based on the pattern. Remaining portions of the continuous layer of the conductive material may correspond to the UBM layers 344.

Figure 7G:
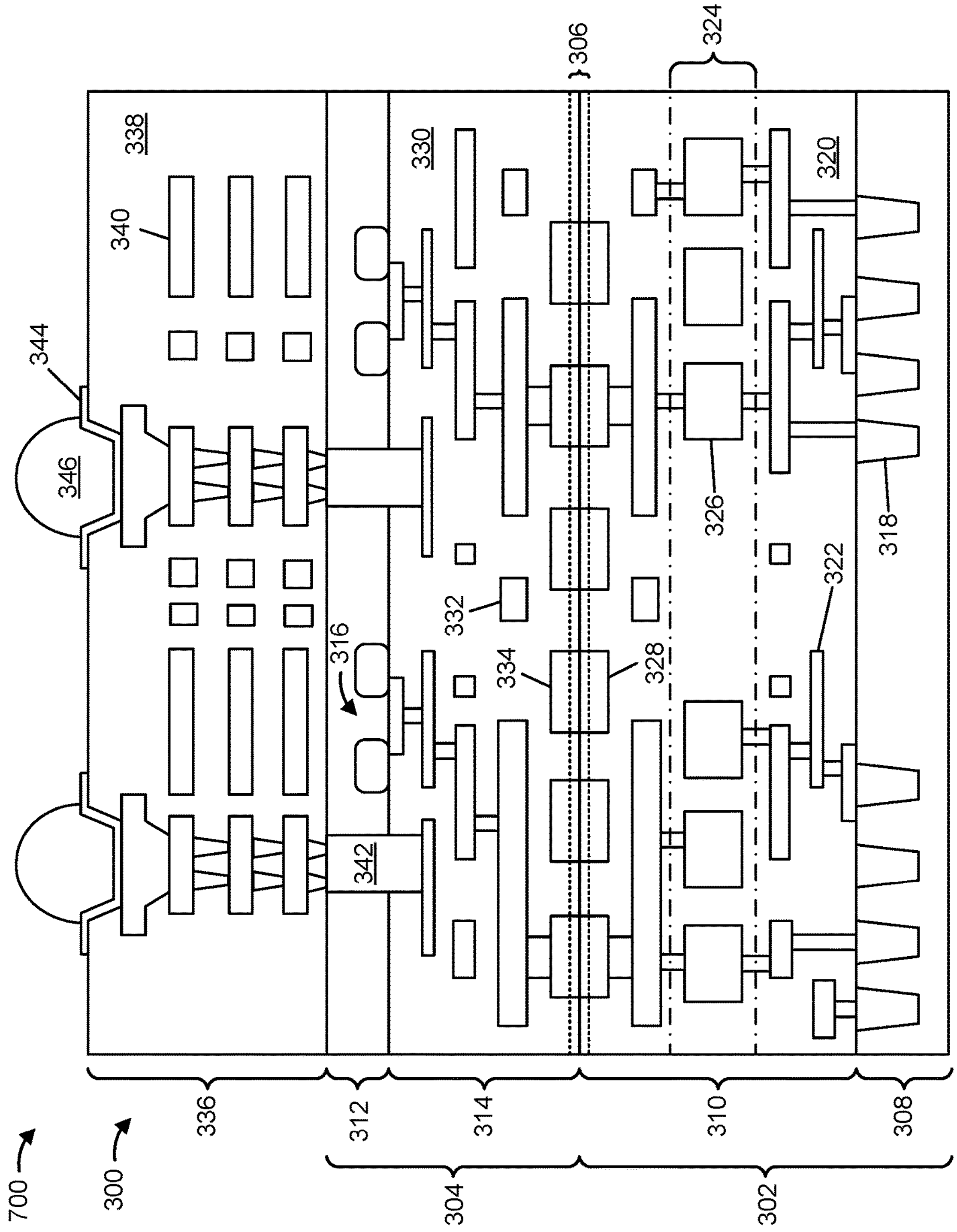

As shown in FIG. 7G, conductive terminals 346 may be formed in the recesses 704 over the UBM layers 344. In some implementations, the plating tool 112 forms the conductive terminals 346 using an electroplating technique. In some implementations, solder is dispensed in the recesses 704 to form the conductive terminals 346.

As indicated above, FIGS. 7A-7G are provided as an example. Other examples may differ from what is described with regard to FIGS. 7A-7G. As an example, the redistribution structure, the UBM layers 344, and the conductive terminals 346 may be formed over the device region 308 of the first semiconductor die 302 instead of being formed over the device region 312 of the second semiconductor die 304. In these implementations, the one or more BTSV structures 342 may be formed through the semiconductor substrate of the device region 312 and into a portion of the one or more dielectric layers 320 of the interconnect region 310. The one or more BTSV structures 342 may be electrically connected and/or physically connected to one or more of the metallization layers 322 in the interconnect region 310.

Figure 8:
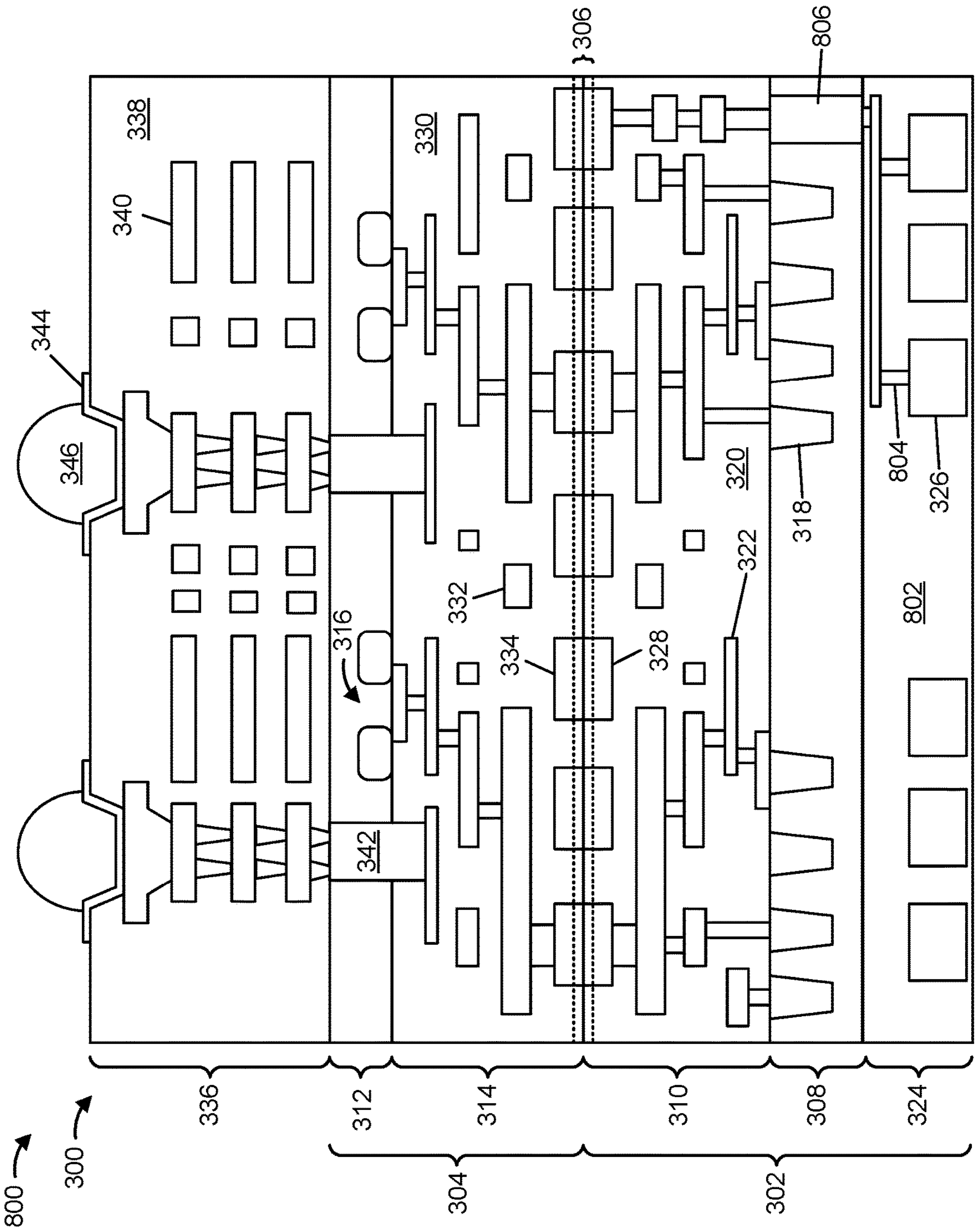
FIG. 8 is a diagram of an example implementation of the semiconductor die package described herein.

FIG. 8 is a diagram of an example implementation 800 of the semiconductor die package 300 described herein. As shown in FIG. 8, the example implementation 800 of the semiconductor die package 300 may include a similar arrangement of structures and/or layers as shown in the example implementation of FIG. 3A. However, in the example implementation 800 of the semiconductor die package 300 in FIG. 8, the semiconductor die package 300 includes the inductor region 324 on a back side of the first semiconductor die 302 as opposed to including the inductor region 324 in the interconnect region 310. The inductor region 324, and the inductor structure(s) 326 included in the inductor region 324, are included on a side of the device region 308 opposing the side of the device region 308 on which the interconnect region 310 is included.

As shown in FIG. 8, the inductor structure(s) 326 included in the inductor region 324 may be included in one or more dielectric layers 802. The inductor structure(s) 326 may be electrically connected and/or physically connected with one or more metallization layers 804 in the one or more dielectric layers 802. Moreover, the one or more metallization layers 804 may be electrically connected and/or physically connected with one or more TSV structures 806 that extend through the semiconductor substrate of the device region 308. The TSV structures 806 may be electrically connected and/or physically connected with one or more metallization layers 322 in the interconnect region 310. Accordingly, the inductor structure(s) 326 in the inductor region 324 may be electrically connected with the trench capacitor structure(s) 318 in the device region 308 by the one or more metallization layers 804, the one or more TSV structures 806, and the one or more metallization layers 322.

In an alternative implementation of the semiconductor die package 300 to the example implementation 800 shown in FIG. 8, the redistribution structure 336 is included over the inductor region 324 of the first semiconductor die 302 as opposed to being over the device region 312 of the second semiconductor die 304. The one or more BTSV structures 342 extend through the inductor region 324, through the semiconductor substrate of the device region 308, and into a portion of the interconnect region 310 to one or more metallization layers 322 as opposed to extending through the device region 312. Accordingly, the one or more BTSV structures 342 extend alongside or adjacent to one or more of the trench capacitor structures 318 in the device region 308, and/or alongside or adjacent to one or more inductor structures 326 included in the inductor region 324. This enables external connections to the semiconductor dies 302 and 304 to be made through the first semiconductor die 302 instead of (or in addition to) the second semiconductor die 304.

As indicated above, FIG. 8 is provided as an example. Other examples may differ from what is described with regard to FIG. 8.

FIGS. 9A-9F are diagrams of an example implementation 900 of forming a semiconductor die described herein. In some implementations, the example implementation 900 includes an example process for forming the example implementation 800 of the first semiconductor die 302 (or a portion thereof) described in connection with FIG. 8. In some implementations, one or more of the semiconductor processing tools 102-114 and/or the wafer/die transport tool 116 may perform one or more of the operations described in connection with the example implementation 900. In some implementations, one or more operations described in connection with the example implementation 900 may be performed by another semiconductor processing tool.

Figure 9A:
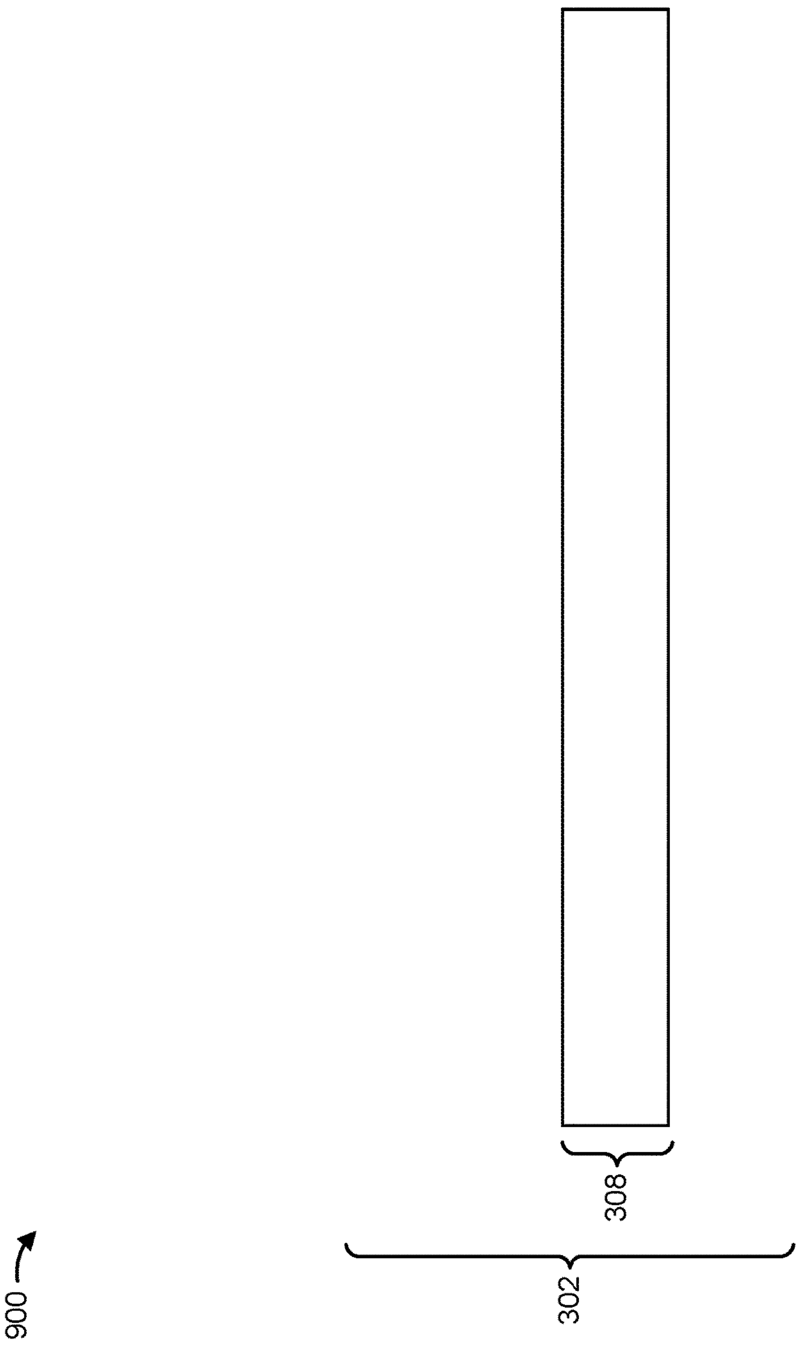
FIGS. 9A-9F are diagrams of an example implementation of forming a semiconductor die described herein.

Turning to FIG. 9A, one or more of the operations in the example implementation 900 may be performed in connection with the semiconductor substrate of the device region 308 of the first semiconductor die 302. The semiconductor substrate of the device region 308 may be provided in the form of a semiconductor wafer or another type of substrate.

Figure 9B:
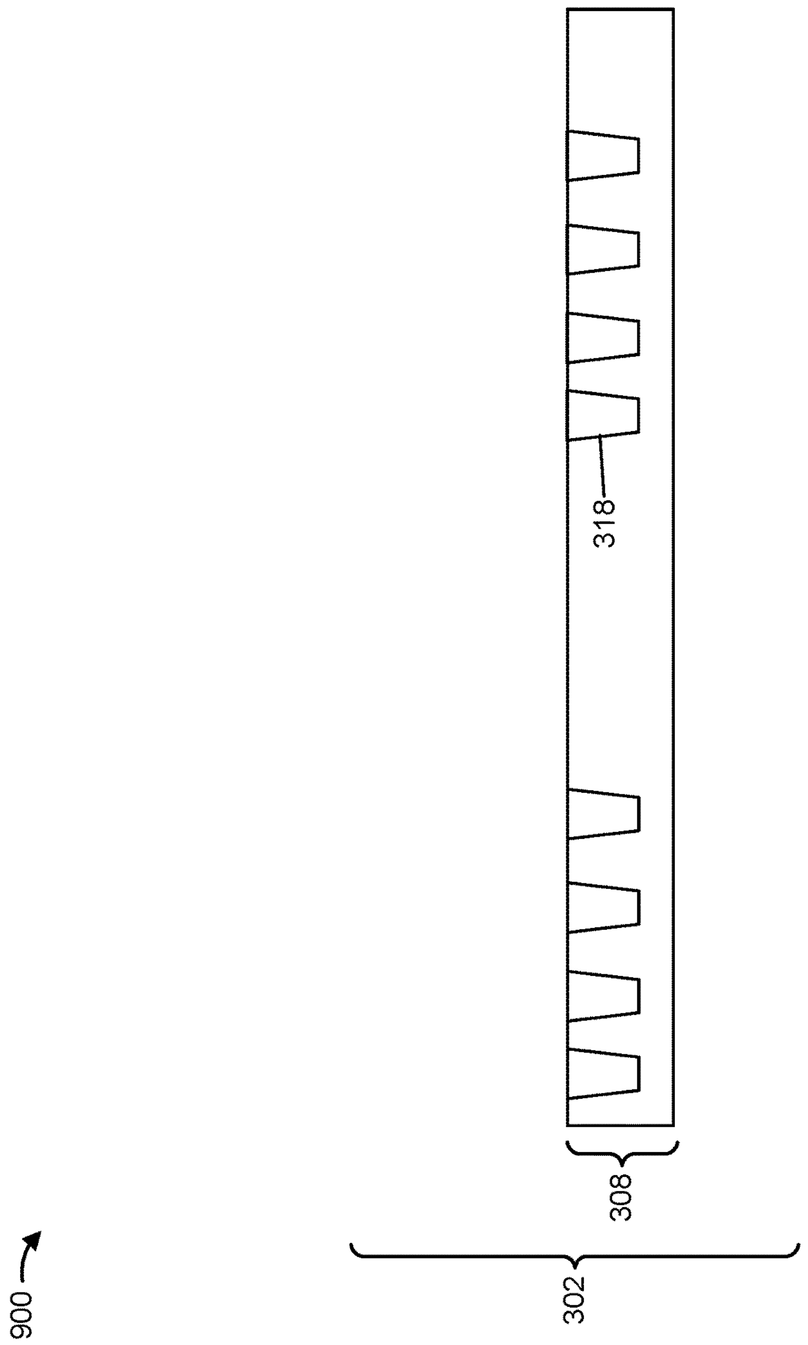

As shown in FIG. 9B, a plurality of trench capacitor structures 318 may be formed in the device region 308. To form a trench capacitor structure 318, a recess may be formed in the semiconductor substrate (e.g., the semiconductor substrate 402 from the surface 404) of the device region 308 using a pattern in a photoresist layer, a hard mask, and/or another type of masking layer. For example, the deposition tool 102 forms a photoresist layer over the semiconductor substrate of the device region 308. The exposure tool 104 exposes the photoresist layer to a radiation source to pattern the photoresist layer. The developer tool 106 develops and removes portions of the photoresist layer to expose the pattern. The etch tool 108 etches into the semiconductor substrate of the device region 308 to form the recess. The deposition tool 102 may perform a deposition operation (e.g., a CVD operation, a PVD operation, an ALD operation) to deposit a first conductive layer 406 in the recess such that the first conductive layer 406 conforms to the shape of the recess. The deposition tool 102 may perform a deposition operation (e.g., a CVD operation, a PVD operation, an ALD operation) to deposit a first dielectric layer 408 on the first conductive layer 406. The deposition tool 102 may perform a deposition operation (e.g., a CVD operation, a PVD operation, an ALD operation) to deposit a second conductive layer 406 on the first dielectric layer 408. The deposition tool 102 may perform a deposition operation (e.g., a CVD operation, a PVD operation, an ALD operation) to deposit a second dielectric layer 408 on the second conductive layer 406. The deposition tool 102 may perform subsequent deposition operations until a sufficient or desired quantity of deep trench capacitors are formed in the recess for the trench capacitor structure 318.

Figure 9C:
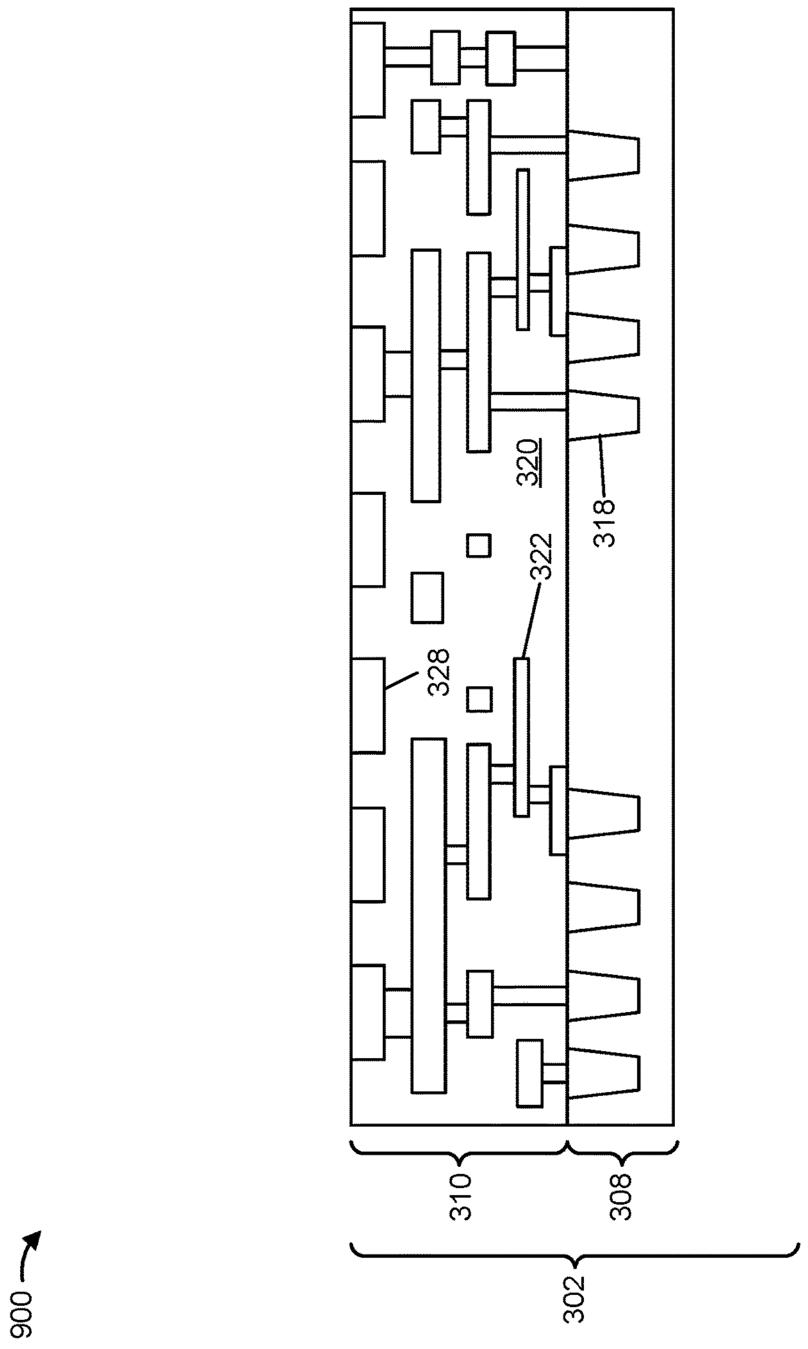

As shown in FIG. 9C, the interconnect region 310 of the first semiconductor die 302 may be formed over and/or on the semiconductor substrate of the device region 308. One or more of the semiconductor processing tools 102-114 may form the interconnect region 310 by forming one or more dielectric layers 320 and forming a plurality of metallization layers 322 in the plurality of dielectric layers 320. For example, the deposition tool 102 may deposit a first layer of the one or more dielectric layers 320 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 322 in the recesses (e.g., using a CVD technique, an ALD technique, a PVD technique, an electroplating technique, and/or another type of deposition technique). The deposition tool 102, the etch tool 108, the plating tool 112, and/or another semiconductor processing tool may continue to perform similar processing operations to forming the interconnect region 310 until a sufficient or desired arrangement of metallization layers 322 is achieved.

As further shown in FIG. 9C, one or more of the semiconductor processing tools 102-114 may form another layer of the one or more dielectric layers 320, and may form a plurality of contacts 328 in the layer such that the contacts 328 are electrically connected and/or physically connected with one or more of the metallization layers 322. For example, the deposition tool 102 may deposit the layer of the one or more dielectric layers 320 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 328 in the recesses (e.g., using a CVD technique, an ALD technique, a PVD technique, an electroplating technique, and/or another type of deposition technique).

Figure 9D:
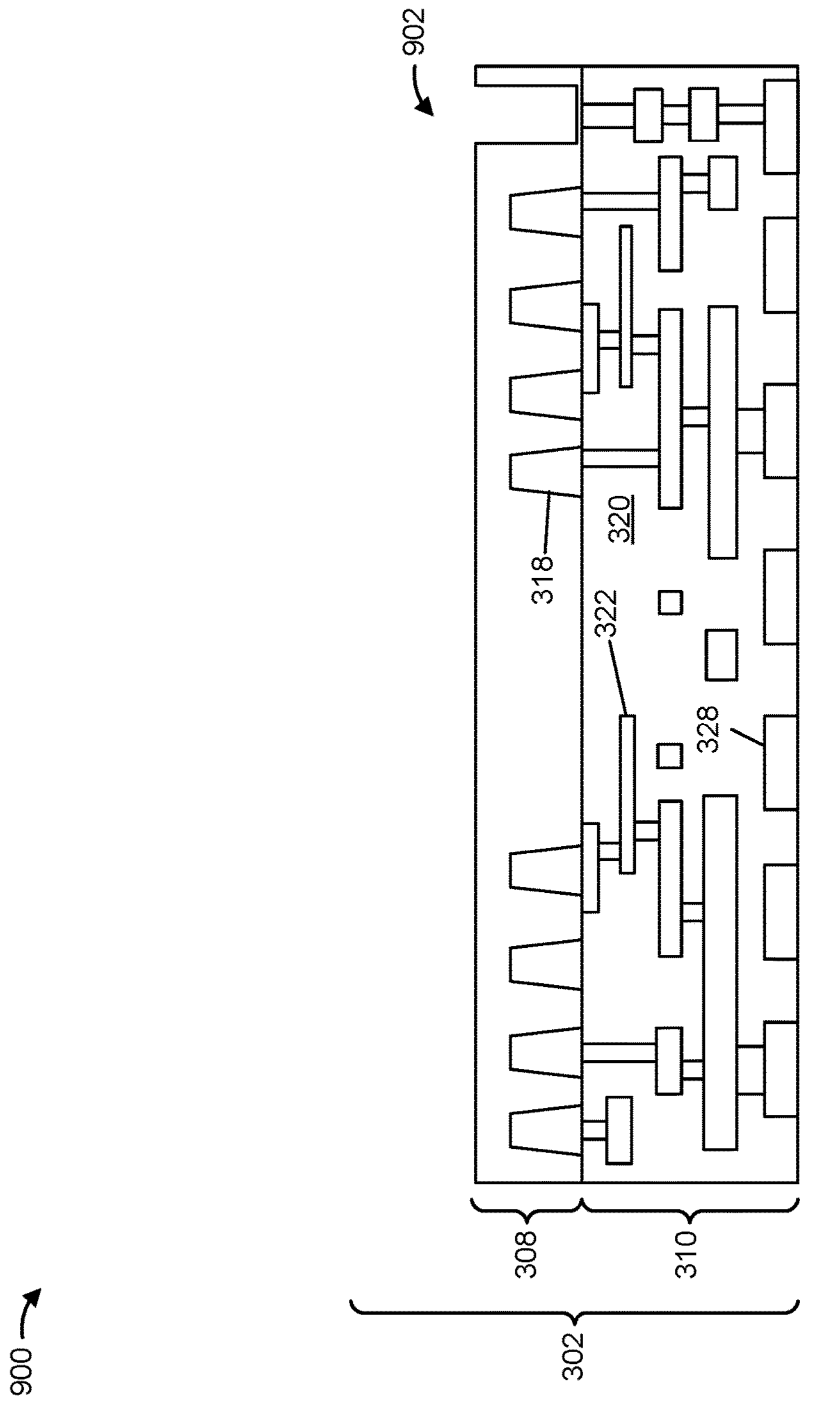

As shown in FIG. 9D, one or more recesses 902 may be formed in a back side of the device region 308. In some implementations, a pattern in a photoresist layer is used to form the one or more recesses 902. In these implementations, the deposition tool 102 forms the photoresist layer over the back side surface of the semiconductor substrate of the device region 308. The exposure tool 104 exposes the photoresist layer to a radiation source to pattern the photoresist layer. The developer tool 106 develops and removes portions of the photoresist layer to expose the pattern. The etch tool 108 etches through the semiconductor substrate of the device region 308 from the back side surface of the semiconductor substrate to form the one or more recesses 902. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the one or more recesses 902 based on a pattern.

Figure 9E:
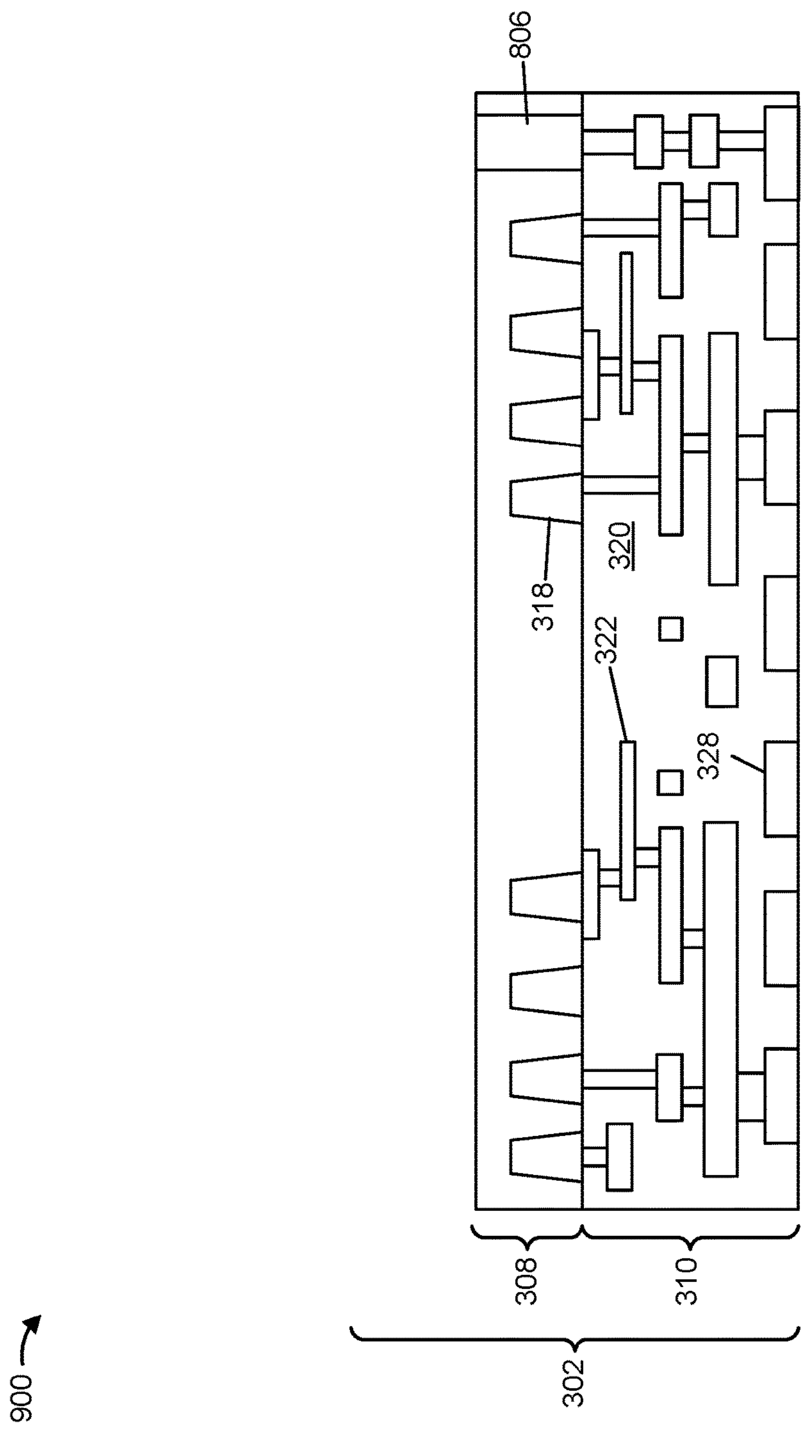

As shown in FIG. 9E, one or more TSV structures 806 may be formed in the or more recesses 902. The deposition tool 102 and/or the plating tool 112 may form the one or more TSV structures 806 in the recesses 902 using a CVD technique, an ALD technique, a PVD technique, an electroplating technique, and/or another type of deposition technique.

Figure 9F:
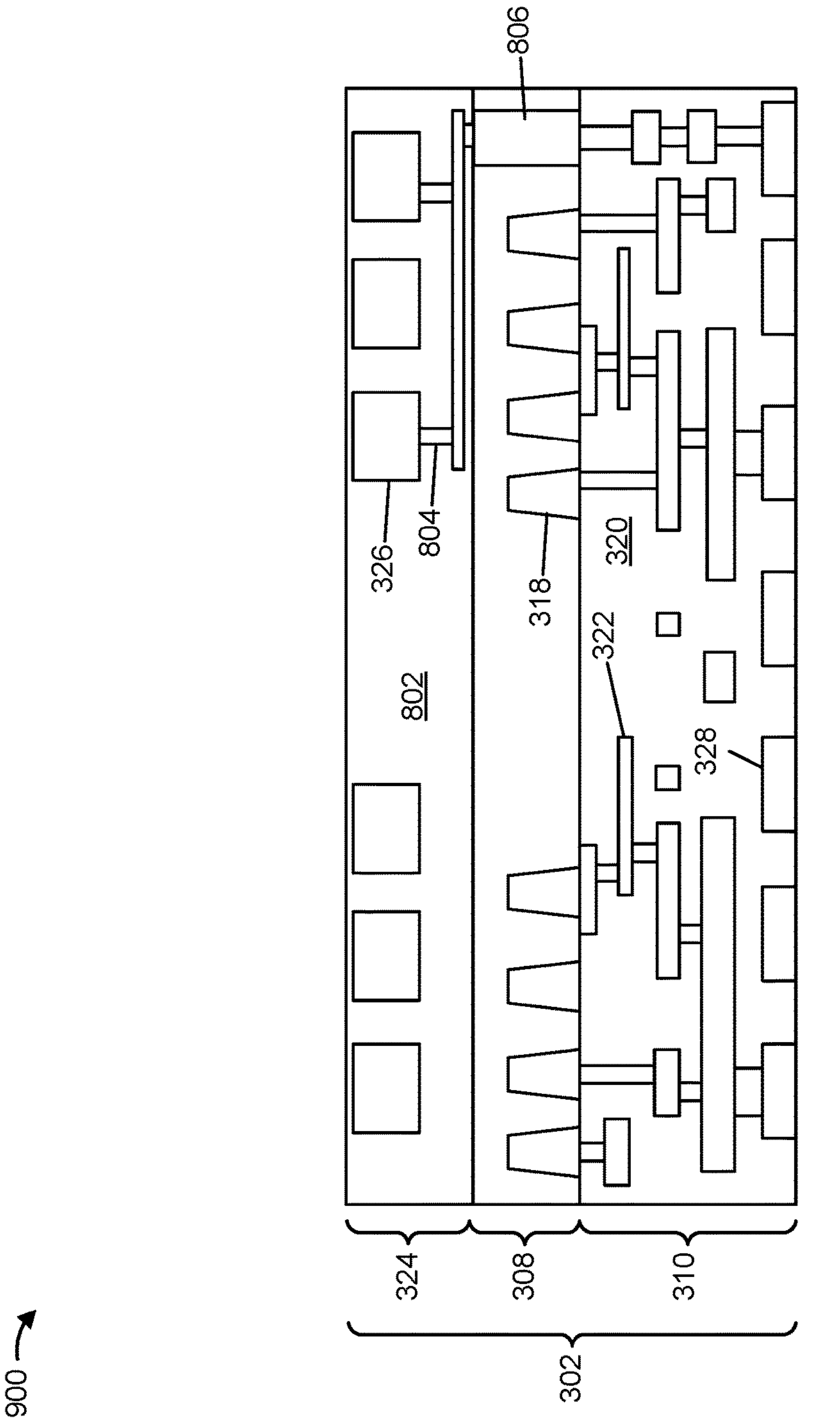

As shown in FIG. 9F, an inductor region 324 may be formed over the back side of the device region 308 of the first semiconductor die 302. Forming the inductor region 324 may include forming one or more dielectric layers 802 over the back side surface of the device region 308, forming one or more metallization layers 804 in the one or more dielectric layers 802, and forming one or more inductor structures 326 in the one or more dielectric layers 802 over the one or more metallization layers 804. The one or more inductor structures 326 may be electrically connected and/or physically connected with the one or more of the metallization layers 804, and the one or more metallization layers 804 may be electrically connected and/or physically connected with the one or more TSV structures 806.

As indicated above, FIGS. 9A-9F are provided as an example. Other examples may differ from what is described with regard to FIGS. 9A-9F.

Figure 10:
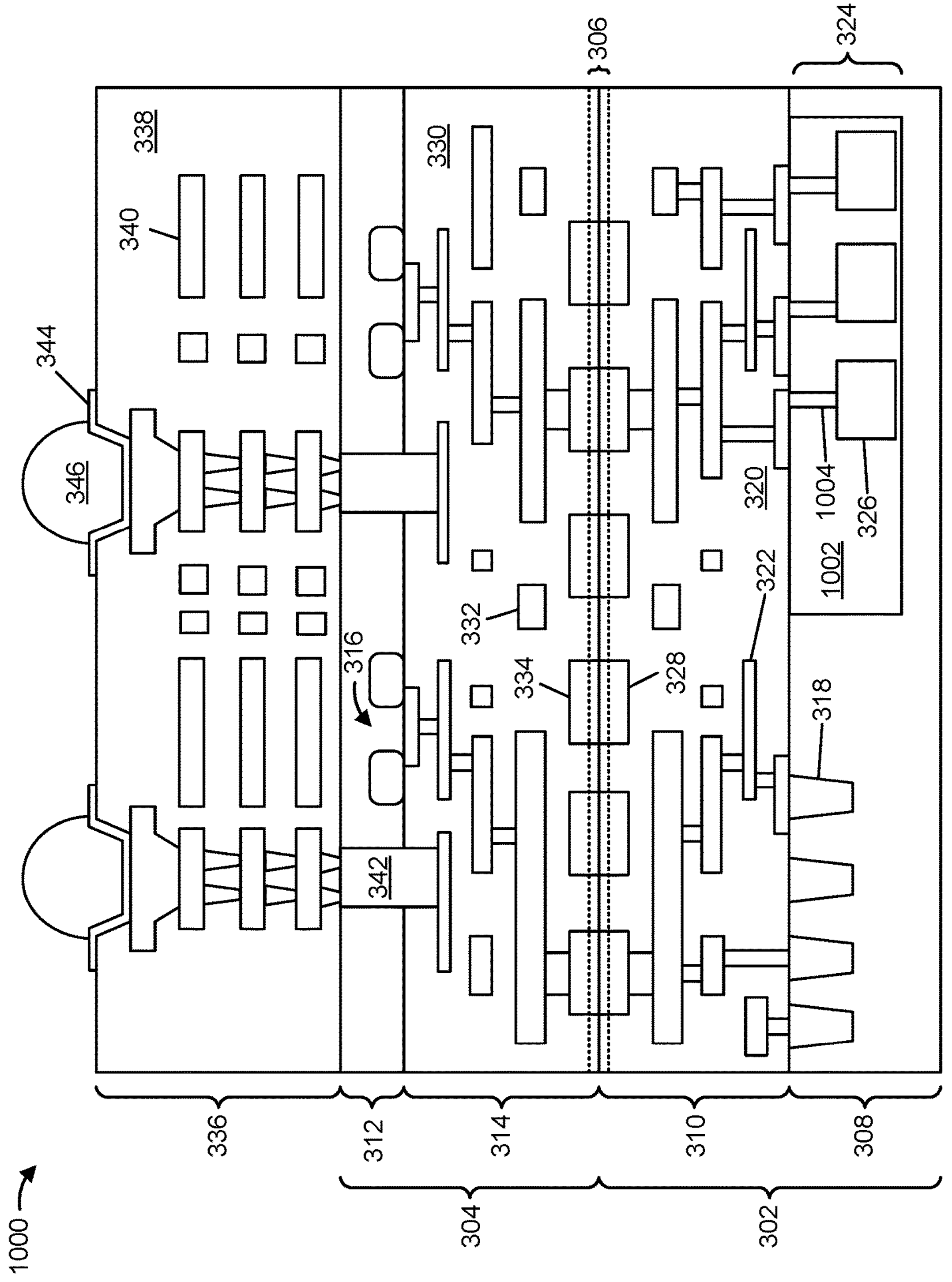
FIG. 10 is a diagram of an example implementation of the semiconductor die package described herein.

FIG. 10 is a diagram of an example implementation 1000 of the semiconductor die package 300 described herein. As shown in FIG. 10, the example implementation 1000 of the semiconductor die package 300 may include a similar arrangement of structures and/or layers as shown in the example implementation of FIG. 3A. However, in the example implementation 1000 of the semiconductor die package 300 in FIG. 10, the semiconductor die package 300 includes the inductor region 324 in a portion of the device region 308 as opposed to including the inductor region 324 in the interconnect region 310. The inductor region 324 may be horizontally adjacent with the trench capacitor structure (s) 318 in the device region 308, may be vertically adjacent with the trench capacitor structure(s) 318 in the device region 308, and/or may be located in another positional relationship to the trench capacitor structure(s) 318 in the device region 308.

As shown in FIG. 10, the inductor structure(s) 326 included in the inductor region 324 may be included in one or more dielectric layers 1002. The one or more dielectric layers 1002 may be formed in a recess in the semiconductor substrate of the device region 308 such that the semiconductor substrate of the device region 308 surrounds the one or more dielectric layers 1002. The inductor structure(s) 326 may be electrically connected and/or physically connected with one or more metallization layers 1004 in the one or more dielectric layers 1002. Moreover, the one or more metallization layers 1004 may be electrically connected and/or physically connected with one or more metallization layers 322 in the interconnect region 310. Accordingly, the inductor structure(s) 326 in the inductor region 324 may be electrically connected with the trench capacitor structure(s) 318 in the device region 308 by the one or more metallization layers 1004 and the one or more metallization layers 322.

In an alternative implementation of the semiconductor die package 300 to the example implementation 1000 shown in FIG. 10, the redistribution structure 336 is included over the device region 308 of the first semiconductor die 302 as opposed to being over the device region 312 of the second semiconductor die 304. The one or more BTSV structures 342 extend through the inductor region 324 in the device region 308 and/or through the semiconductor substrate of the device region 308. The one or more BTSV structures 342 may extend into a portion of the interconnect region 310 to one or more metallization layers 322 as opposed to extending through the device region 312. Accordingly, the one or more BTSV structures 342 extend alongside or adjacent to one or more of the trench capacitor structures 318 in the device region 308, and/or alongside or adjacent to one or more inductor structures 326 included in the inductor region 324. This enables external connections to the semiconductor dies 302 and 304 to be made through the first semiconductor die 302 instead of (or in addition to) the second semiconductor die 304.

As indicated above, FIG. 10 is provided as an example. Other examples may differ from what is described with regard to FIG. 10.

FIGS. 11A-11F are diagrams of an example implementation 1100 of forming a semiconductor die described herein. In some implementations, the example implementation 1100 includes an example process for forming the example implementation 1000 of the first semiconductor die 302 (or a portion thereof) described in connection with FIG. 10. In some implementations, one or more of the semiconductor processing tools 102-114 and/or the wafer/die transport tool 116 may perform one or more of the operations described in connection with the example implementation 1100. In some implementations, one or more operations described in connection with the example implementation 1100 may be performed by another semiconductor processing tool.

Figure 11A:
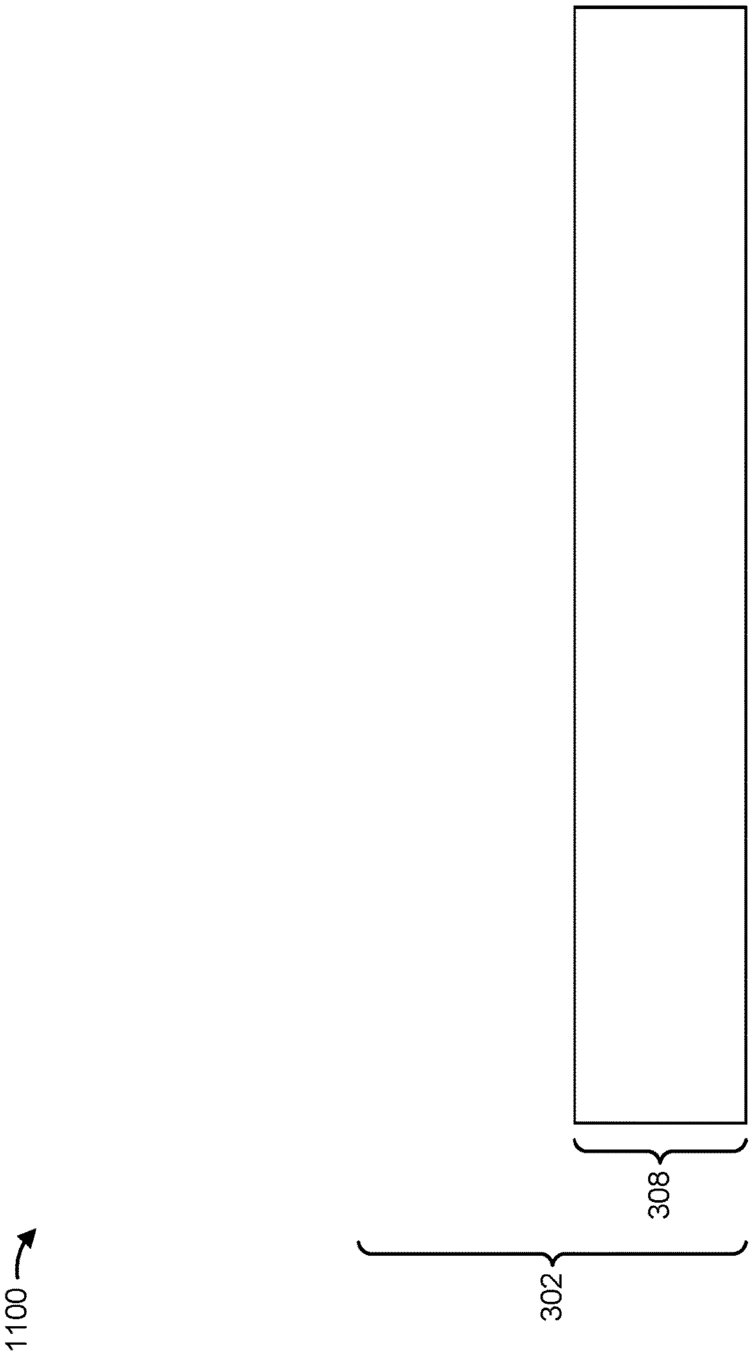
FIGS. 11A-11F are diagrams of an example implementation of forming a semiconductor die described herein.

Turning to FIG. 11A, one or more of the operations in the example implementation 1100 may be performed in connection with the semiconductor substrate of the device region 308 of the first semiconductor die 302. The semiconductor substrate of the device region 308 may be provided in the form of a semiconductor wafer or another type of substrate.

Figure 11B:
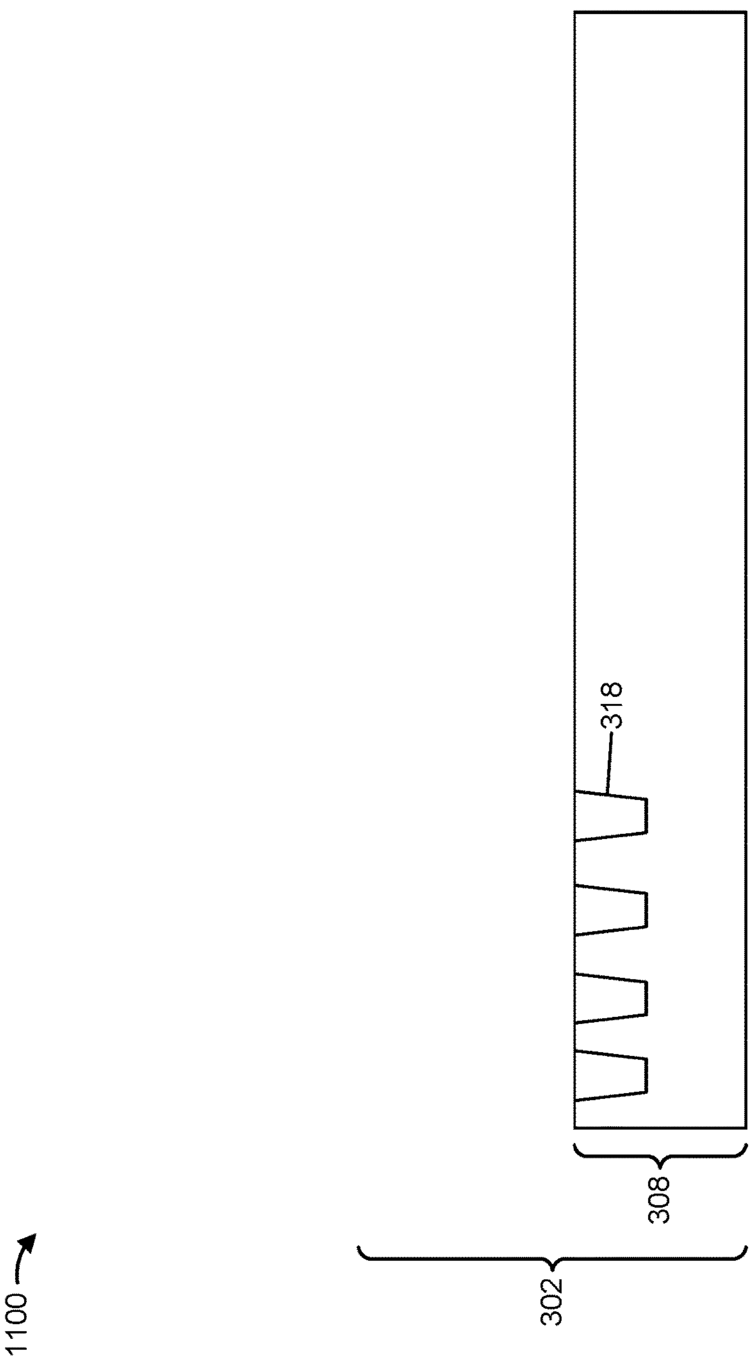

As shown in FIG. 11B, a plurality of trench capacitor structures 318 may be formed in the device region 308. To form a trench capacitor structure 318, a recess may be formed in the semiconductor substrate (e.g., the semiconductor substrate 402 from the surface 404) of the device region 308 using a pattern in a photoresist layer, a hard mask, and/or another type of masking layer. For example, the deposition tool 102 forms a photoresist layer over the semiconductor substrate of the device region 308. The exposure tool 104 exposes the photoresist layer to a radiation source to pattern the photoresist layer. The developer tool 106 develops and removes portions of the photoresist layer to expose the pattern. The etch tool 108 etches into the semiconductor substrate of the device region 308 to form the recess. The deposition tool 102 may perform a deposition operation (e.g., a CVD operation, a PVD operation, an ALD operation) to deposit a first conductive layer 406 in the recess such that the first conductive layer 406 conforms to the shape of the recess. The deposition tool 102 may perform a deposition operation (e.g., a CVD operation, a PVD operation, an ALD operation) to deposit a first dielectric layer 408 on the first conductive layer 406. The deposition tool 102 may perform a deposition operation (e.g., a CVD operation, a PVD operation, an ALD operation) to deposit a second conductive layer 406 on the first dielectric layer 408. The deposition tool 102 may perform a deposition operation (e.g., a CVD operation, a PVD operation, an ALD operation) to deposit a second dielectric layer 408 on the second conductive layer 406. The deposition tool 102 may perform subsequent deposition operations until a sufficient or desired quantity of deep trench capacitors are formed in the recess for the trench capacitor structure 318.

Figure 11C:
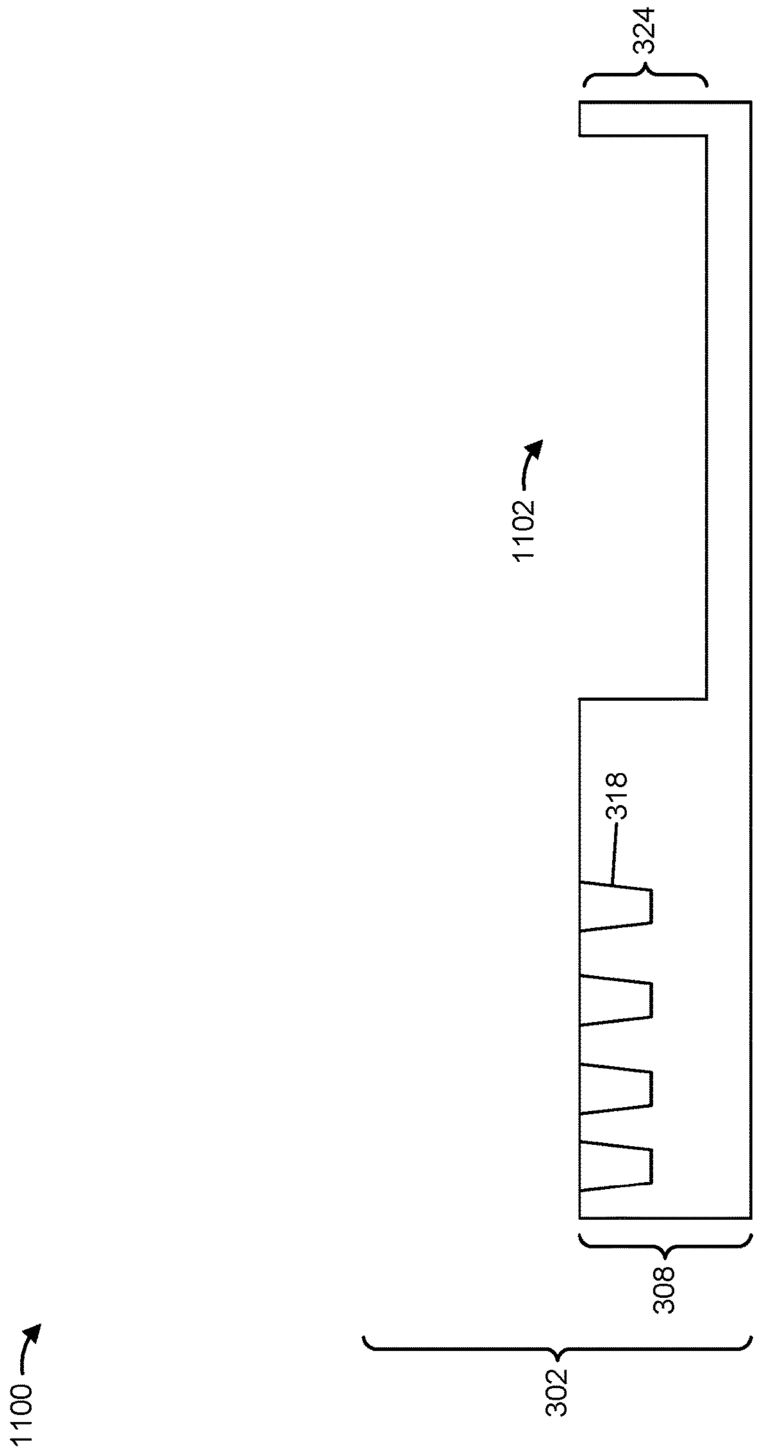

As shown in FIG. 11C a recess 1102 may be formed in a front side of the device region 308. In some implementations, a pattern in a photoresist layer is used to form the recess 1102. In these implementations, the deposition tool 102 forms the photoresist layer over the front side surface of the semiconductor substrate of the device region 308. The exposure tool 104 exposes the photoresist layer to a radiation source to pattern the photoresist layer. The developer tool 106 develops and removes portions of the photoresist layer to expose the pattern. The etch tool 108 etches into a portion of the semiconductor substrate of the device region 308 from the front side surface of the semiconductor substrate to form the recess 1102. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess 1102 based on a pattern.

Figure 11D:
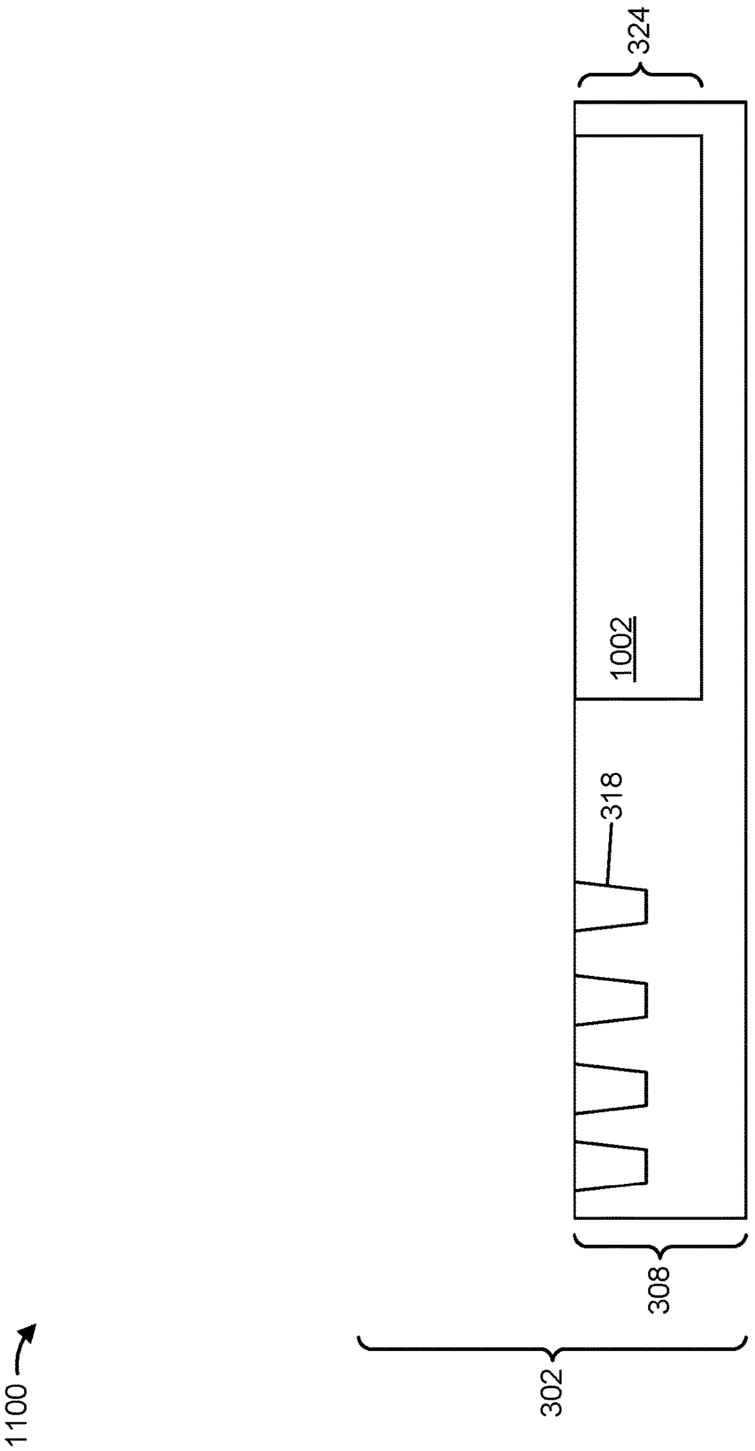
Figure 11E:
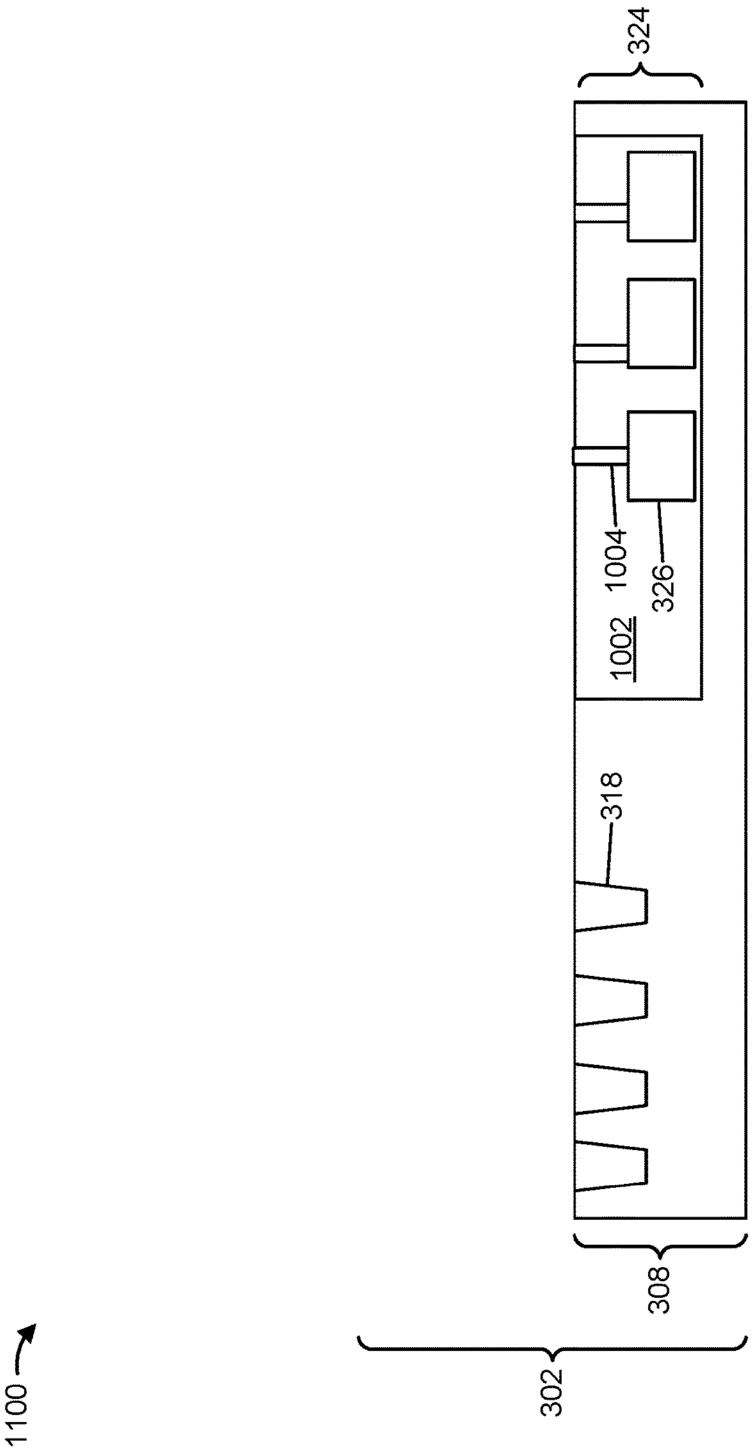

As shown in FIGS. 11D and 11E, an inductor region 324 may be formed in the recess 1102. Forming the inductor region 324 may include forming one or more dielectric layers 1002 in the recess 1102, as shown in FIG. 11D. The deposition tool 102 may deposit the one or more dielectric layers 1002 using a CVD technique, an ALD technique, a PVD technique, and/or another type of deposition technique.

As shown in FIG. 11E, forming the inductor region 324 may include forming one or more inductor structures 326 in the one or more dielectric layers 1002, and forming one or more metallization layers 1004 over the one or more inductor structures 326 in the one or more dielectric layers 1002. The one or more inductor structures 326 may be electrically connected and/or physically connected with the one or more of the metallization layers 1004.

Figure 11F:
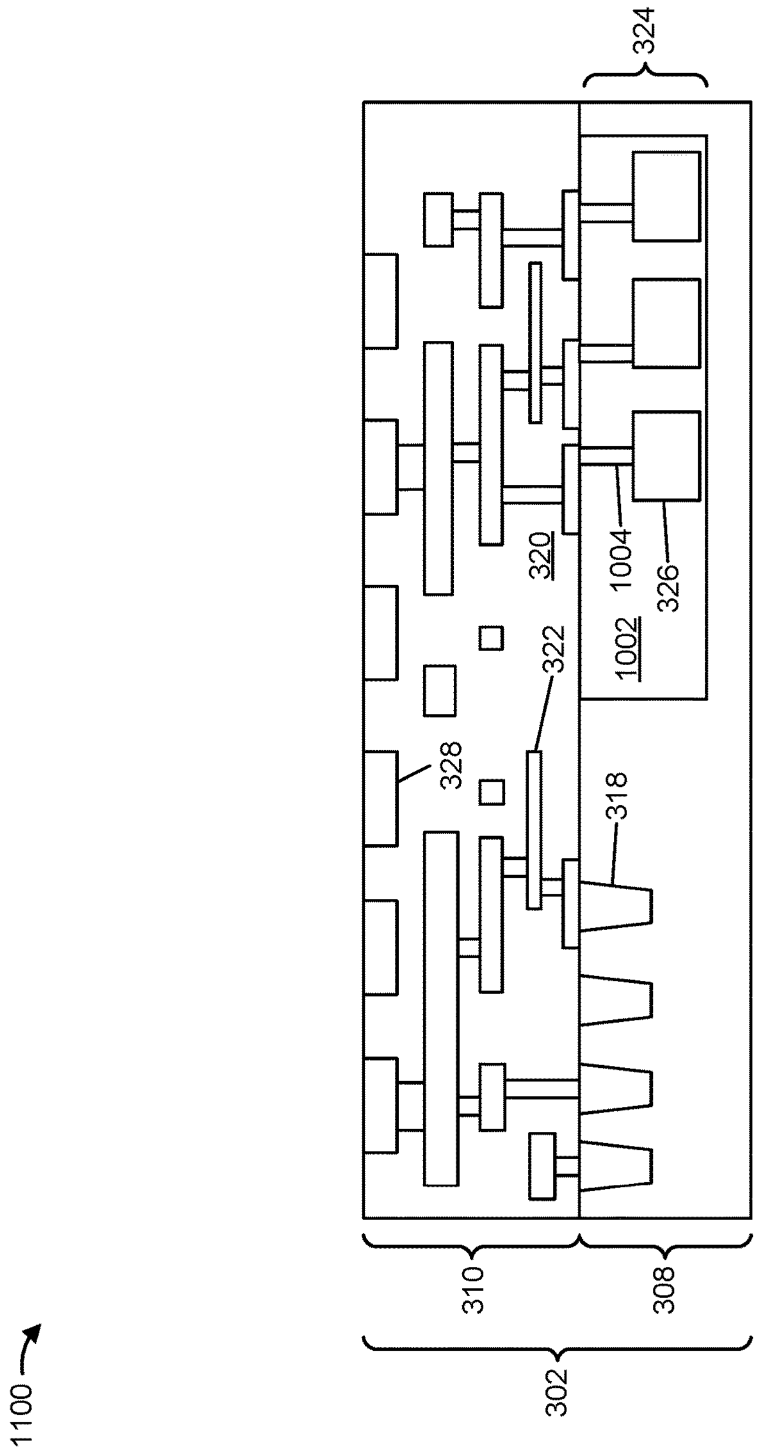

As shown in FIG. 11F, the interconnect region 310 of the first semiconductor die 302 may be formed over and/or on the semiconductor substrate of the device region 308. One or more of the semiconductor processing tools 102-114 may form the interconnect region 310 by forming one or more dielectric layers 320 and forming a plurality of metallization layers 322 in the plurality of dielectric layers 320. For example, the deposition tool 102 may deposit a first layer of the one or more dielectric layers 320 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 322 in the recesses (e.g., using a CVD technique, an ALD technique, a PVD technique, an electroplating technique, and/or another type of deposition technique). The deposition tool 102, the etch tool 108, the plating tool 112, and/or another semiconductor processing tool may continue to perform similar processing operations to forming the interconnect region 310 until a sufficient or desired arrangement of metallization layers 322 is achieved.

As further shown in FIG. 11F, one or more of the semiconductor processing tools 102-114 may form another layer of the one or more dielectric layers 320, and may form a plurality of contacts 328 in the layer such that the contacts 328 are electrically connected and/or physically connected with one or more of the metallization layers 322. For example, the deposition tool 102 may deposit the layer of the one or more dielectric layers 320 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 328 in the recesses (e.g., using a CVD technique, an ALD technique, a PVD technique, an electroplating technique, and/or another type of deposition technique).

As indicated above, FIGS. 11A-11F are provided as an example. Other examples may differ from what is described with regard to FIGS. 11A-11F.

Figure 12:
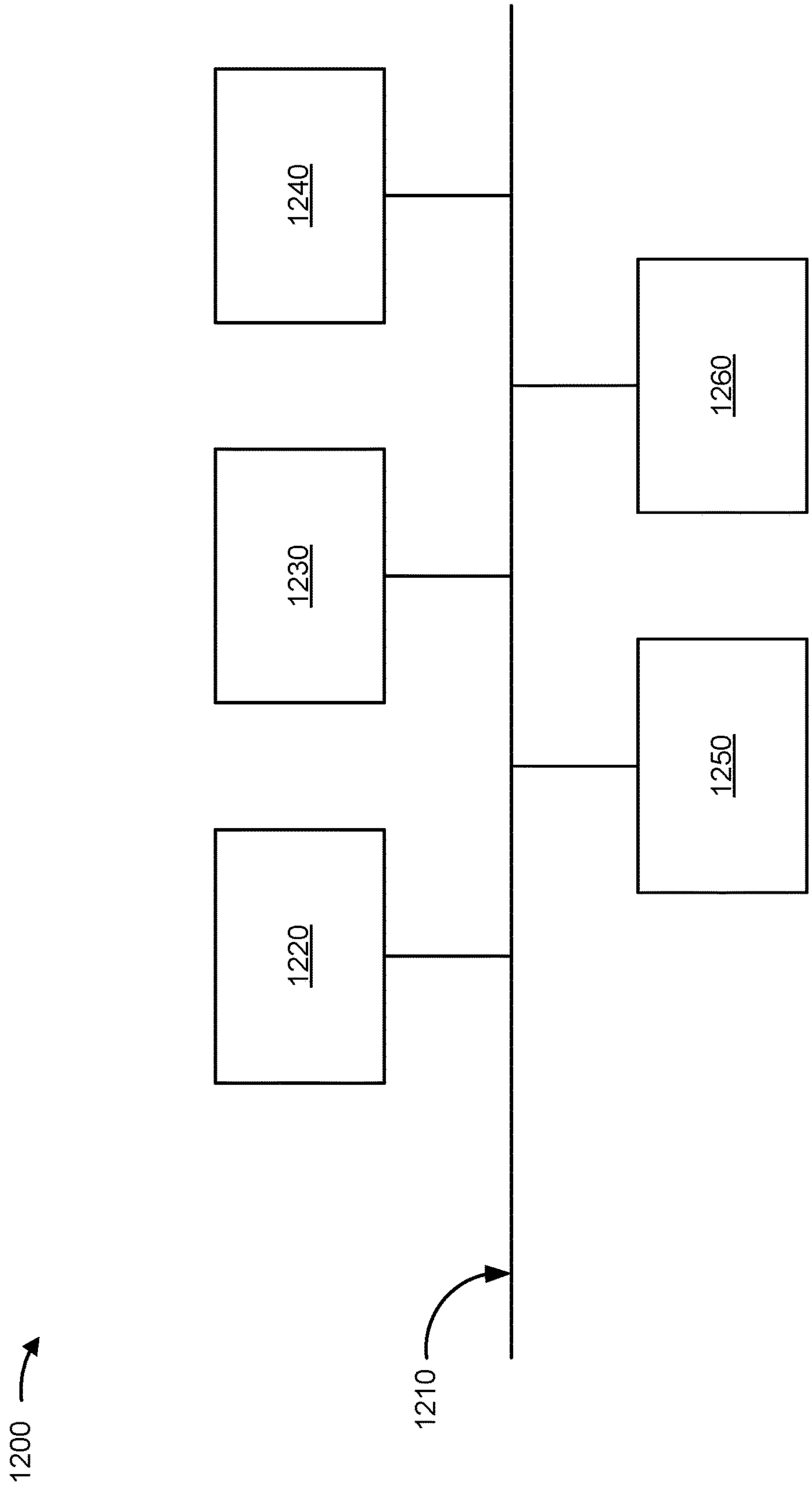
FIG. 12 is a diagram of example components of a device described herein.

FIG. 12 is a diagram of example components of a device 1200 described herein. In some implementations, one or more of the semiconductor processing tools 102-114 and/or the wafer/die transport tool 116 may include one or more devices 1200 and/or one or more components of the device 1200. As shown in FIG. 12, the device 1200 may include a bus 1210, a processor 1220, a memory 1230, an input component 1240, an output component 1250, and/or a communication component 1260.

The bus 1210 may include one or more components that enable wired and/or wireless communication among the components of the device 1200. The bus 1210 may couple together two or more components of FIG. 12, such as via operative coupling, communicative coupling, electronic coupling, and/or electric coupling. For example, the bus 1210 may include an electrical connection (e.g., a wire, a trace, and/or a lead) and/or a wireless bus. The processor 1220 may include a central processing unit, a graphics processing unit, a microprocessor, a controller, a microcontroller, a digital signal processor, a field-programmable gate array, an application-specific integrated circuit, and/or another type of processing component. The processor 1220 may be implemented in hardware, firmware, or a combination of hardware and software. In some implementations, the processor 1220 may include one or more processors capable of being programmed to perform one or more operations or processes described elsewhere herein.

The memory 1230 may include volatile and/or nonvolatile memory. For example, the memory 1230 may include random access memory (RAM), read only memory (ROM), a hard disk drive, and/or another type of memory (e.g., a flash memory, a magnetic memory, and/or an optical memory). The memory 1230 may include internal memory (e.g., RAM, ROM, or a hard disk drive) and/or removable memory (e.g., removable via a universal serial bus connection).

The memory 1230 may be a non-transitory computer-readable medium. The memory 1230 may store information, one or more instructions, and/or software (e.g., one or more software applications) related to the operation of the device 1200. In some implementations, the memory 1230 may include one or more memories that are coupled (e.g., communicatively coupled) to one or more processors (e.g., processor 1220), such as via the bus 1210. Communicative coupling between a processor 1220 and a memory 1230 may enable the processor 1220 to read and/or process information stored in the memory 1230 and/or to store information in the memory 1230.

The input component 1240 may enable the device 1200 to receive input, such as user input and/or sensed input. For example, the input component 1240 may include a touch screen, a keyboard, a keypad, a mouse, a button, a microphone, a switch, a sensor, a global positioning system sensor, an accelerometer, a gyroscope, and/or an actuator. The output component 1250 may enable the device 1200 to provide output, such as via a display, a speaker, and/or a light-emitting diode. The communication component 1260 may enable the device 1200 to communicate with other devices via a wired connection and/or a wireless connection. For example, the communication component 1260 may include a receiver, a transmitter, a transceiver, a modem, a network interface card, and/or an antenna.

The device 1200 may perform one or more operations or processes described herein. For example, a non-transitory computer-readable medium (e.g., memory 1230) may store a set of instructions (e.g., one or more instructions or code) for execution by the processor 1220. The processor 1220 may execute the set of instructions to perform one or more operations or processes described herein. In some implementations, execution of the set of instructions, by one or more processors 1220, causes the one or more processors 1220 and/or the device 1200 to perform one or more operations or processes described herein. In some implementations, hardwired circuitry may be used instead of or in combination with the instructions to perform one or more operations or processes described herein. Additionally, or alternatively, the processor 1220 may be configured to perform one or more operations or processes described herein. Thus, implementations described herein are not limited to any specific combination of hardware circuitry and software.

The number and arrangement of components shown in FIG. 12 are provided as an example. The device 1200 may include additional components, fewer components, different components, or differently arranged components than those shown in FIG. 12. Additionally, or alternatively, a set of components (e.g., one or more components) of the device 1200 may perform one or more functions described as being performed by another set of components of the device 1200.

Figure 13:
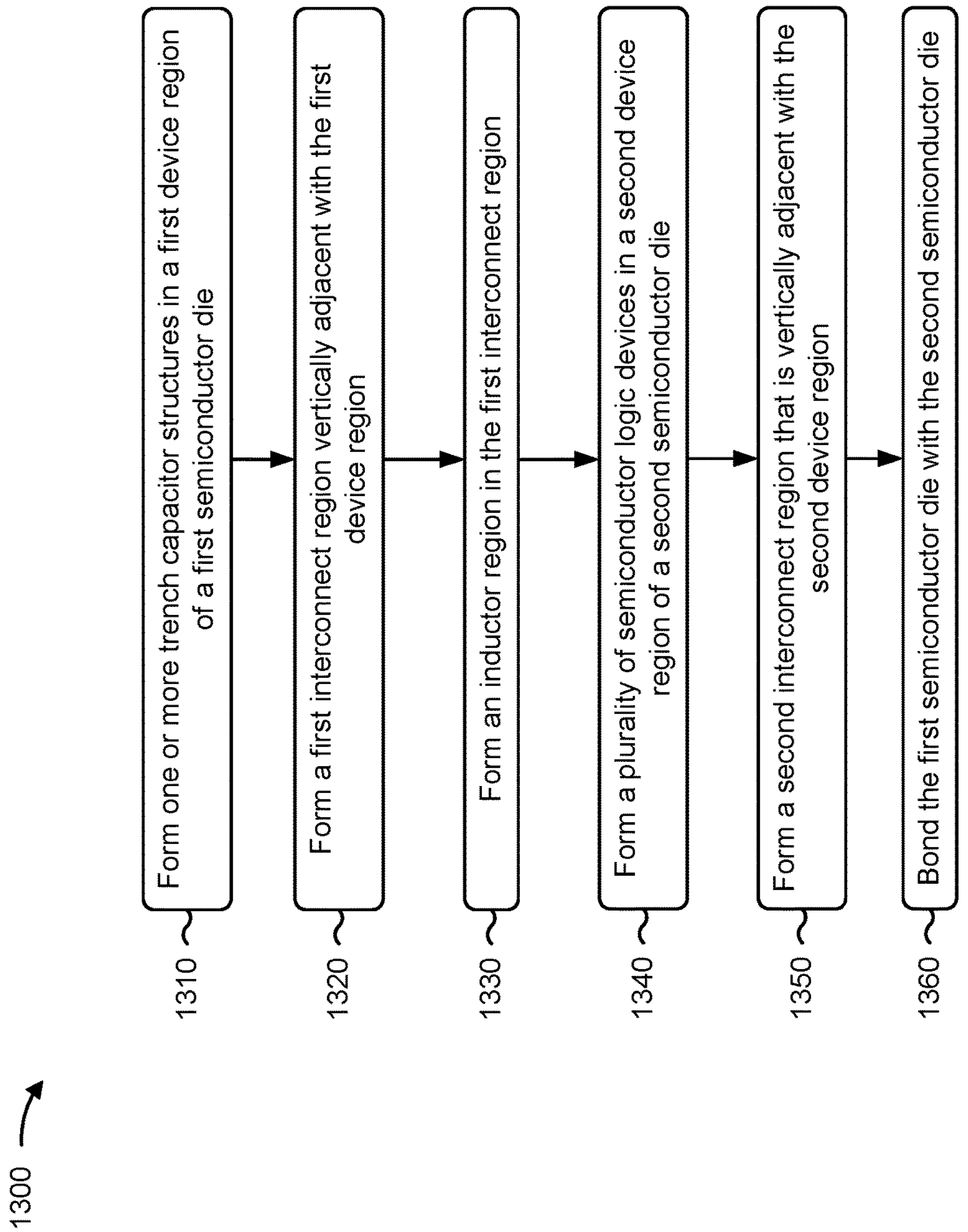
FIG. 13 is a flowchart of an example process associated with forming a semiconductor die package described herein.

FIG. 13 is a flowchart of an example process 1300 associated with forming a semiconductor die package described herein. In some implementations, one or more process blocks of FIG. 13 are performed by a one or more semiconductor processing tools (e.g., one or more of the semiconductor processing tools 102-114). Additionally, or alternatively, one or more process blocks of FIG. 13 may be performed by one or more components of device 1200, such as processor 1220, memory 1230, input component 1240, output component 1250, and/or communication component 1260.

As shown in FIG. 13, process 1300 may include forming one or more trench capacitor structures in a first device region of a first semiconductor die (block 1310). For example, one or more of the semiconductor processing tools 102-114 may form one or more trench capacitor structures 318 in a first device region 308 of a first semiconductor die 302, as described herein.

As further shown in FIG. 13, process 1300 may include forming a first interconnect region vertically adjacent with the first device region (block 1320). For example, one or more of the semiconductor processing tools 102-114 may form a first interconnect region 310 vertically adjacent with the first device region 308, as described herein.

As further shown in FIG. 13, process 1300 may include forming an inductor region in the first interconnect region (block 1330). For example, one or more of the semiconductor processing tools 102-114 may form an inductor region 324 in the first interconnect region 310, as described herein. In some implementations, the inductor region 324 includes one or more inductor structures 326.

As further shown in FIG. 13, process 1300 may include forming a plurality of semiconductor logic devices in a second region of a second semiconductor die (block 1340). For example, one or more of the semiconductor processing tools 102-114 may form a plurality of semiconductor logic devices (e.g., a plurality of semiconductor devices 316) in a second device region 312 of a second semiconductor die 304, as described herein.

As further shown in FIG. 13, process 1300 may include forming a second interconnect region that is vertically adjacent with the second device region (block 1350). For example, one or more of the semiconductor processing tools 102-114 may form a second interconnect region 314 that is vertically adjacent with the second device region 312, as described herein.

As further shown in FIG. 13, process 1300 may include bonding the first semiconductor die with the second semiconductor die (block 1360). For example, one or more of the semiconductor processing tools 102-114 may bond the first semiconductor die 302 with the second semiconductor die 304, as described herein. In some implementations, the first semiconductor die 302 and the second semiconductor die 304 are bonded at a bonding interface 306 between the first interconnect region 310 and the second interconnect region 314.

Process 1300 may include additional implementations, such as any single implementation or any combination of implementations described below and/or in connection with one or more other processes described elsewhere herein.

Although FIG. 13 shows example blocks of process 1300, in some implementations, process 1300 includes additional blocks, fewer blocks, different blocks, or differently arranged blocks than those depicted in FIG. 13. Additionally, or alternatively, two or more of the blocks of process 1300 may be performed in parallel.

Figure 14:
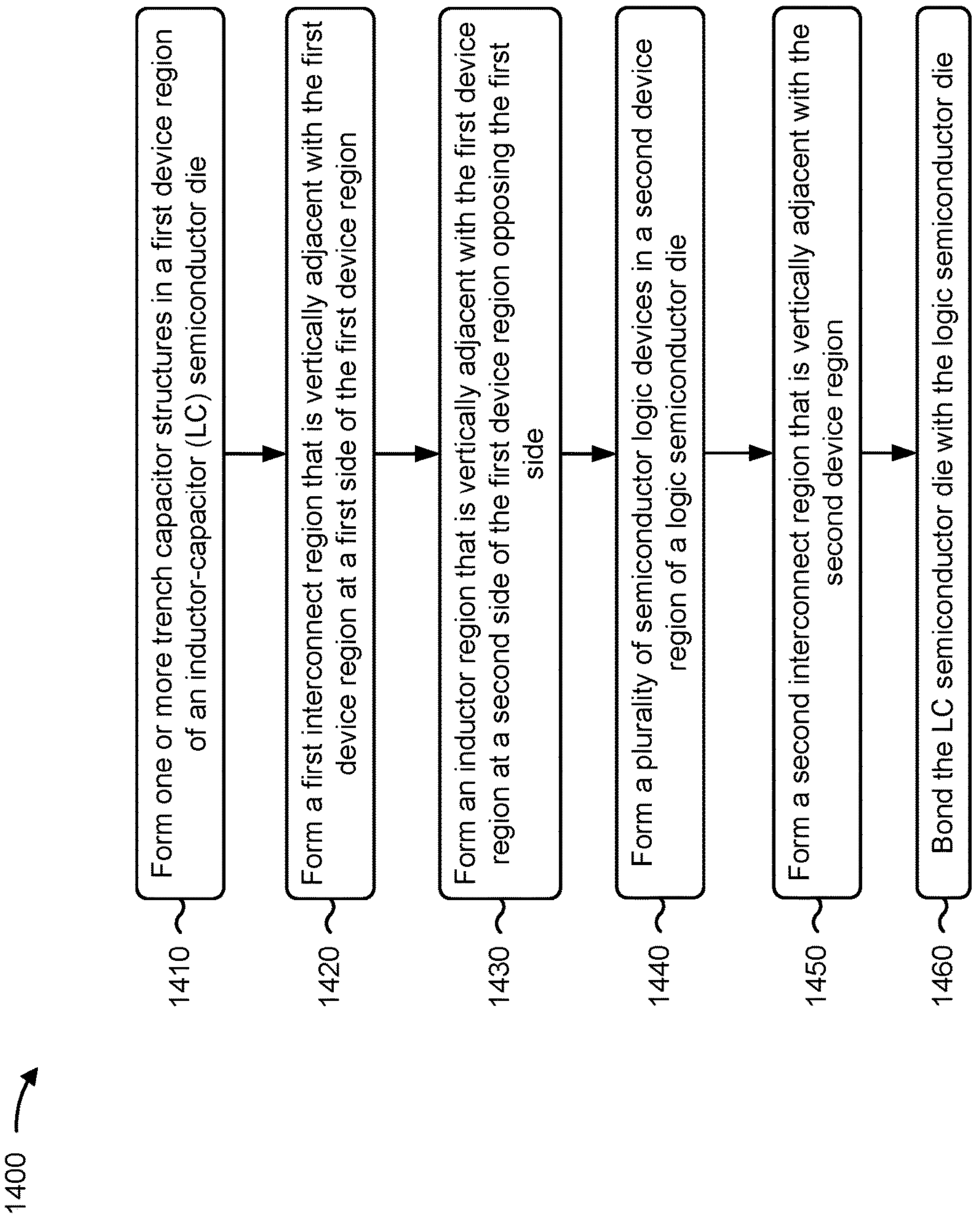
FIG. 14 is a flowchart of an example process associated with forming a semiconductor die package described herein.

FIG. 14 is a flowchart of an example process 1400 associated with forming a semiconductor die package described herein. In some implementations, one or more process blocks of FIG. 14 are performed by a one or more semiconductor processing tools (e.g., one or more of the semiconductor processing tools 102-114). Additionally, or alternatively, one or more process blocks of FIG. 14 may be performed by one or more components of device 1200, such as processor 1220, memory 1230, input component 1240, output component 1250, and/or communication component 1260.

As shown in FIG. 14, process 1400 may include forming one or more trench capacitor structures in a first device region of an inductor-capacitor (LC) semiconductor die (block 1410). For example, one or more of the semiconductor processing tools 102-114 may form one or more trench capacitor structures 318 in a first device region 308 of an LC semiconductor die (e.g., the first semiconductor die 302), as described herein.

As further shown in FIG. 14, process 1400 may include forming a first interconnect region that is vertically adjacent with the first device region at a first side of the first device region (block 1420). For example, one or more of the semiconductor processing tools 102-114 may form a first interconnect region 310 that is vertically adjacent with the first device region 308 at a first side of the first device region 308, as described herein.

As further shown in FIG. 14, process 1400 may include forming an inductor region that is vertically adjacent with the first device region at a second side of the first device region opposing the first side (block 1430). For example, one or more of the semiconductor processing tools 102-114 may form an inductor region 324 that is vertically adjacent with the first device region 308 at a second side of the first device region 308 opposing the first side, as described herein. In some implementations, the inductor region 324 includes one or more inductor structures 326.

As further shown in FIG. 14, process 1400 may include forming a plurality of semiconductor logic devices in a second region of a logic semiconductor die (block 1440). For example, one or more of the semiconductor processing tools 102-114 may form a plurality of semiconductor logic devices (e.g., a plurality of semiconductor devices 316) in a second device region 312 of a logic semiconductor die (e.g., the second semiconductor die 304), as described herein.

As further shown in FIG. 14, process 1400 may include forming a second interconnect region that is vertically adjacent with the second device region (block 1450). For example, one or more of the semiconductor processing tools 102-114 may form a second interconnect region 314 that is vertically adjacent with the second device region 312, as described herein.

As further shown in FIG. 14, process 1400 may include bonding the LC semiconductor die with the logic semiconductor die (block 1460). For example, one or more of the semiconductor processing tools 102-114 may bond the LC semiconductor die with the logic semiconductor die, as described herein. In some implementations, the LC semiconductor die and the logic semiconductor die are bonded at a bonding interface 306 between the first interconnect region 310 and the second interconnect region 314.

Process 1400 may include additional implementations, such as any single implementation or any combination of implementations described below and/or in connection with one or more other processes described elsewhere herein.

Although FIG. 14 shows example blocks of process 1400, in some implementations, process 1400 includes additional blocks, fewer blocks, different blocks, or differently arranged blocks than those depicted in FIG. 14. Additionally, or alternatively, two or more of the blocks of process 1400 may be performed in parallel.

Figure 15:
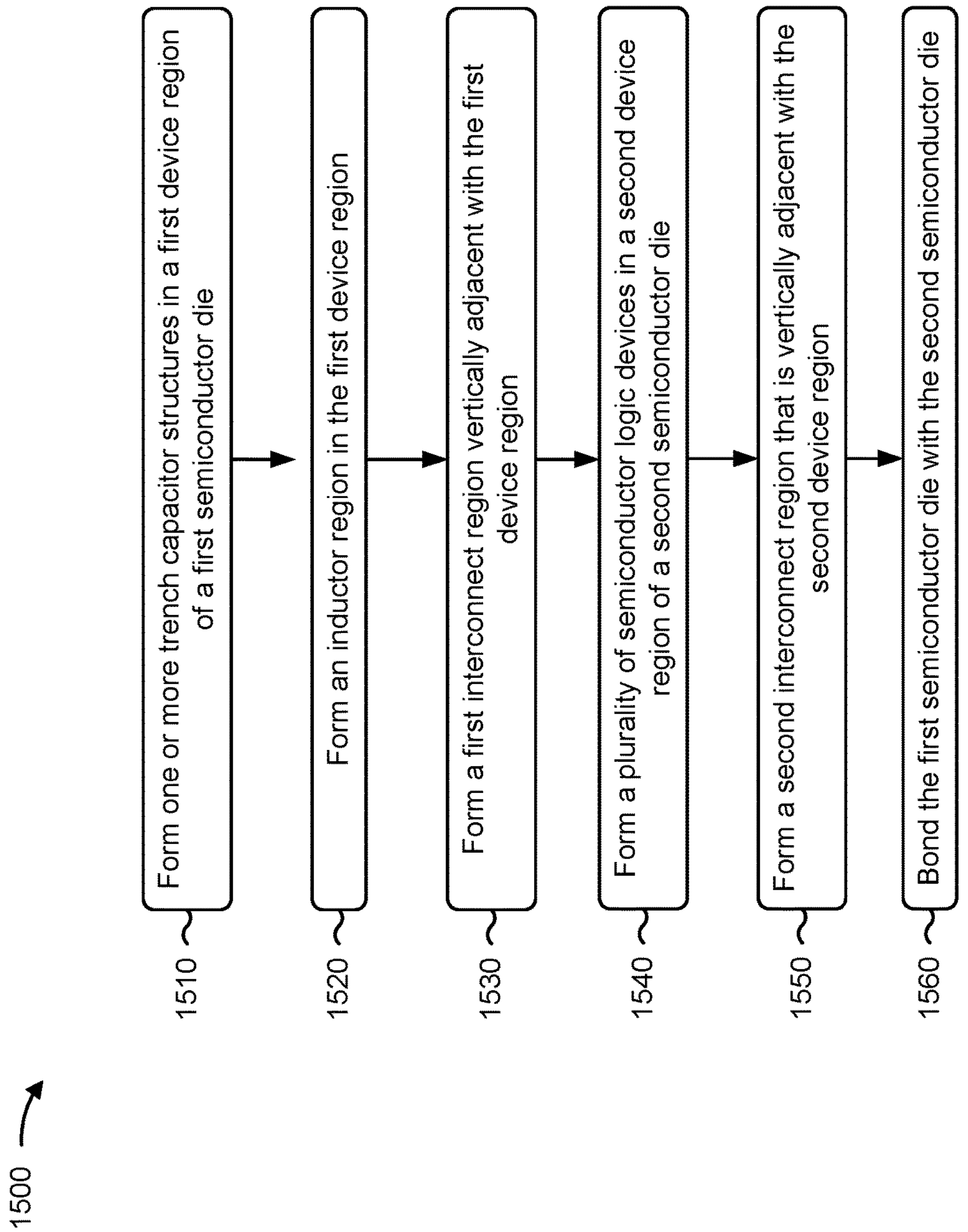
FIG. 15 is a flowchart of an example process associated with forming a semiconductor die package described herein.

FIG. 15 is a flowchart of an example process 1500 associated with forming a semiconductor die package described herein. In some implementations, one or more process blocks of FIG. 15 are performed by a one or more semiconductor processing tools (e.g., one or more of the semiconductor processing tools 102-114). Additionally, or alternatively, one or more process blocks of FIG. 15 may be performed by one or more components of device 1200, such as processor 1220, memory 1230, input component 1240, output component 1250, and/or communication component 1260.

As shown in FIG. 15, process 1500 may include forming one or more trench capacitor structures in a first device region of a first semiconductor die (block 1510). For example, one or more of the semiconductor processing tools 102-114 may form one or more trench capacitor structures 318 in a first device region 308 of a first semiconductor die 302, as described herein.

As further shown in FIG. 15, process 1500 may include forming an inductor region in the first device region (block 1520). For example, one or more of the semiconductor processing tools 102-114 may form an inductor region 324 in the first device region 308, as described herein. In some implementations, the inductor region 324 includes one or more inductor structures 326.

As further shown in FIG. 15, process 1500 may include forming a first interconnect region vertically adjacent with the first device region (block 1530). For example, one or more of the semiconductor processing tools 102-114 may form a first interconnect region 310 vertically adjacent with the first device region 308, as described herein.

As further shown in FIG. 15, process 1500 may include forming a plurality of semiconductor logic devices in a second region of a second semiconductor die (block 1540). For example, one or more of the semiconductor processing tools 102-114 may form a plurality of semiconductor logic devices (e.g., a plurality of semiconductor devices 316) in a second device region 312 of a second semiconductor die 304, as described herein.

As further shown in FIG. 15, process 1500 may include forming a second interconnect region that is vertically adjacent with the second device region (block 1550). For example, one or more of the semiconductor processing tools 102-114 may form a second interconnect region 314 that is vertically adjacent with the second device region 312, as described herein.

As further shown in FIG. 15, process 1500 may include bonding the first semiconductor die with the second semiconductor die (block 1560). For example, one or more of the semiconductor processing tools 102-114 may bond the first semiconductor die 302 with the second semiconductor die 304, as described herein. In some implementations, the first semiconductor die 302 and the second semiconductor die 304 are bonded at a bonding interface 306 between the first interconnect region 310 and the second interconnect region 314.

Process 1500 may include additional implementations, such as any single implementation or any combination of implementations described below and/or in connection with one or more other processes described elsewhere herein.

Although FIG. 15 shows example blocks of process 1500, in some implementations, process 1500 includes additional blocks, fewer blocks, different blocks, or differently arranged blocks than those depicted in FIG. 15. Additionally, or alternatively, two or more of the blocks of process 1500 may be performed in parallel.

Figure 16:
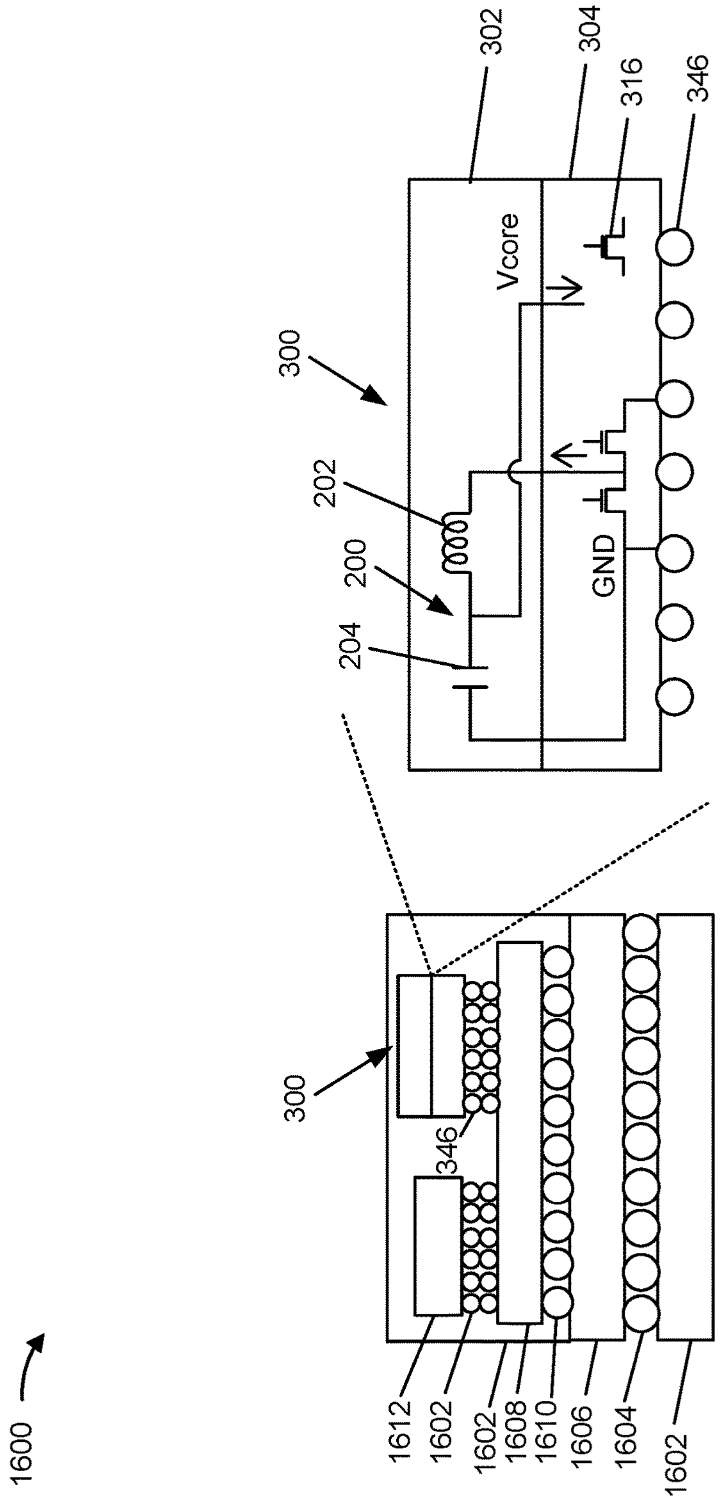
FIG. 16 is a diagram of an example implementation of a semiconductor device package described herein.

FIG. 16 is a diagram of an example implementation of a semiconductor device package 1600 described herein.

As shown in FIG. 16, the semiconductor device package 1600 may be mounted to a substrate 1602 such as a motherboard by connection structures 1604 of the semiconductor device package 1600. The semiconductor device package 1600 may include a package substrate 1606 attached to the connection structures 1604. The semiconductor device package 1600 may include an interposer 1608 attached to the package substrate 1606 by connection structures 1610. The interposer 1608 may include a silicon interposer, an RDL, a polymer interposer, and/or another type of interposer.

A plurality of semiconductor die packages may be attached to the interposer 1608. For example a semiconductor die package 1612 may be attached to the interposer 1608 by connection structures 1614. As another example, a semiconductor die package 300 may be attached to the interposer 1608 by connection structures 346.

As further shown in FIG. 16, a voltage regulator circuit 200 may be implemented in the semiconductor die package 300 for semiconductor devices 316 included in the semiconductor die 304. The inductor 202 and the capacitor 204 of the voltage regulator circuit 200 may be implemented by an inductor structure 326 and a trench capacitor structure 318, respectively, included in the semiconductor die 302.

As indicated above, FIG. 16 is provided as an example. Other examples may differ form what is described with regard to FIG. 16.

In this way, a semiconductor die package includes an inductor-capacitor (LC) semiconductor die that is directly bonded with a logic semiconductor die. The LC semiconductor die includes inductors and capacitors that are integrated into a single die. The inductors and capacitors of the LC semiconductor die may be electrically connected with transistors and other logic components on the logic semiconductor die to form a voltage regulator circuit of the semiconductor die package. The integration of passive components (e.g., the inductors and capacitors) of the voltage regulator circuit into a single semiconductor die (e.g., the LC semiconductor die) reduces signal propagation distances in the voltage regulator circuit, which may increase the operating efficiency of the voltage regulator circuit, may reduce the formfactor for the semiconductor die package, may reduce parasitic capacitance and/or may reduce parasitic inductance in the voltage regulator circuit (thereby improving the performance of the voltage regulator circuit), among other examples.

As described in greater detail above, some implementations described herein provide a semiconductor die package. The semiconductor die package includes a first semiconductor die. The first semiconductor die includes a first device region, one or more trench capacitor structures in the first device region a first interconnect region that is vertically adjacent with the first device region, and an inductor region included in the first interconnect region, where the inductor region includes one or more inductor structures. The semiconductor die package includes a second semiconductor die bonded with the first semiconductor die at a bonding region between the first interconnect region and a second interconnect region of the second semiconductor die. The second semiconductor die includes a second device region, one or more semiconductor logic devices included in the second device region, and the second interconnect region vertically adjacent with the second device region.

As described in greater detail above, some implementations described herein provide a semiconductor die package. The semiconductor die package includes an inductor-capacitor (LC) semiconductor die. The LC semiconductor die includes a first device region one or more trench capacitor structures in the first device region, a first interconnect region vertically adjacent with the first device region at a first side of the first device region, and an inductor region vertically adjacent with the first device region at a second side of the first device region opposing the first side, where the inductor region comprises one or more inductor structures. The semiconductor die package includes a logic semiconductor die bonded with the LC semiconductor die at a bonding region between the first interconnect region and a second interconnect region of the logic semiconductor die. The logic semiconductor die includes a second device region, one or more semiconductor logic devices included in the second device region, and the second interconnect region vertically adjacent with the second device region.

As described in greater detail above, some implementations described herein provide a semiconductor die package. The semiconductor die package includes a first semiconductor die. The first semiconductor die includes a first device region, one or more trench capacitor structures in the first device region, an inductor region included in the first device region, where the inductor region comprises one or more inductor structures, and a first interconnect region vertically adjacent with the first device region. The semiconductor die package includes a second semiconductor die bonded with the first semiconductor die at a bonding region between the first interconnect region and a second interconnect region of the second semiconductor die. The second semiconductor die includes a second device region, one or more semiconductor logic devices, included in the second device region, and the second interconnect region vertically adjacent with the second device region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die package, comprising:
- a first semiconductor die, comprising:
  - a first device region;
  - one or more trench capacitor structures in the first device region;
  - a first interconnect region vertically adjacent with the first device region;
  - an inductor region included in the first interconnect region,
    - wherein the inductor region comprises one or more inductor structures;
- a second semiconductor die bonded with the first semiconductor die at a bonding region between the first interconnect region and a second interconnect region of the second semiconductor die,
  - wherein the second semiconductor die comprises:
    - a second device region;
    - one or more semiconductor logic devices included in the second device region; and
    - the second interconnect region vertically adjacent with the second device region;
- one or more through silicon via (TSV) structures that extend through the second device region and into a portion of the second interconnect region; and
- a redistribution structure that is vertically adjacent with the second device region,
  - wherein the one or more TSV structures are electrically connected with a metallization layer in the redistribution structure and another metallization layer in the second interconnect region.

2. The semiconductor die package of claim 1, wherein a trench capacitor structure of the one or more trench capacitor structures, an inductor structure of the one or more inductor structures, and at least a subset of the one or more semiconductor logic devices are included in a voltage regulator circuit of the semiconductor die package.

3. The semiconductor die package of claim 1,
wherein the redistribution structure is vertically adjacent with the second device region at a first side of the second device region; and
wherein the second interconnect region is vertically adjacent with the second device region at a second side of the second device region opposing the first side.

4. The semiconductor die package of claim 1,
wherein the one or more TSV structures are one or more first TSV structures,
wherein the redistribution structure is a first redistribution structure, and
wherein the semiconductor die package further comprises:
one or more second TSV structures that extend through the first device region and into a portion of the first interconnect region; and
a second redistribution structure that is vertically adjacent with the first device region,
wherein the one or more second TSV structures are electrically connected with a metallization layer in the second redistribution structure and another metallization layer in the first interconnect region.

5. The semiconductor die package of claim 4,
wherein the second redistribution structure is vertically adjacent with the first device region at a first side of the first device region; and
wherein the first interconnect region is vertically adjacent with the first device region at a second side of the first device region opposing the first side.

6. The semiconductor die package of claim 1, wherein the one or more semiconductor logic devices comprise:
a plurality of semiconductor transistor structures; and
a pulse width modulation (PWM) circuit.

7. The semiconductor die package of claim 1, wherein the one or more trench capacitor structures and the one or more inductor structures are electrically connected in the first interconnect region of the first semiconductor die.

8. A semiconductor die package, comprising:
an inductor-capacitor (LC) semiconductor die, comprising:
a first device region;
one or more trench capacitor structures in the first device region;
a first interconnect region vertically adjacent with the first device region;
an inductor region included in the first interconnect region,
wherein the inductor region comprises one or more inductor structures;
a logic semiconductor die bonded with the LC semiconductor die at a bonding region between the first interconnect region and a second interconnect region of the logic semiconductor die,
wherein the logic semiconductor die comprises:
a second device region;
one or more semiconductor logic devices included in the second device region; and
the second interconnect region vertically adjacent with the second device region;
one or more through silicon via (TSV) structures that extend through the first device region and into a portion of the first interconnect region; and
a redistribution structure that is vertically adjacent with the first device region,
wherein the one or more TSV structures are electrically connected with a metallization layer in the redistribution structure and another metallization layer in the first interconnect region.

9. The semiconductor die package of claim 8, wherein a trench capacitor structure of the one or more trench capacitor structures, an inductor structure of the one or more inductor structures, and at least a subset of the one or more semiconductor logic devices are included in a voltage regulator circuit of the semiconductor die package.

10. The semiconductor die package of claim 8,
wherein the one or more TSV structures are one or more first TSV structures,
wherein the redistribution structure is a first redistribution structure, and
wherein the semiconductor die package further comprises:
one or more second TSV structures that extend through the second device region and into a portion of the second interconnect region; and
a second redistribution structure that is vertically adjacent with the second device region,
wherein the one or more second TSV structures are electrically connected with a metallization layer in the second redistribution structure and another metallization layer in the second interconnect region.

11. The semiconductor die package of claim 10,
wherein the second redistribution structure is vertically adjacent with the second device region at a first side of the second device region; and
wherein the second interconnect region is vertically adjacent with the second device region at a second side of the second device region opposing the first side.

12. The semiconductor die package of claim 8, wherein the one or more semiconductor logic devices comprise:
a plurality of semiconductor transistor structures; and
a pulse width modulation (PWM) circuit.

13. The semiconductor die package of claim 8, wherein the one or more trench capacitor structures and the one or more inductor structures are electrically connected in the first interconnect region of the LC semiconductor die.

14. The semiconductor die package of claim 8,
wherein the redistribution structure is vertically adjacent with the first device region at a first side of the first device region; and
wherein the first interconnect region is vertically adjacent with the first device region at a second side of the first device region opposing the first side.

15. A semiconductor die package, comprising:
a first semiconductor die, comprising:
a first device region;
one or more trench capacitor structures in the first device region;
an inductor region,
wherein the inductor region comprises one or more inductor structures; and
a first interconnect region vertically adjacent with the first device region;
a second semiconductor die bonded with the first semiconductor die at a bonding region between the first interconnect region and a second interconnect region of the second semiconductor die,
wherein the second semiconductor die comprises:
a second device region;
one or more semiconductor logic devices included in the second device region; and
the second interconnect region vertically adjacent with the second device region;

one or more through silicon via (TSV) structures that extend through the first device region and into a portion of the first interconnect region; and a redistribution structure that is vertically adjacent with the first device region, wherein the one or more TSV structures are electrically connected with a metallization layer in the redistribution structure and another metallization layer in the first interconnect region.

16. The semiconductor die package of claim 15, wherein a trench capacitor structure of the one or more trench capacitor structures, an inductor structure of the one or more inductor structures, and at least a subset of the one or more semiconductor logic devices are included in a voltage regulator circuit of the semiconductor die package.

17. The semiconductor die package of claim 15, wherein the one or more TSV structures are one or more first TSV structures, wherein the redistribution structure is a first redistribution structure, and wherein the semiconductor die package further comprises:

one or more second TSV structures that extend through the second device region and into a portion of the second interconnect region; and a second redistribution structure that is vertically adjacent with the second device region, wherein the one or more second TSV structures are electrically connected with a metallization layer in the second redistribution structure and another metallization layer in the second interconnect region.

18. The semiconductor die package of claim 17, wherein the redistribution structure is vertically adjacent with the second device region at a first side of the second device region; and wherein the second interconnect region is vertically adjacent with the second device region at a second side of the second device region opposing the first side.

19. The semiconductor die package of claim 15, wherein the one or more semiconductor logic devices comprise:

a plurality of semiconductor transistor structures; and a pulse width modulation (PWM) circuit.

20. The semiconductor die package of claim 15, wherein the redistribution structure is vertically adjacent with the first device region at a first side of the first device region; and wherein the first interconnect region is vertically adjacent with the first device region at a second side of the first device region opposing the first side.

* * * * *